(12) United States Patent
Zhang et al.

(10) Patent No.: US 9,972,641 B1
(45) Date of Patent: May 15, 2018

(54) THREE-DIMENSIONAL MEMORY DEVICE HAVING A MULTILEVEL DRAIN SELECT GATE ELECTRODE AND METHOD OF MAKING THEREOF

(71) Applicant: SANDISK TECHNOLOGIES LLC, Plano, TX (US)

(72) Inventors: Yanli Zhang, San Jose, CA (US); Jin Liu, Milpitas, CA (US); Raghuveer S. Makala, Campbell, CA (US); Murshed Chowdhury, Milpitas, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/354,795

(22) Filed: Nov. 17, 2016

(51) Int. Cl.
    *H01L 27/115* (2017.01)
    *H01L 21/28* (2006.01)
    (Continued)

(52) U.S. Cl.
    CPC .. *H01L 27/11582* (2013.01); *H01L 21/28273* (2013.01); *H01L 21/28282* (2013.01);
    (Continued)

(58) Field of Classification Search
    CPC ......... H01L 27/11524; H01L 27/11526; H01L 27/11551–27/11556; H01L 27/11568–27/11582; H01L 29/0649; H01L 29/0847; H01L 29/1033; H01L 29/4234–29/42344; H01L 29/42364;
    (Continued)

(56) References Cited

U.S. PATENT DOCUMENTS

| 5,915,167 A | * | 6/1999 | Leedy | ...................... G11C 5/02 257/E21.597 |
| 7,863,671 B2 | * | 1/2011 | Kim | .................. H01L 27/11524 257/315 |

(Continued)

FOREIGN PATENT DOCUMENTS

KR      20100095900 A      9/2010

OTHER PUBLICATIONS

Invitation to Pay Additional Fees and, Where Applicable, Protest Fee and Communication Relating to the Results of the Partial International Search from the International Searching Authority for International Patent Application No. PCT/US2017/050089, dated Nov. 14, 2017, 18 pages.

(Continued)

*Primary Examiner* — Maliheh Malek
(74) *Attorney, Agent, or Firm* — The Marbury Law Group PLLC

(57) ABSTRACT

A three-dimensional memory device includes an alternating stack of insulating layers and electrically conductive layers located over a substrate and memory stack structures extending through the alternating stack. Each memory stack structure includes a memory film and a vertical semiconductor channel. An isolation trench laterally extends along a horizontal direction and divides at least two topmost electrically conductive layers. Two conductive rail structures are located on lengthwise sidewalls of the isolation trench and are electrically shorted to respective segments of the at least two topmost electrically conductive layers.

30 Claims, 72 Drawing Sheets

(51) Int. Cl.
  *H01L 21/3213* (2006.01)
  *H01L 21/768* (2006.01)
  *H01L 27/11582* (2017.01)
  *H01L 29/06* (2006.01)
  *H01L 23/528* (2006.01)
  *H01L 29/08* (2006.01)
  *H01L 29/10* (2006.01)
  *H01L 23/522* (2006.01)
  *H01L 27/11556* (2017.01)
  *H01L 21/762* (2006.01)
  *H01L 29/66* (2006.01)
  *H01L 27/11526* (2017.01)
  *H01L 27/11524* (2017.01)
  *H01L 27/1157* (2017.01)
  *H01L 27/11573* (2017.01)

(52) U.S. Cl.
  CPC .. *H01L 21/32133* (2013.01); *H01L 21/76224* (2013.01); *H01L 21/76877* (2013.01); *H01L 23/528* (2013.01); *H01L 23/5226* (2013.01); *H01L 27/1157* (2013.01); *H01L 27/11524* (2013.01); *H01L 27/11526* (2013.01); *H01L 27/11556* (2013.01); *H01L 27/11573* (2013.01); *H01L 29/0649* (2013.01); *H01L 29/0847* (2013.01); *H01L 29/1033* (2013.01); *H01L 29/6653* (2013.01); *H01L 29/6656* (2013.01)

(58) Field of Classification Search
  CPC ... H01L 29/513; H01L 29/517; H01L 29/518; H01L 21/768; H01L 21/28273; H01L 21/28282; H01L 21/32133; H01L 21/76224; H01L 21/76802; H01L 21/76877; H01L 21/76895; H01L 23/528; H01L 23/5226
  See application file for complete search history.

(56) References Cited

U.S. PATENT DOCUMENTS

| | | | |
|---|---|---|---|
| 8,008,732 B2* | 8/2011 | Kiyotoshi | H01L 27/105 257/324 |
| 8,394,716 B2* | 3/2013 | Hwang | H01L 27/11551 257/315 |
| 9,023,719 B2 | 5/2015 | Pachamuthu et al. | |
| 9,190,150 B2* | 11/2015 | Sakanushi | H01L 29/7926 |
| 9,224,747 B2* | 12/2015 | Mizutani | H01L 27/11556 |
| 9,230,973 B2* | 1/2016 | Pachamuthu | H01L 27/11551 |
| 9,230,979 B1* | 1/2016 | Pachamuthu | H01L 27/11575 |
| 9,230,984 B1* | 1/2016 | Takeguchi | H01L 27/088 |
| 9,230,987 B2* | 1/2016 | Pachamuthu | H01L 27/11582 |
| 9,236,392 B1* | 1/2016 | Izumi | H01L 27/11573 |
| 9,305,932 B2 | 4/2016 | Kanakamedala et al. | |
| 9,305,934 B1* | 4/2016 | Ding | H01L 27/11573 |
| 9,356,034 B1* | 5/2016 | Yada | H01L 27/11575 |
| 9,368,509 B2 | 6/2016 | Pang et al. | |
| 9,401,309 B2* | 7/2016 | Izumi | H01L 21/76816 |
| 9,412,749 B1* | 8/2016 | Shimabukuro | H01L 23/5226 |
| 9,449,980 B2* | 9/2016 | Rabkin | H01L 29/408 |
| 9,449,983 B2 | 9/2016 | Yada et al. | |
| 9,449,987 B1* | 9/2016 | Miyata | H01L 27/11582 |
| 9,478,558 B2* | 10/2016 | Koka | H01L 27/11582 |
| 9,484,357 B2* | 11/2016 | Makala | H01L 27/11582 |
| 9,502,471 B1* | 11/2016 | Lu | H01L 27/2481 |
| 9,530,790 B1* | 12/2016 | Lu | H01L 27/11582 |
| 9,543,318 B1* | 1/2017 | Lu | H01L 27/11582 |
| 9,576,967 B1* | 2/2017 | Kimura | H01L 27/11565 |
| 9,595,535 B1* | 3/2017 | Ogawa | H01L 27/11582 |
| 9,601,502 B2* | 3/2017 | Sano | H01L 21/31111 |
| 9,620,512 B1 | 4/2017 | Nishikawa et al. | |
| 9,627,399 B2* | 4/2017 | Kanakamedala | H01L 27/11578 |
| 9,659,956 B1* | 5/2017 | Pachamuthu | H01L 27/11575 |
| 9,673,213 B1* | 6/2017 | Yu | H01L 23/535 |
| 9,679,906 B2* | 6/2017 | Lu | H01L 27/11519 |
| 9,679,907 B1* | 6/2017 | Kaneko | H01L 27/1157 |
| 9,698,153 B2* | 7/2017 | Liu | H01L 27/1157 |
| 9,711,524 B2* | 7/2017 | Shoji | H01L 27/11582 |
| 9,716,101 B2* | 7/2017 | Lu | H01L 27/1157 |
| 9,716,105 B1* | 7/2017 | Tsutsumi | H01L 21/02326 |
| 9,721,963 B1* | 8/2017 | Rabkin | H01L 27/11582 |
| 9,728,499 B2* | 8/2017 | Shimabukuro | H01L 27/11556 |
| 9,728,551 B1* | 8/2017 | Lu | H01L 27/11582 |
| 9,754,956 B2* | 9/2017 | Tsutsumi | H01L 27/11582 |
| 9,780,182 B2* | 10/2017 | Peri | H01L 29/66833 |
| 9,806,093 B2* | 10/2017 | Toyama | H01L 27/11524 |
| 9,818,693 B2* | 11/2017 | Toyama | H01L 23/5283 |
| 9,818,759 B2* | 11/2017 | Kai | H01L 27/11582 |
| 9,837,431 B2* | 12/2017 | Nishikawa | H01L 27/11582 |
| 9,853,038 B1* | 12/2017 | Cui | H01L 27/11556 |
| 9,859,293 B2* | 1/2018 | Lee | H01L 27/11565 |
| 9,859,363 B2* | 1/2018 | Lu | H01L 29/0649 |
| 2009/0230449 A1* | 9/2009 | Sakaguchi | H01L 27/0688 257/298 |
| 2009/0230458 A1* | 9/2009 | Ishiduki | H01L 27/11565 257/324 |
| 2010/0207195 A1* | 8/2010 | Fukuzumi | G11C 16/0483 257/326 |
| 2010/0238732 A1 | 9/2010 | Hishida et al. | |
| 2011/0002178 A1 | 1/2011 | Hwang et al. | |
| 2011/0012189 A1 | 1/2011 | Jeong et al. | |
| 2011/0031547 A1* | 2/2011 | Watanabe | H01L 27/11582 257/319 |
| 2011/0169071 A1* | 7/2011 | Uenaka | H01L 27/105 257/326 |
| 2012/0001249 A1* | 1/2012 | Alsmeier | H01L 27/11551 257/319 |
| 2012/0238093 A1* | 9/2012 | Park | H01L 21/76838 438/675 |
| 2013/0062683 A1* | 3/2013 | Fukuzumi | H01L 29/66833 257/324 |
| 2014/0014889 A1* | 1/2014 | Shim | H01L 29/7827 257/1 |
| 2014/0151787 A1* | 6/2014 | Venkatraman | H01L 29/7827 257/330 |
| 2014/0175534 A1* | 6/2014 | Kofuji | H01L 27/11582 257/324 |
| 2015/0008502 A1* | 1/2015 | Chien | H01L 29/66825 257/321 |
| 2015/0008506 A1* | 1/2015 | Yang | H01L 27/11582 257/324 |
| 2015/0055413 A1* | 2/2015 | Alsmeier | G11C 14/0018 365/185.08 |
| 2015/0076586 A1* | 3/2015 | Rabkin | G11C 16/0483 257/324 |
| 2015/0115455 A1* | 4/2015 | Chen | H01L 21/76895 257/773 |
| 2015/0123189 A1* | 5/2015 | Sun | H01L 27/11556 257/321 |
| 2015/0155292 A1* | 6/2015 | Son | H01L 27/11551 257/321 |
| 2015/0179660 A1* | 6/2015 | Yada | H01L 21/02164 257/321 |
| 2015/0179662 A1 | 6/2015 | Makala et al. | |
| 2015/0236038 A1* | 8/2015 | Pachamuthu | H01L 27/11582 257/326 |
| 2015/0364488 A1* | 12/2015 | Pachamuthu | H01L 29/665 257/314 |
| 2015/0380419 A1 | 12/2015 | Gunji-Yoneoka et al. | |
| 2016/0064281 A1* | 3/2016 | Izumi | H01L 21/76816 257/315 |
| 2016/0071876 A1* | 3/2016 | Mizuno | H01L 27/11582 365/185.17 |
| 2016/0086969 A1* | 3/2016 | Zhang | H01L 23/528 257/314 |
| 2016/0111437 A1* | 4/2016 | Pang | H01L 27/11556 257/324 |
| 2016/0111438 A1 | 4/2016 | Tsutsumi et al. | |

(56) References Cited

U.S. PATENT DOCUMENTS

| | | | | |
|---|---|---|---|---|
| 2016/0118391 A1* | 4/2016 | Zhao | H01L 21/3003 | 257/66 |
| 2016/0126248 A1* | 5/2016 | Rabkin | H01L 29/408 | 257/321 |
| 2016/0148835 A1* | 5/2016 | Shimabukuro | H01L 27/11556 | 257/314 |
| 2016/0148946 A1* | 5/2016 | Hironaga | H01L 27/11556 | 257/324 |
| 2016/0149002 A1* | 5/2016 | Sharangpani | H01L 29/1054 | 257/314 |
| 2016/0163725 A1* | 6/2016 | Kamiya | H01L 21/0206 | 257/321 |
| 2016/0163728 A1* | 6/2016 | Tsutsumi | H01L 27/11582 | 257/66 |
| 2016/0190154 A1* | 6/2016 | Nozawa | H01L 27/11582 | 438/268 |
| 2016/0204117 A1* | 7/2016 | Liu | H01L 29/66825 | 257/324 |
| 2016/0204122 A1 | 7/2016 | Shoji et al. | | |
| 2016/0211272 A1* | 7/2016 | Koka | H01L 27/11582 | |
| 2016/0218059 A1* | 7/2016 | Nakada | H01L 27/11556 | |
| 2016/0225866 A1* | 8/2016 | Peri | H01L 29/66833 | |
| 2016/0276359 A1* | 9/2016 | Oginoe | H01L 27/11582 | |
| 2016/0300848 A1* | 10/2016 | Pachamuthu | H01L 21/768 | |
| 2016/0322374 A1* | 11/2016 | Sano | H01L 21/31111 | |
| 2016/0351497 A1* | 12/2016 | Peri | H01L 23/5226 | |
| 2016/0379989 A1* | 12/2016 | Sharangpani | H01L 27/11582 | 257/314 |
| 2017/0047334 A1* | 2/2017 | Lu | H01L 27/11519 | |
| 2017/0069655 A1* | 3/2017 | Ichinose | H01L 27/11582 | |
| 2017/0098655 A1* | 4/2017 | Costa | H01L 27/11524 | |
| 2017/0117289 A1* | 4/2017 | Liu | H01L 27/1157 | |
| 2017/0148810 A1* | 5/2017 | Kai | H01L 27/11582 | |
| 2017/0148811 A1* | 5/2017 | Zhang | H01L 27/11582 | |
| 2017/0148812 A1 | 5/2017 | Hsu | | |
| 2017/0179026 A1* | 6/2017 | Toyama | H01L 27/11524 | |
| 2017/0179143 A1* | 6/2017 | Tran | H01L 27/11556 | |
| 2017/0179151 A1* | 6/2017 | Kai | H01L 27/11524 | |
| 2017/0179153 A1* | 6/2017 | Ogawa | H01L 27/11524 | |
| 2017/0179154 A1* | 6/2017 | Furihata | H01L 27/11524 | |
| 2017/0229472 A1* | 8/2017 | Lu | H01L 27/11582 | |
| 2017/0236896 A1* | 8/2017 | Lu | H01L 29/0649 | 257/314 |
| 2017/0256317 A1* | 9/2017 | Nguyen | G11C 16/10 | |
| 2017/0278571 A1* | 9/2017 | Chowdhury | G11C 16/0483 | |
| 2017/0287925 A9* | 10/2017 | Makala | H01L 27/11582 | |
| 2017/0294377 A1* | 10/2017 | Dunga | H01L 23/528 | |
| 2017/0338241 A1* | 11/2017 | Lee | H01L 29/792 | |
| 2017/0352669 A1* | 12/2017 | Sharangpani | H01L 27/1157 | |
| 2017/0352673 A1* | 12/2017 | Lee | H01L 23/5226 | |
| 2017/0352678 A1* | 12/2017 | Lu | H01L 21/4846 | |
| 2017/0358593 A1* | 12/2017 | Yu | H01L 27/11582 | |
| 2017/0373078 A1* | 12/2017 | Chu | H01L 27/11556 | |
| 2017/0373087 A1* | 12/2017 | Ito | H01L 27/11582 | |
| 2018/0006049 A1* | 1/2018 | Inomata | H01L 27/11556 | |
| 2018/0006054 A1* | 1/2018 | Liu | H01L 27/11582 | |

OTHER PUBLICATIONS

U.S. Appl. No. 14/859,710, filed Sep. 21, 2015, Sandisk Technologies LLC.
U.S. Appl. No. 15/056,510, filed Feb. 29, 2016, Sandisk Technologies LLC.
U.S. Appl. No. 15/078,555, filed Mar. 23, 2016, Sandisk Technologies LLC.
U.S. Appl. No. 15/219,652, filed Jul. 26, 2016, Sandisk Technologies LLC.
U.S. Appl. No. 15/219,719, filed Jul. 26, 2016, Sandisk Technologies LLC.
U.S. Appl. No. 15/223,729, filed Jul. 29, 2016, Sandisk Technologies LLC.
U.S. Appl. No. 15/286,063, filed Oct. 5, 2016, Sandisk Technologies LLC.
U.S. Appl. No. 15/354,067, filed Nov. 17, 2016, Sandisk Technologies LLC.
Endoh et al., "Novel Ultra High Density Memory with a Stacked-Surrounding Gate Transistor (S-SGT) Structured Cell," IEDM Proc. (2001) 33-36.
United States Patent and Trademark Office, Office Communication, Non-Final Office Action from a corresponding U.S. Appl. No. 15/496,359, dated Jan. 17, 2018, 30 pages.
International Search Report and Written Opinion of the International Search for International Patent Application No. PCT/US2017/050089, dated Jan. 15, 2018, 23 pages.

* cited by examiner

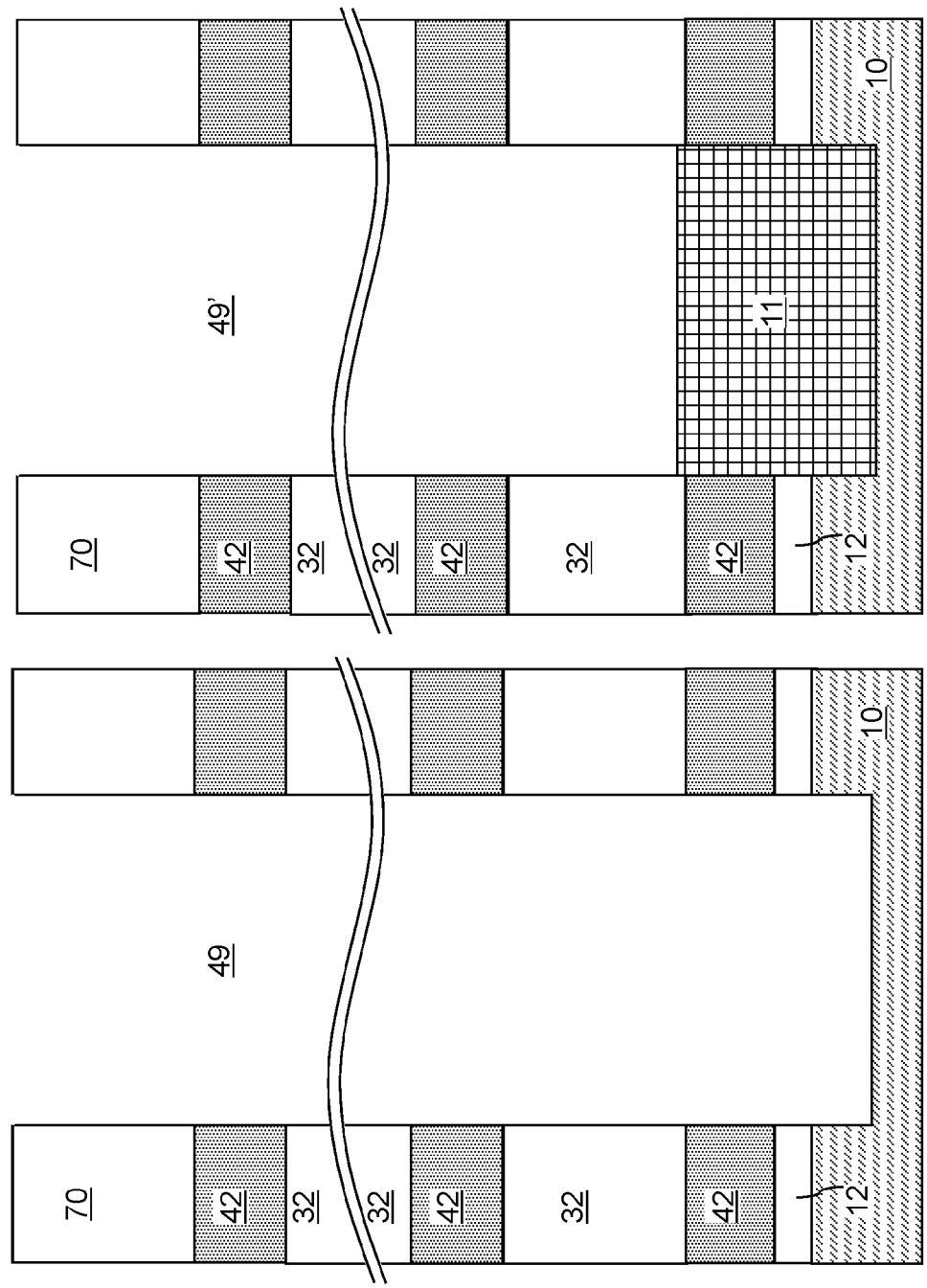

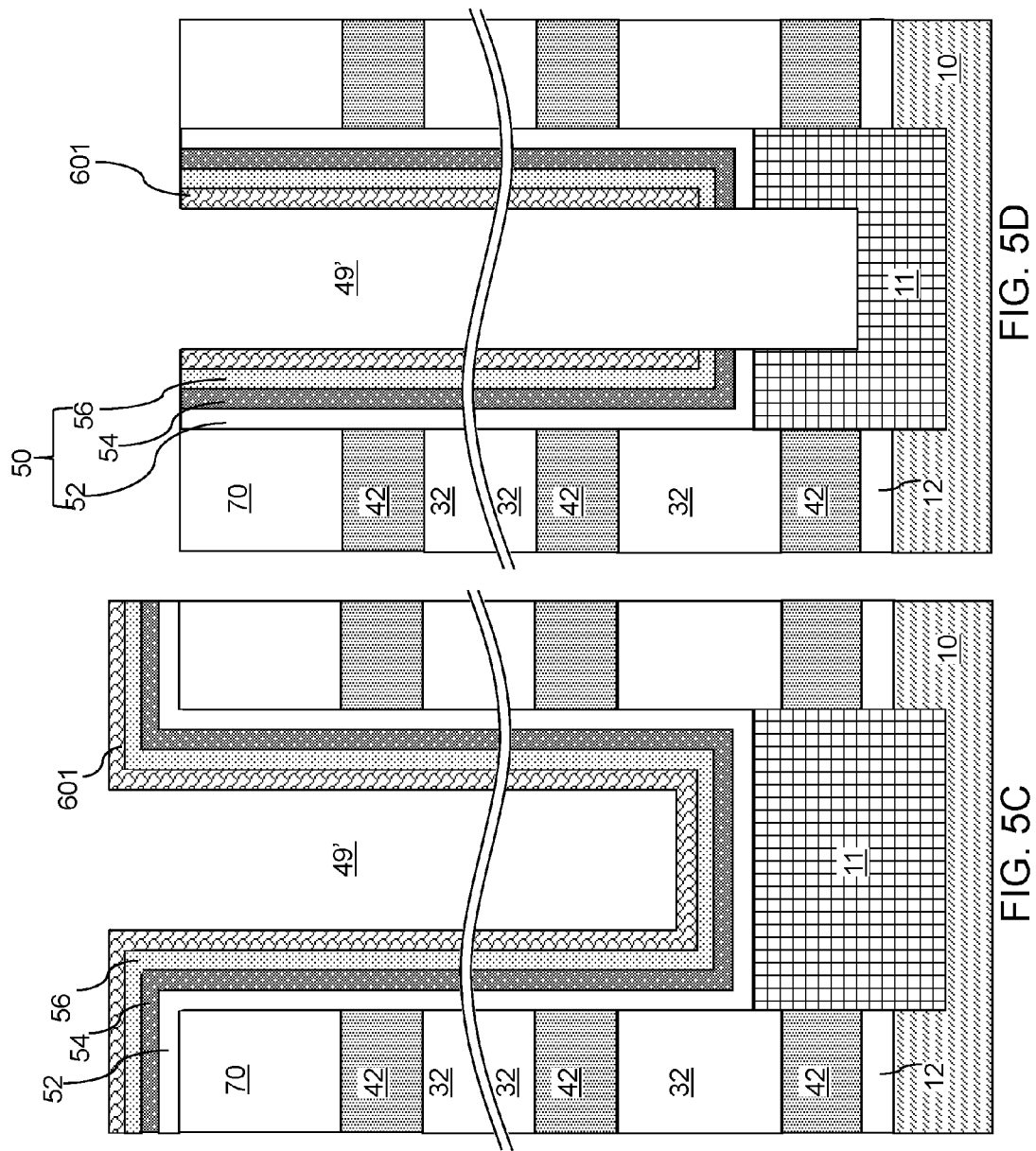

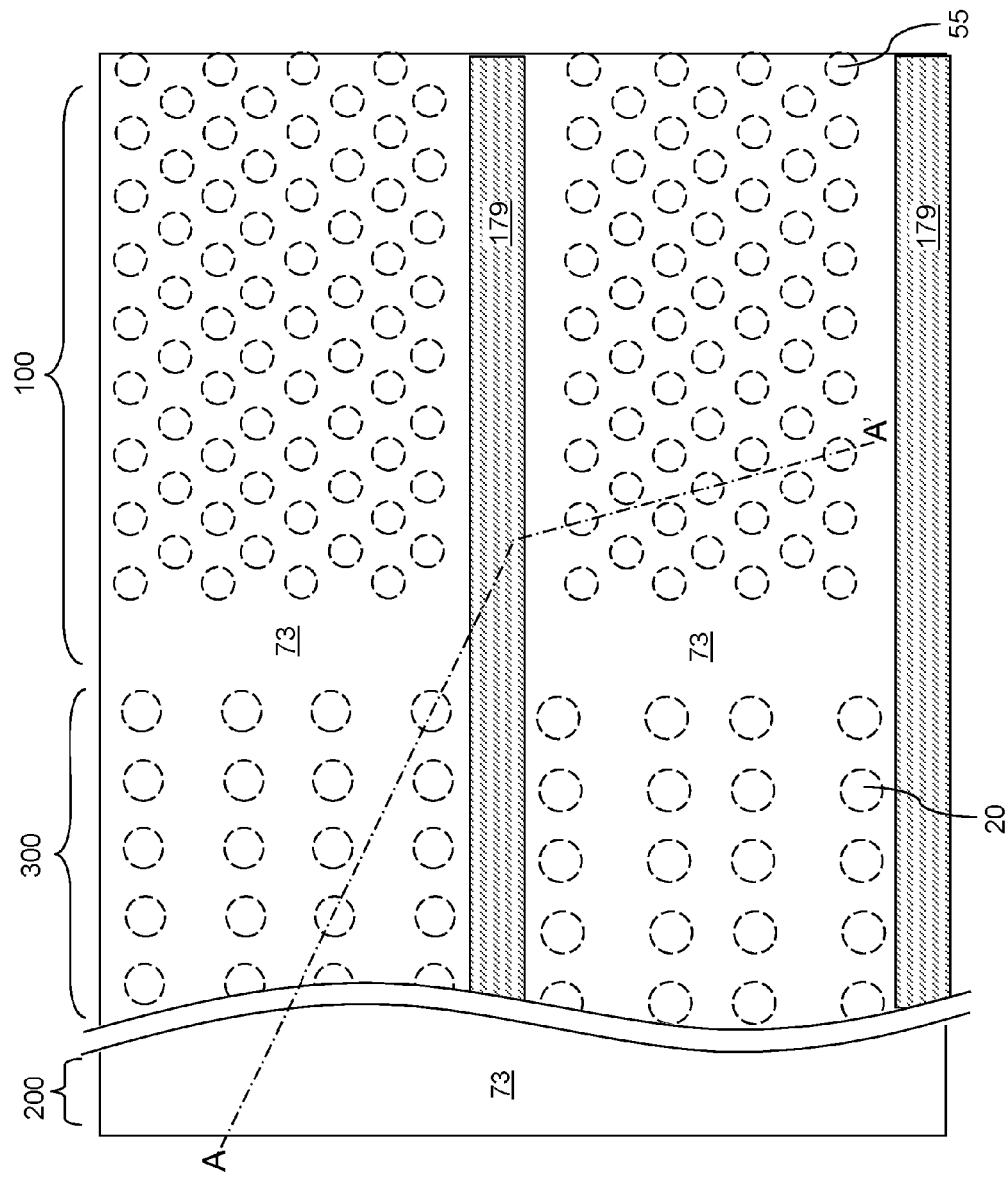

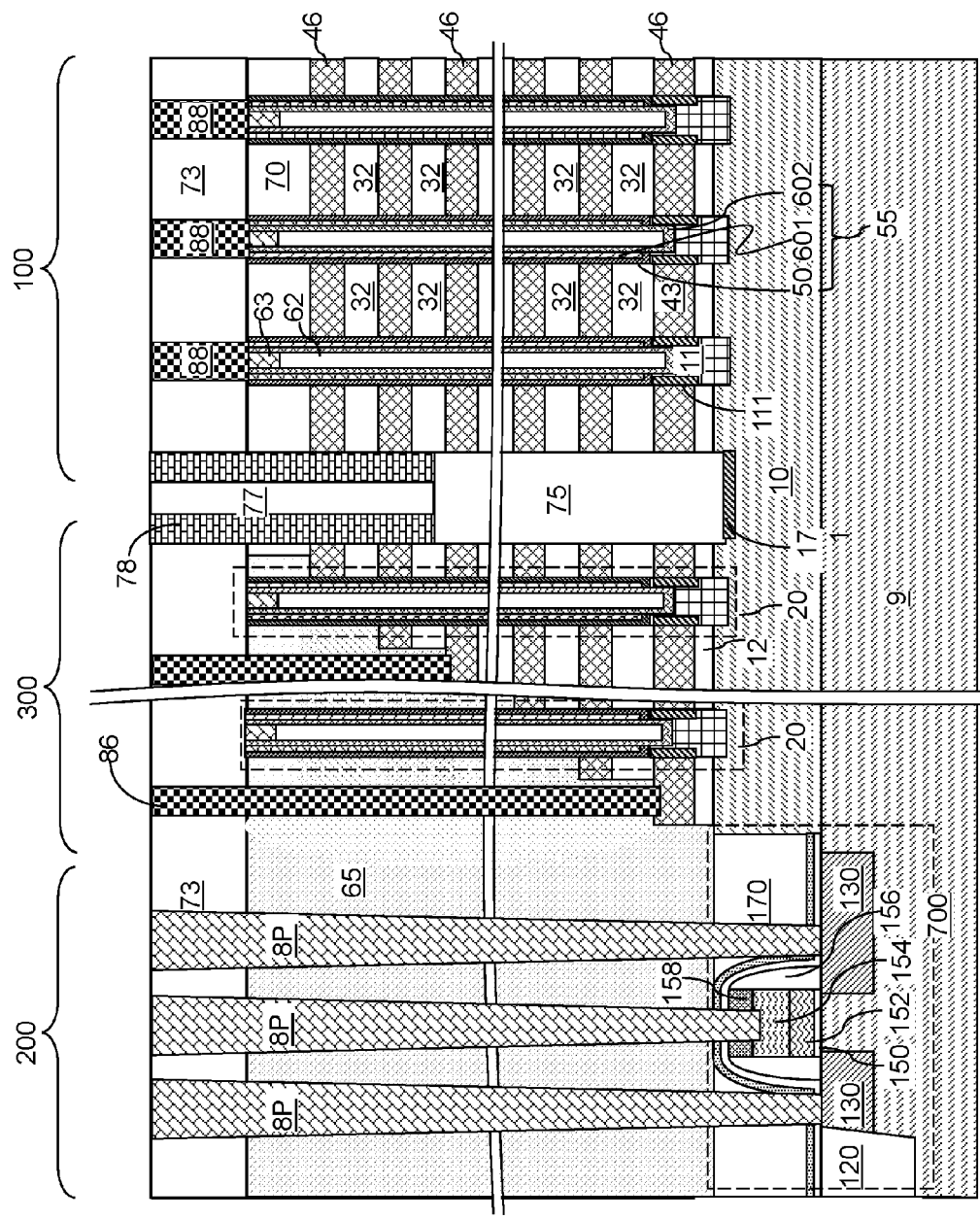

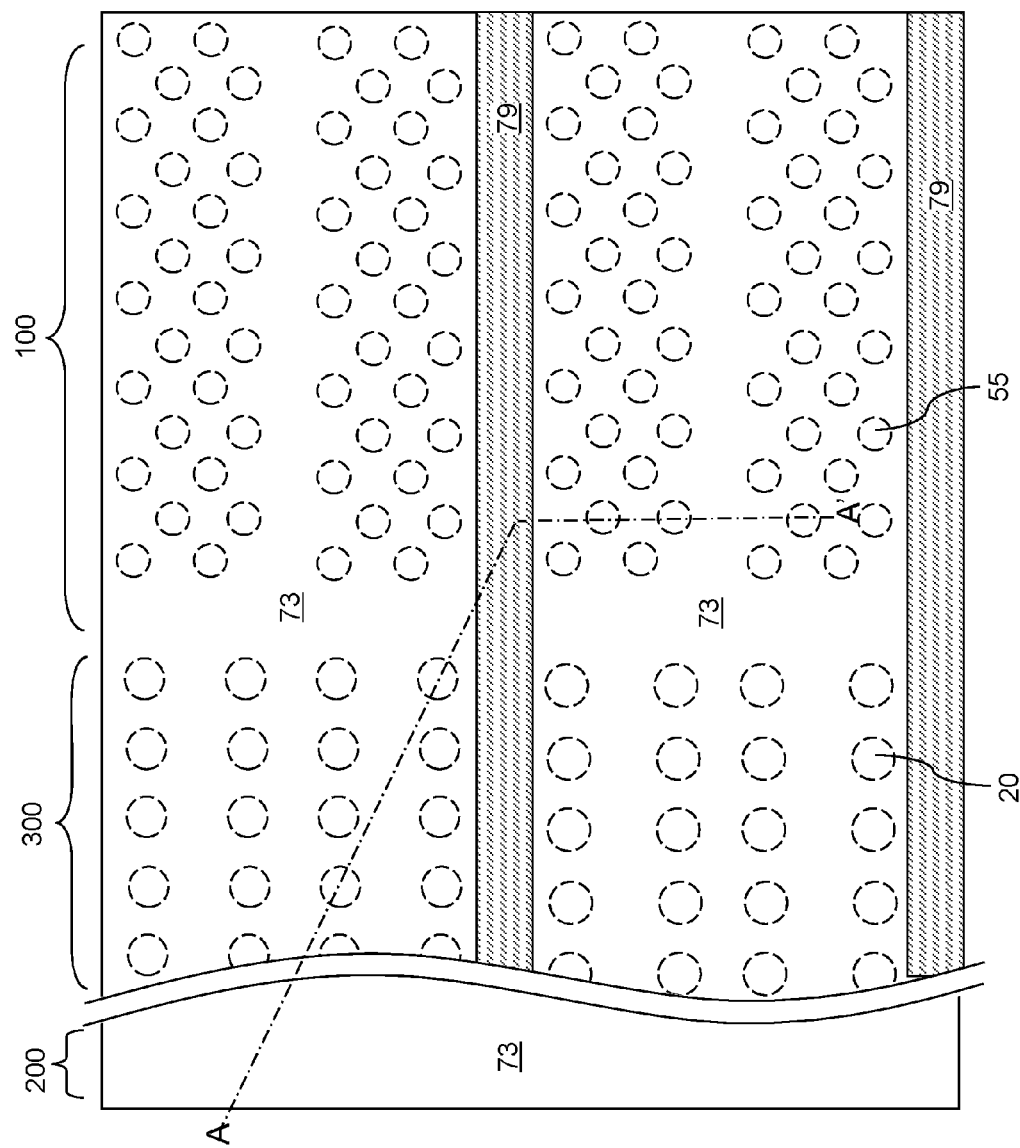

THREE-DIMENSIONAL MEMORY DEVICE HAVING A MULTILEVEL DRAIN SELECT GATE ELECTRODE AND METHOD OF MAKING THEREOF

FIELD

The present disclosure relates generally to the field of semiconductor devices, and particular to a three-dimensional memory device employing a multilevel drain select gate and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

High resistance of metal lines can limit performance of devices. Generally, the narrower a metal line, the higher the resistance. In three-dimensional memory devices in which drain select gate electrodes have a narrower width than underlying control gate electrodes, the relatively higher resistivity of the drain select gate electrodes can limit performance of memory cells within a three-dimensional memory array.

SUMMARY

According to an aspect of the present disclosure, a three-dimensional memory device is provided, which comprises: an alternating stack of insulating layers and electrically conductive layers located over a substrate; memory stack structures extending through the alternating stack, wherein each of the memory stack structures comprises a memory film and a vertical semiconductor channel contacting an inner sidewall of the memory film; an isolation trench laterally extending along a horizontal direction and dividing a set of layers including at least two topmost electrically conductive layers within the alternating stack into two physically disjoined layer stacks including respective segments of the at least two topmost electrically conductive layers; and two conductive rail structures located on lengthwise sidewalls of the isolation trench and laterally extending along the horizontal direction, wherein each of the two conductive rail structures is electrically shorted to segments of the at least two topmost electrically conductive layers located within a respective physically disjoined layer stack.

According to another aspect of the present disclosure, a method of forming a three-dimensional memory device is provided. An alternating stack of insulating layers and spacer material layers is formed over a substrate. The spacer material layers are formed as, or are replaced with, electrically conductive layers. Memory stack structures are formed through the alternating stack. Each of the memory stack structures comprises a memory film and a vertical semiconductor channel contacting an inner sidewall of the memory film. An isolation trench laterally extending along a horizontal direction at least through a set of layers including at least two topmost spacer material layers is formed within the alternating stack. The isolation trench divides each layer within the set of layers into multiple segments. Two conductive rail structures are formed on lengthwise sidewalls of the isolation trench. Each of the two conductive rail structures is electrically shorted to segments of at least two topmost electrically conductive layers provided within a respective one of two physically disjoined layer stacks that are separated by the isolation trench.

BRIEF DESCRIPTION OF THE DRAWINGS

FIGS. 5A-5H are sequential schematic vertical cross-sectional views of a memory opening within the first exemplary structure up to the processing step of deposition of a second semiconductor channel layer according to the first embodiment of the present disclosure.

FIG. 7B is a partial see-through top-down view of the first exemplary structure of FIG. 7A. The vertical plane A-A' is the plane of the schematic vertical cross-sectional view of FIG. 7A.

FIG. 16A is a schematic vertical cross-sectional view of the first exemplary structure after formation of contact via structures according to the first embodiment of the present disclosure.

FIG. 48B is a top-down view of the fourth exemplary structure of FIG. 48A. The vertical plane A-A' is the plane of the schematic vertical cross-sectional view of FIG. 48A.

DETAILED DESCRIPTION

Figure 1:
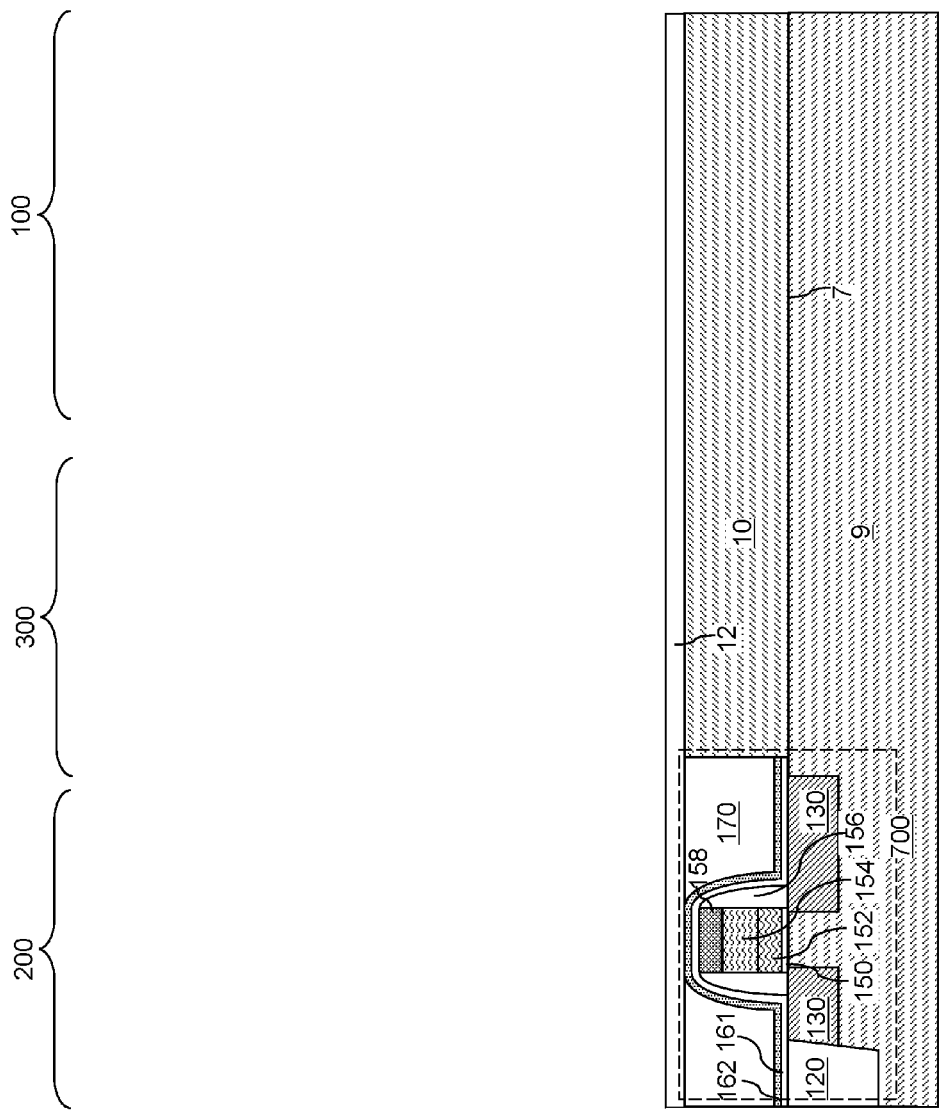
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to three-dimensional memory devices employing a multilevel drain select gate and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral region (e.g., peripheral device region) 200. The region in which a memory array is subsequently formed is herein referred to as a memory array region 100. A contact region 300 for subsequently forming stepped terraces of electrically conductive layers can be provided between the memory array region 100 and the peripheral region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
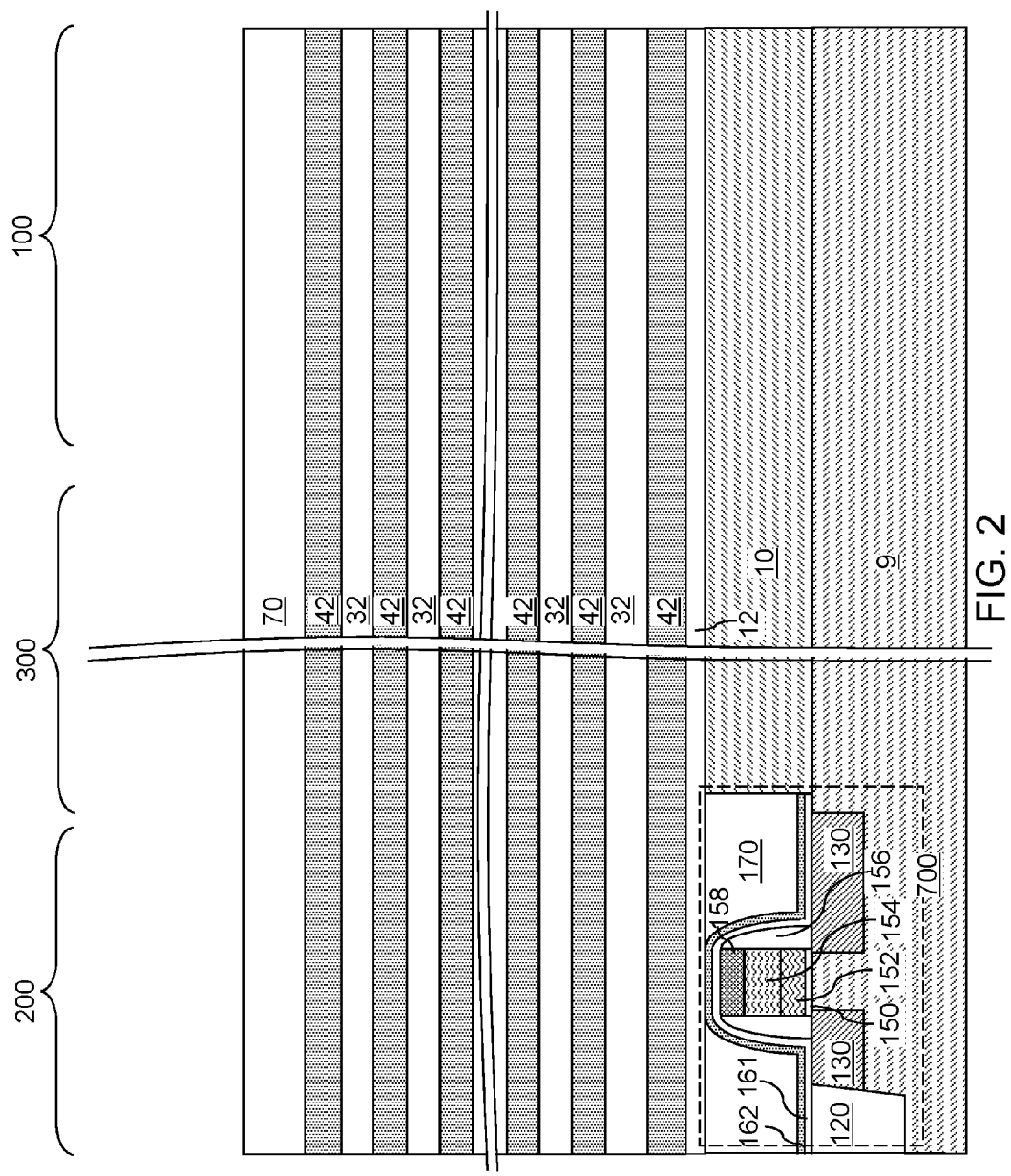
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
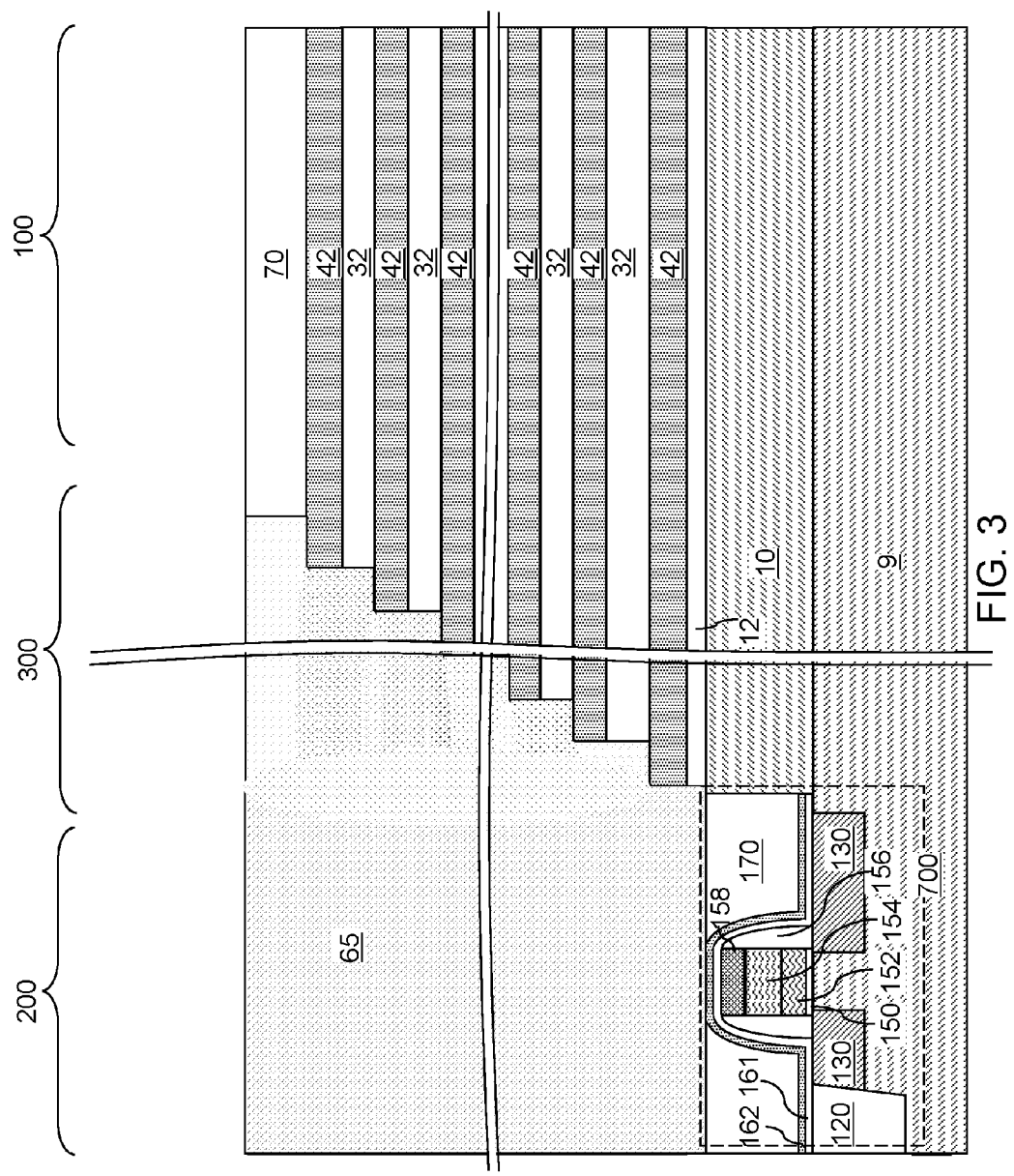
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity can be formed within the contact region 300 which is located between the memory array (e.g., device) region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP).

The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
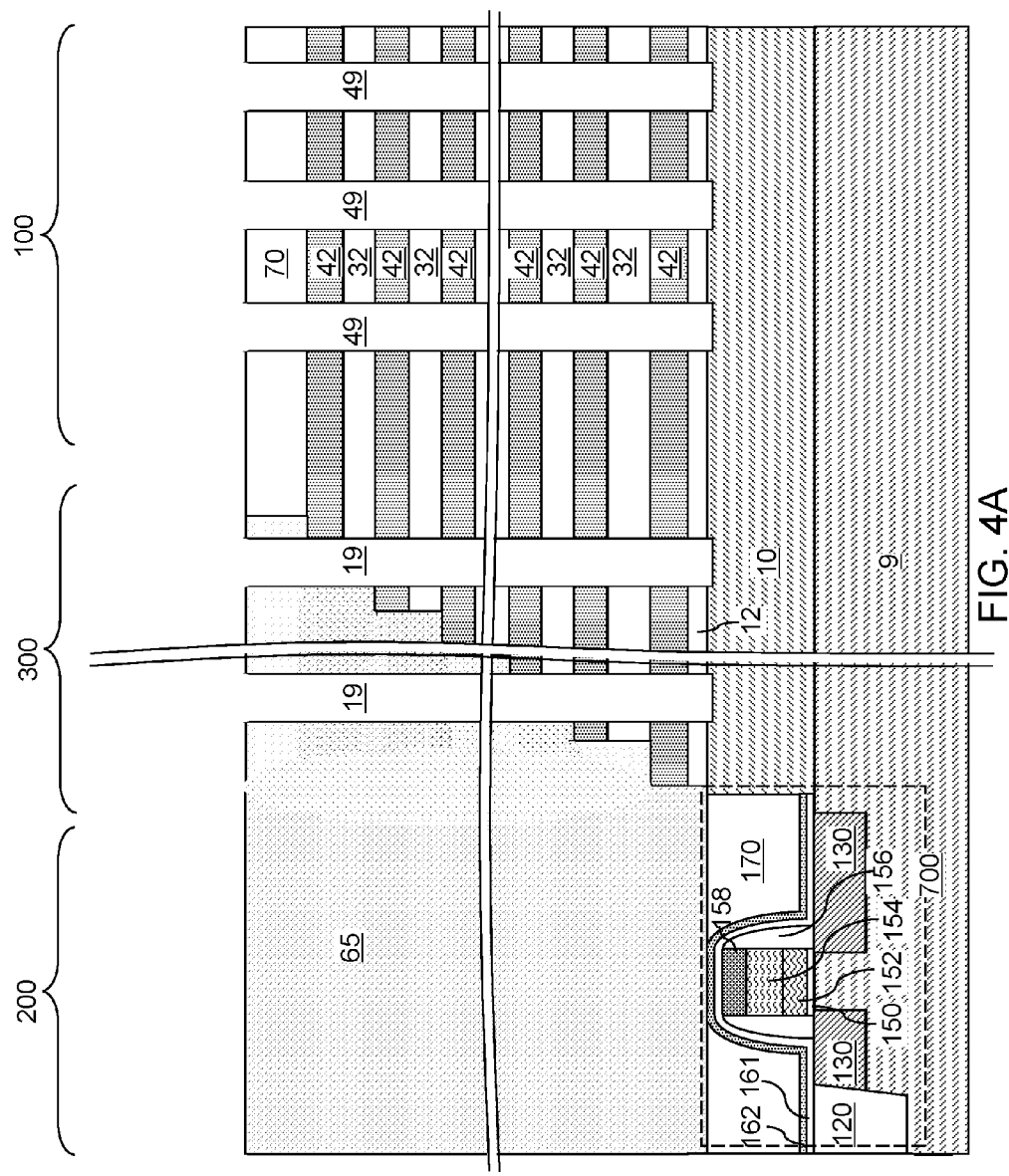
FIG. 4A is a schematic vertical cross-sectional view of the first exemplary structure after formation of memory openings and support openings according to the first embodiment of the present disclosure.
Figure 4B:
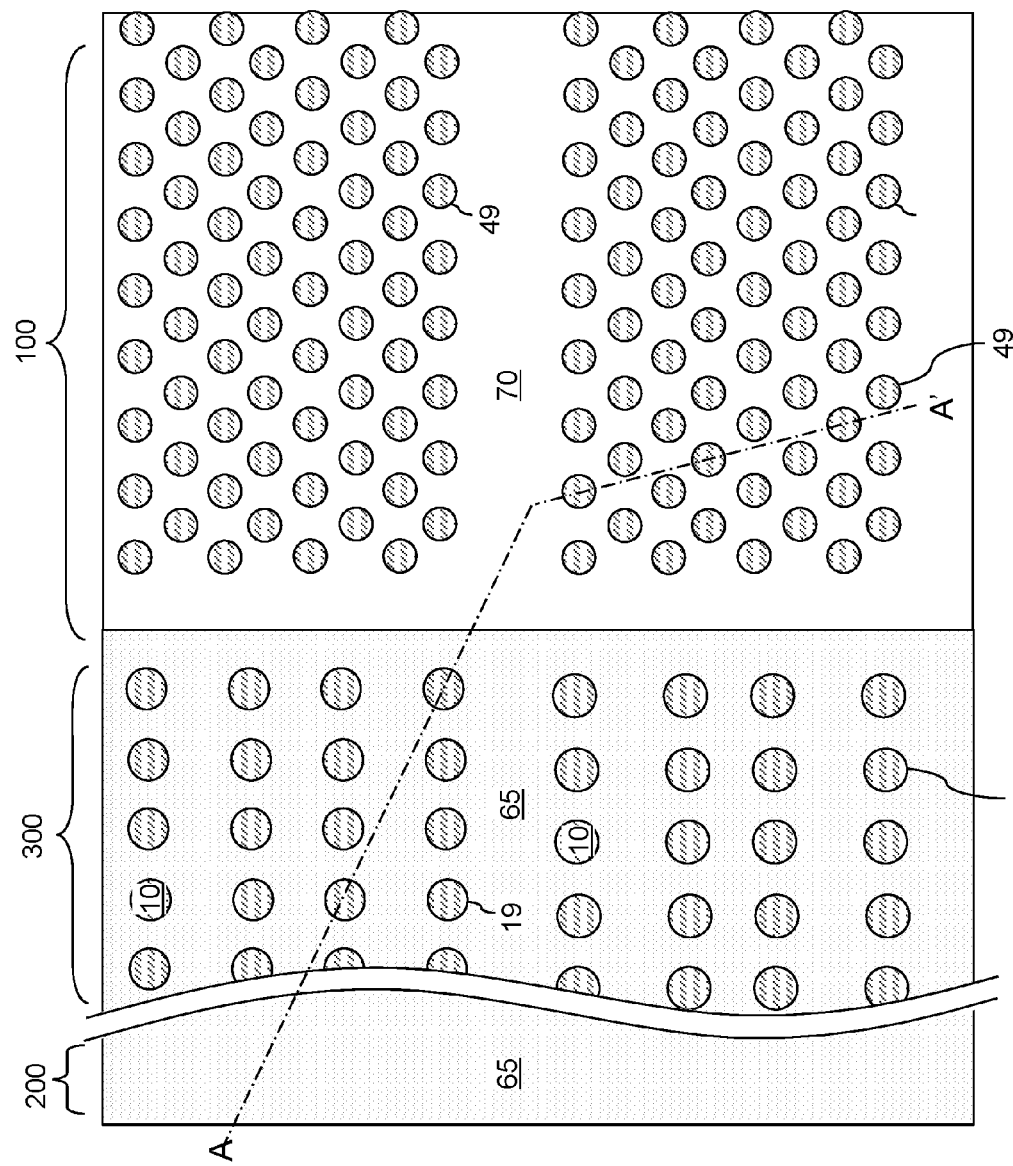
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the first exemplary device structure of FIGS. 4A and 4B is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49 and each support openings 19, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5F:
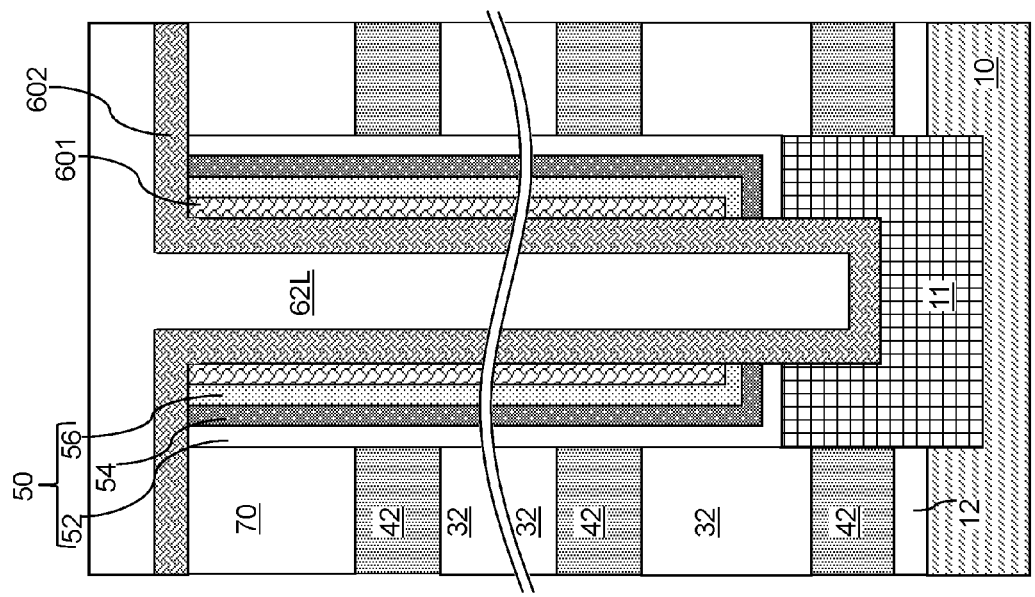
Figure 5E:
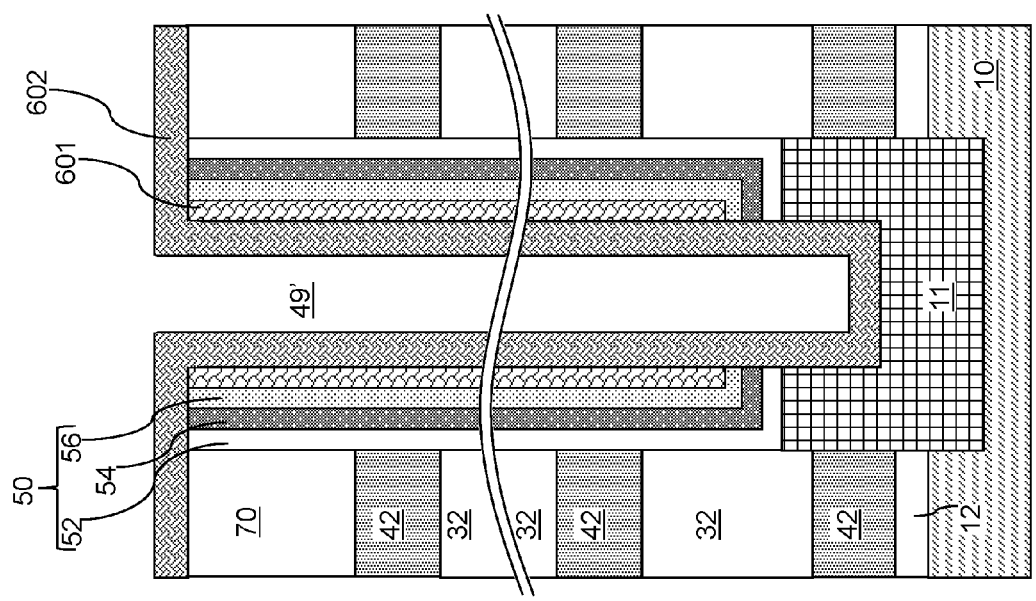

Referring to FIG. 5E, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
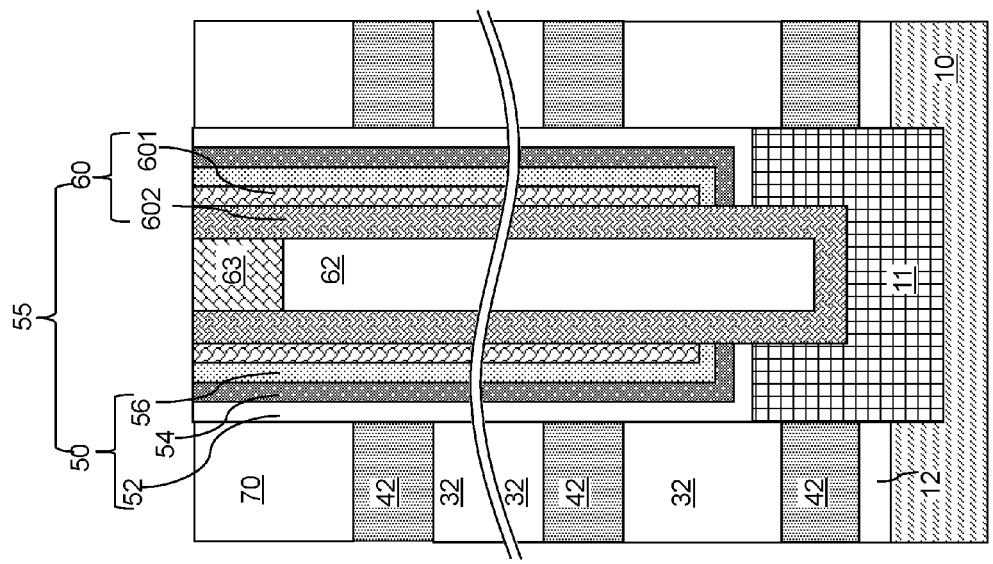
Figure 5G:
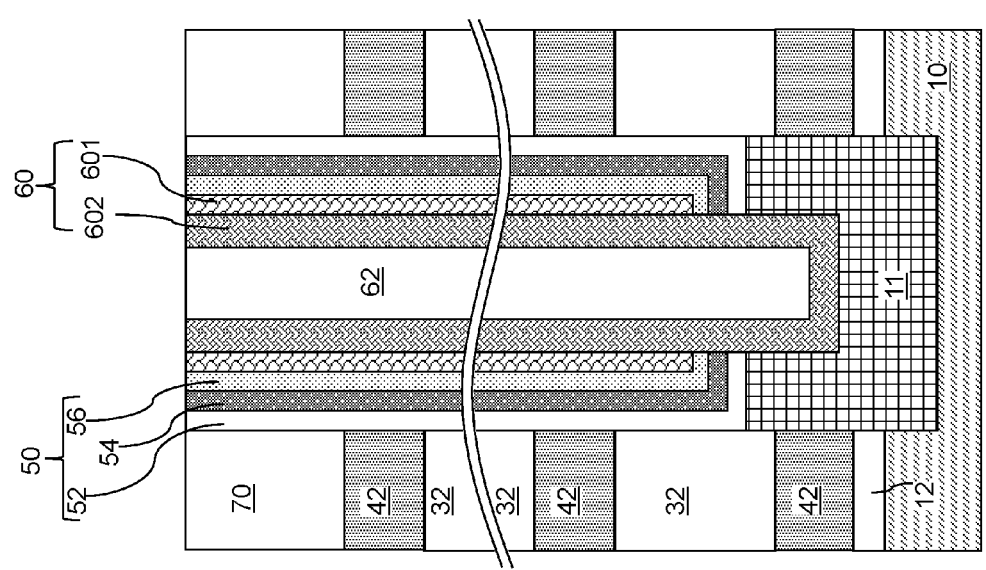

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52.

Figure 6:
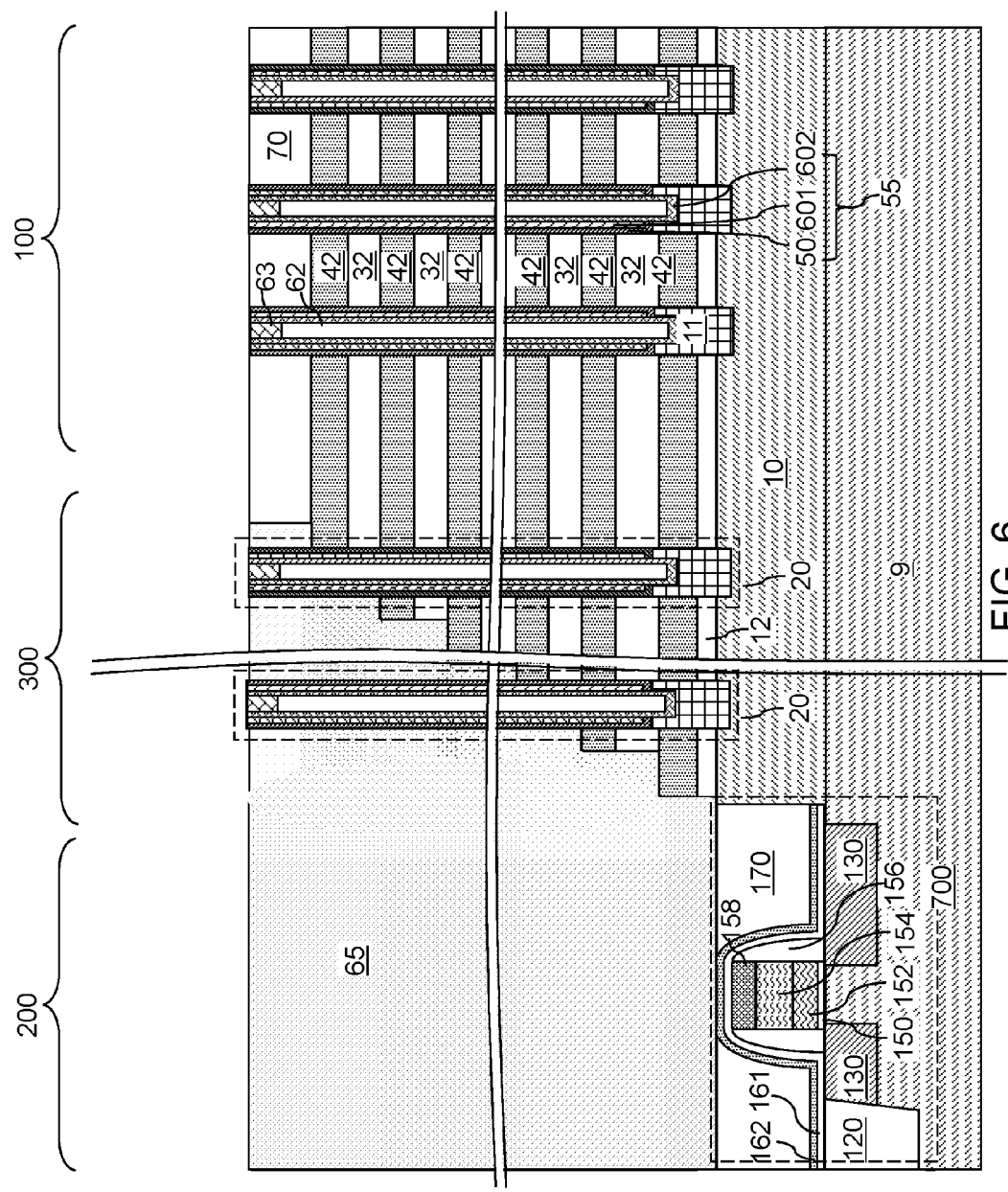
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures (11, 55, 62, 63) and support pillar structures 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial channel portion 11 (if present), a memory film 50, a vertical semiconductor channel 60, a dielectric core 62, and a drain region 63 within each support opening 19 fills the respective support openings 19, and constitutes a support pillar structure 20. The drain region 63 in the support pillar structure is a dummy drain region because it is not electrically connected to a bit line. Thus, the vertical semiconductor channel 60 and the memory film 50 in the support pillar structure 20 are structural support elements which are not electrically active.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
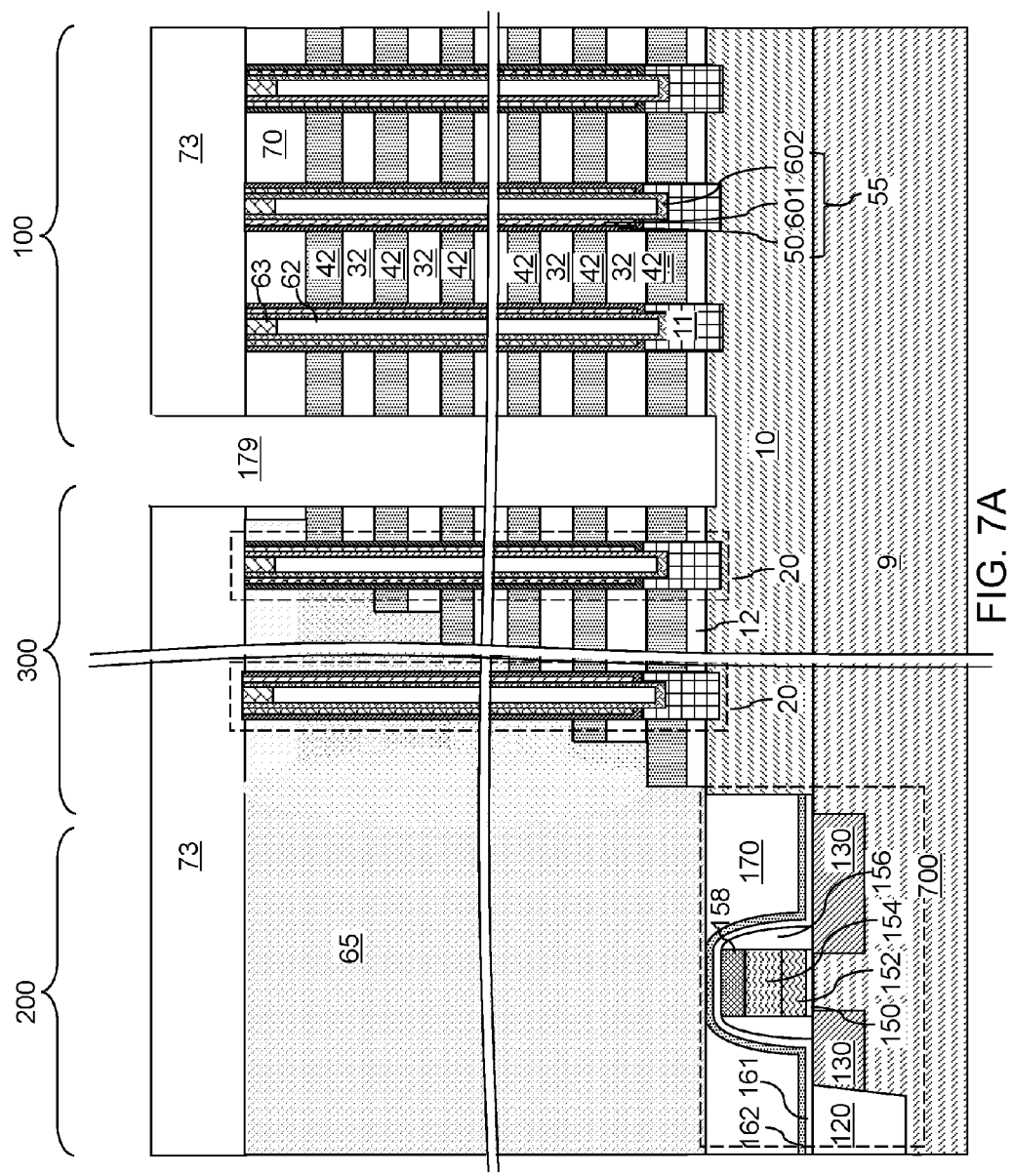
FIG. 7A is a schematic vertical cross-sectional view of the first exemplary structure after formation of isolation trenches according to the first embodiment of the present disclosure.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the alternating stack (32, 42), and is lithographically patterned to form openings in areas between clusters of memory stack structures 55. The pattern in the photoresist layer can be transferred through the alternating stack (32, 42) and/or the retro-stepped dielectric material portion 65 employing an anisotropic etch to form the isolation trenches 179, which vertically extend at least to the top surface of the substrate (9, 10), and laterally extend through the memory array region 100 and the contact region 300.

The isolation trench 179 can vertically extend to the top surface of the substrate (9, 10). In one embodiment, each isolation trench 179 can laterally extend along a horizontal direction through the entirety of the alternating stack ((32, 42), and therefore, extends through a set of layers including at least two topmost spacer material layers 42 within the alternating stack (32, 42). As used herein, "N topmost sacrificial material layers" refer to the set of first through N-th sacrificial material layers as counted from the top. Likewise, "N topmost material layers" of any type refer to the set of first through N-th material layers of that type as counted from the top. Each isolation trench 179 laterally divides each layer within the alternating stack (32, 42) into multiple segments, i.e., into a respective pair of segments. Thus, each isolation trench 179 laterally divides each layer within the set of layers including at least two topmost spacer material layers 42 within the alternating stack (32, 42) into multiple segments, i.e., into respective pairs of segments located at a respective level. The photoresist layer can be removed, for example, by ashing.

Figure 8:
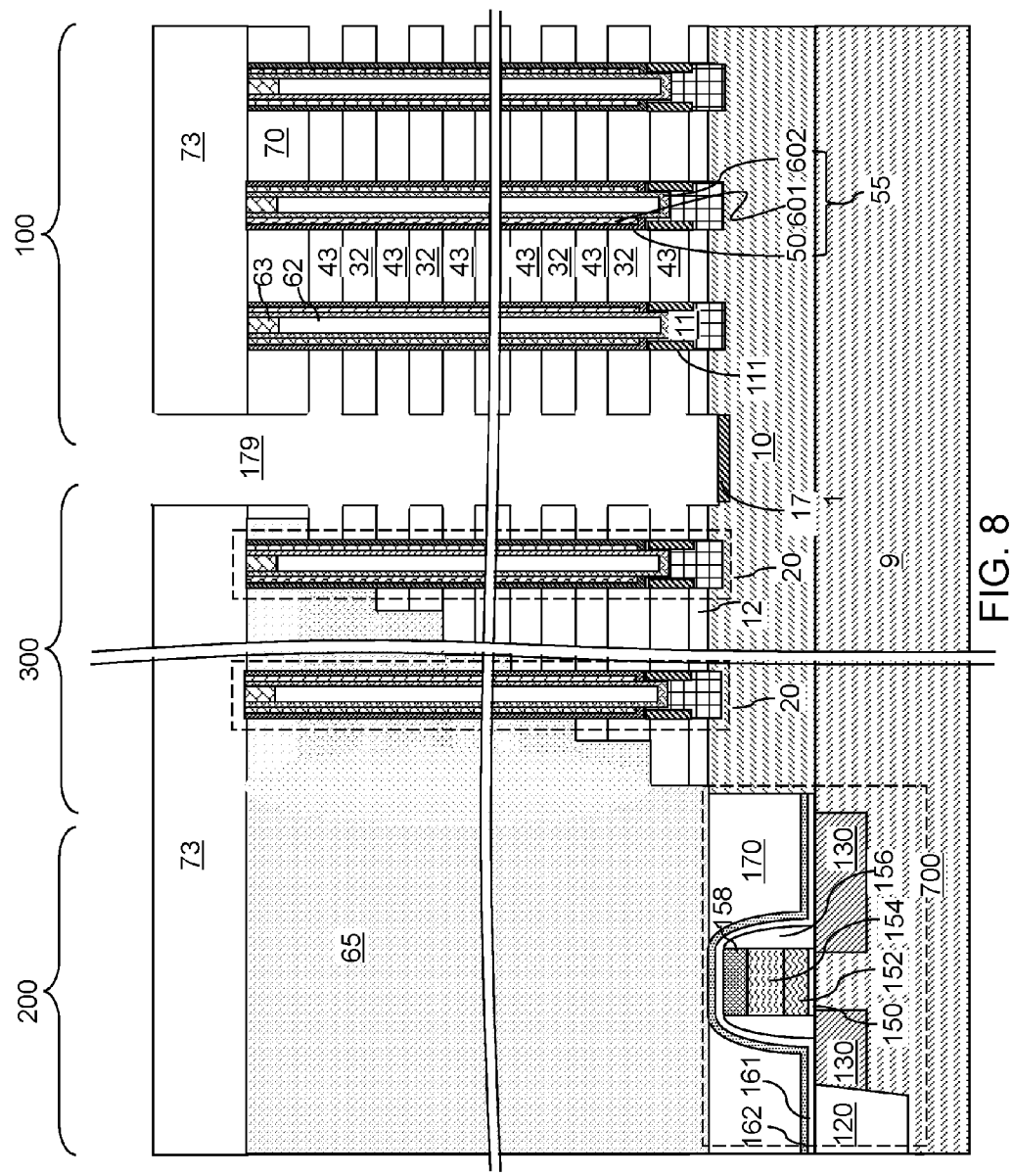
FIG. 8 is a schematic vertical cross-sectional view of the first exemplary structure after formation of backside recesses according to the first embodiment of the present disclosure.

Referring to FIG. 8, an etchant that selectively etches the second material of the sacrificial material layers 42 with respect to the first material of the insulating layers 32 can be introduced into the isolation trenches 179, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the support pillar structure 20, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32 and the retro-stepped dielectric material portion 65 can be selected from silicon oxide, silicon nitride, and dielectric metal oxides. In this case, the depth of the isolation trenches 179 can be modified so that the bottommost surface of the isolation trenches 179 is located within the gate dielectric layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the isolation trenches 179. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

At least a surface portion of each epitaxial channel portion 11 can be doped with dopants of a second conductivity type that is the opposite of the first conductivity type to form source regions 111. The doping of the surface portions of the epitaxial channel portions 11 can be performed by a plasma doping process or a gas phase doping process. In one embodiment, the source regions 111 can be formed in a tubular configuration, i.e., in a shape that is topologically homeomorphic to a torus and having a substantially vertical outer sidewall and a substantially vertical inner sidewall. In another embodiment, the entirety of each epitaxial channel portion 11 may be converted into a respective source region 111. The net dopant concentration (i.e., the concentration of the second conductivity type dopants less the concentration of the first conductivity type dopants) in the source regions 111 can be in a range from $5.0 \times 10^{19}/cm^3$ to $2.0 \times 10^{21}/cm^3$, although lesser and greater dopant concentrations can also be employed. A doped well 171 having a doping of the second conductivity type can be formed at the bottom of each isolation trench 179.

Figure 9:
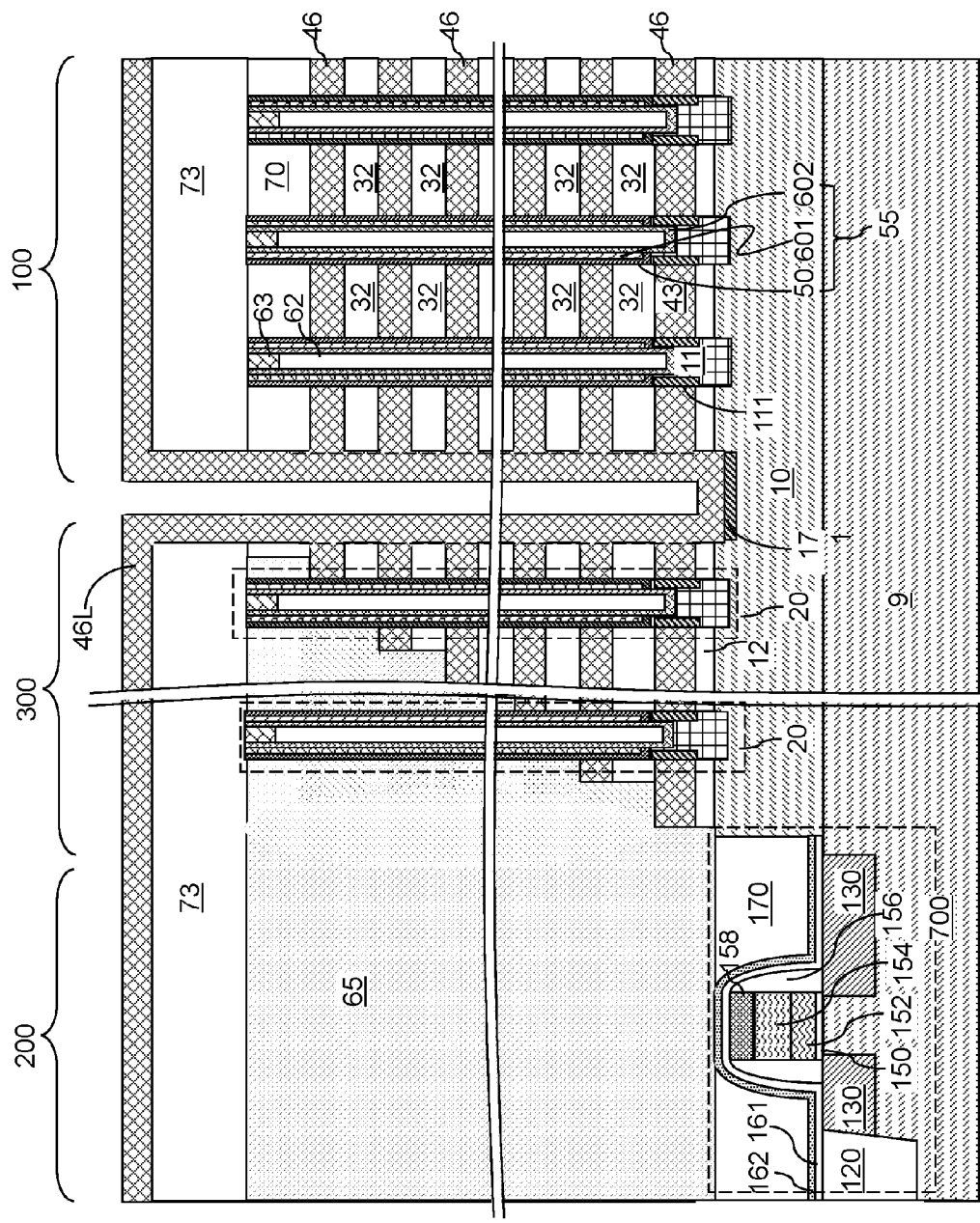
FIG. 9 is a schematic vertical cross-sectional view of the first exemplary structure after deposition of at least one electrically conductive material in the backside recesses and peripheral portions of the isolation trenches according to the first embodiment of the present disclosure.

Referring to FIG. 9, at least one conductive material can be deposited in the backside recesses 43, peripheral portions of the isolation trenches 179, and over the contact level dielectric layer 73 by conformal deposition. Each continuous portion of the at least one conductive material deposited in a backside recess 43 constitutes an electrically conductive layer 46. The conductive material deposited outside of the backside recesses 43 collectively constitute a continuous metallic material layer 46L, which is a continuous layer of the conductive material that is deposited over the contact level dielectric layer 73 and at peripheral portions of the isolation trenches 179.

In an illustrative example, a metallic barrier layer (not explicitly shown) can be deposited in the backside recesses. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the isolation trenches 179, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43. The continuous metallic material layer 46L can be formed on the sidewalls of each isolation trench 179 and over the contact level dielectric layer 73. Each electrically conductive layer 46 includes a portion of the metallic barrier layer and a portion of the metallic fill material layer that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer and a continuous portion of the metallic fill material layer that are located in the isolation trenches 179 or above the contact level dielectric layer 73.

Each sacrificial material layer 42 can be replaced with an electrically conductive layer 46. An isolation cavity is present in the portion of each isolation trench 179 that is not filled with the backside blocking dielectric layer and the continuous metallic material layer 46L.

In embodiments in which the epitaxial channel portions 11 are employed, the epitaxial channel portions 11 are formed at the bottom of each of the memory openings 49 as semiconductor material portions, and can have a doping of the first conductivity type. Each vertical semiconductor channel 60 can be formed on a respective epitaxial channel portion 60. A bottommost electrically conductive layer 46 among the electrically conductive layer 46 can be formed directly on sidewalls of the epitaxial channel portions 11, and thus, can be electrically shorted to the epitaxial channel portions 11 (which are semiconductor material portions).

Figure 10:
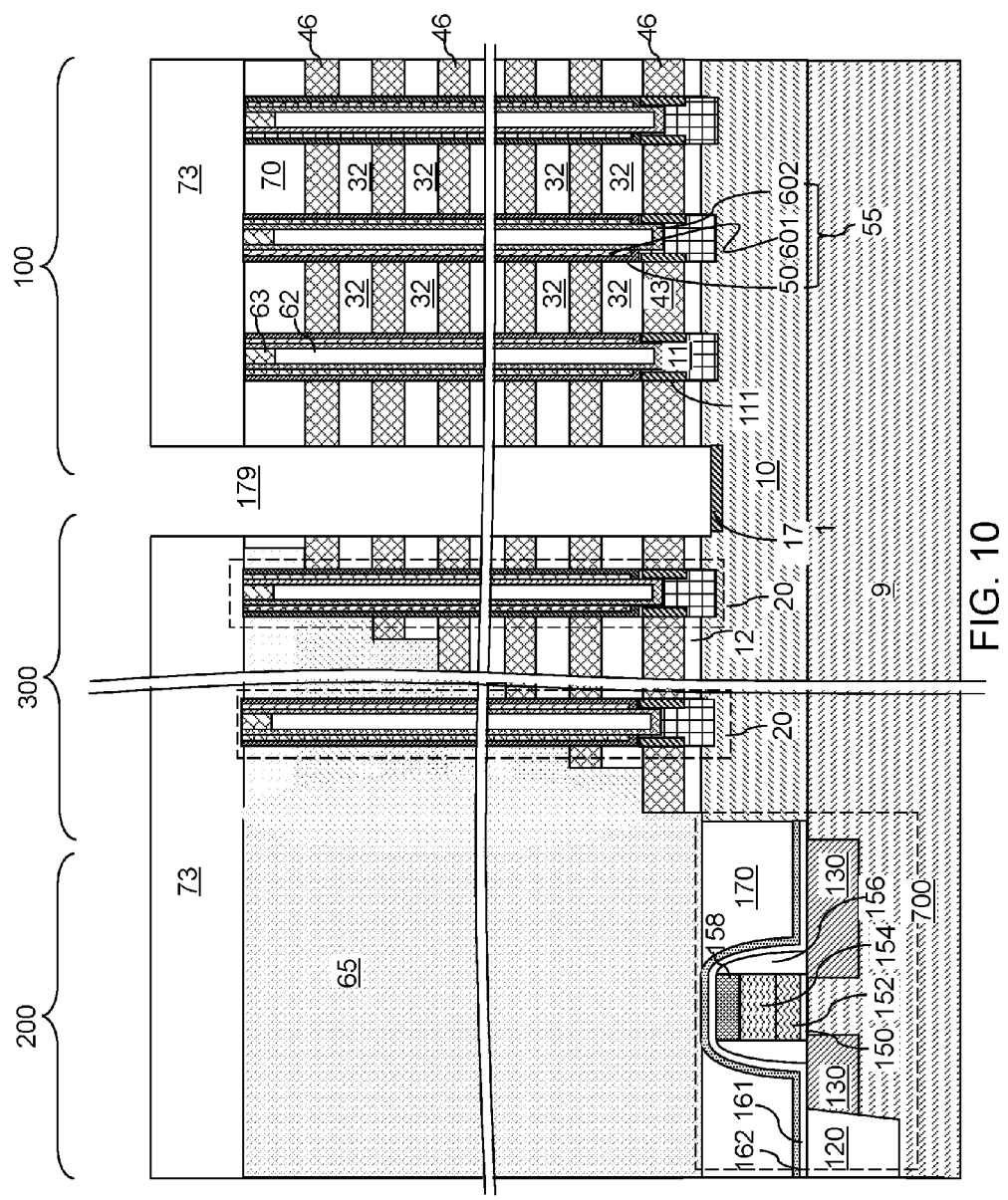
FIG. 10 is a schematic vertical cross-sectional view of the first exemplary structure after removal of a deposited conductive material from within the isolation trench according to the first embodiment of the present disclosure.

Referring to FIG. 10, the deposited metallic material of the continuous electrically conductive material layer 46L is etched back from the sidewalls of each isolation trench 179 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

A subset of the electrically conductive layer 46 that excludes the bottommost electrically conductive layer can function as a combination of a plurality of control gate electrodes located at a same level and a word line electrically interconnecting, i.e., electrically shorting, the plurality of control gate electrodes located at the same level. The bottommost electrically conductive layer can function as a source electrode layer. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. In one embodiment, another subset of the electrically conductive layers 46 that includes the topmost electrically conductive layer can function as drain select gate electrodes.

Figure 11:
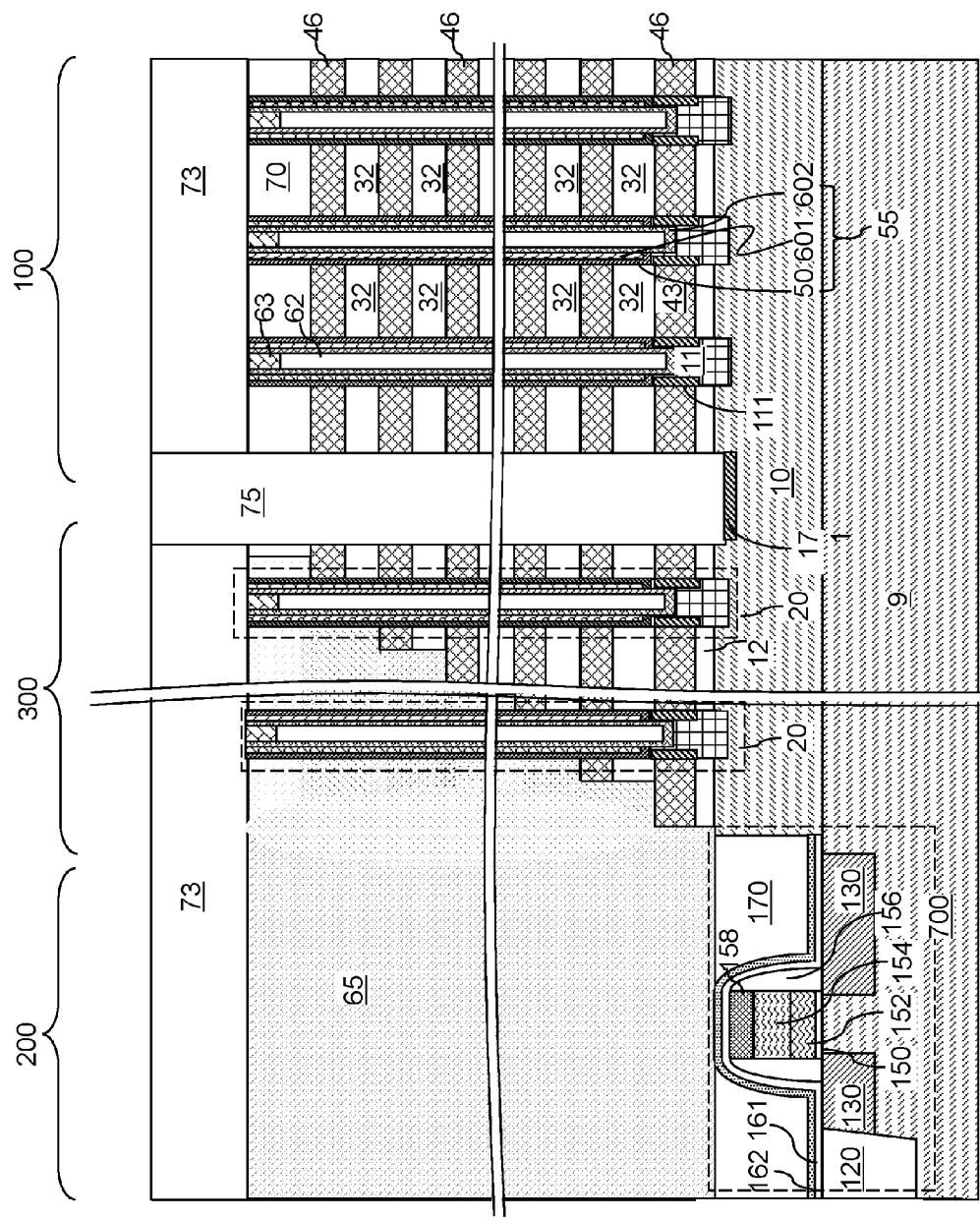
FIG. 11 is a schematic vertical cross-sectional view of the first exemplary structure after formation of a dielectric rail structure within each isolation trench according to the first embodiment of the present disclosure.

Referring to FIG. 11, at least one dielectric material is deposited within each isolation trench 179. In one embodiment, the at least one dielectric material can have a greater etch rate than that of the insulating layers 32 and the dielectric material of the contact level dielectric layer 73. For example, the insulating layers 32 and the contact level dielectric layer 73 can include undoped silicate glass (i.e., undoped silicon oxide), and the at least one dielectric material can include doped silicate glass (such as borosilicate glass) and/or porous or non-porous organosilicate glass. In another example, the insulating layers 32 and the contact level dielectric layer 73 can include undoped silicate glass or doped silicate glass, and the at least one dielectric material can include porous or non-porous organosilicate glass. In yet another example, the insulating layers 32 and the contact level dielectric layer 73 can include undoped silicate glass (i.e., silicon oxide) that is deposited by a different method and/or using a different source gas from the at least one dielectric material to obtain a difference in etch selectivity, such as those described in U.S. Pat. No. 9,305,932 B2, incorporated by reference herein in its entirety. For example, silicon oxide materials that may be used include, but are not limited to, dichlorosilane (DCS, $H_2SiCl_2$) based silicon oxides, disilane (DS, $Si_2H_6$) based silicon oxides, high aspect ratio process (HARP) non-plasma based CVD using TEOS and ozone sources based silicon oxides, high density plasma (HDP) CVD based silicon oxides, tetraethyl orthosilicate (TEOS) based silicon oxides and borosilicate glass (BSG) or borophosphosilicate glass (BPSG). Selective etching of silicon oxide materials may be performed by chemical dry etching or wet etching techniques. Example silicon oxide combinations suitable for use with selective dry etching techniques are summarized in Table 1 below while combinations suitable for use with wet etching techniques are summarized in Table 2 below.

TABLE 1

|  | Etch Selectivity | Etching Method |
| --- | --- | --- |
| DCS Oxide:DS Oxide | 5:1-32:1 (tunable) | CDE (Chemical Dry Etching) |
| HARP:HDP Oxide | 230:1 | CDE (Chemical Dry Etching) |

TABLE 2

| Etch Selectivity (BPSG:TEOS) | Wet etch Method 99.7% Acetic acid:49% HF ratio |
| --- | --- |
| 27:1 | 200:1 |
| 42:1 | 100:1 |
| 55:1 | 50:1 |

As can be seen in Tables 1 and 2 above, the selectivity among the silicon oxide pairs may range from 5:1 to 230:1. Further, in the case of DCS:DS, the selectivity is tunable. That is, the selectivity between DCS and DS may be chosen based on the etching conditions, e.g. temperature, etchant composition, etc. In an embodiment, elective etching may comprise using a $HF:H_2O$ in a 1:5-15 ratio or a $HF:C_2H_4O_2$ in a 1:40-60 ratio wet etch chemistry. Alternatively, the selective etching may comprise selective dry etching using any suitable dry etching system, such as the Frontier® CDE system from Applied Materials, Inc. The various silicon oxides discussed above may be deposited by any suitable manner, such as low pressure chemical vapor deposition (LPCVD), plasma enhanced chemical vapor deposition (PECVD), chemical vapor deposition (CVD), and atmospheric pressure chemical vapor deposition (APCVD). Table 3 below summarizes the process parameters (i.e., reactor type, temperature, pressure, reactant gases and flow ratios) suitable for deposition of the above described silicon oxide materials.

TABLE 3

| Oxide Type | CVD Reactor Type | Temperature | Pressure | Reactant gases & flow ratio |
| --- | --- | --- | --- | --- |
| DCS Oxide | LPCVD | 700-900° C. | 125 mT-1 T | $DCS:N_2O$ = 0.25-1 |
| DS Oxide | PECVD | ~300° C. | 700 mT | $DS:N_2O$ = 3:1 |
| HARP (TEOS + Ozone) | Non-plasma based CVD | ~400° C. | 760 T (atmospheric) | TEOS and $O_3$ |
| HDP Oxide | PECVD | 300-400° C. | 2-10 T | Ar, $TEOS(SiH_4)$ & $O_2$ |
| TEOS | PECVD | <450° C. | 2-10 T | $TEOS:O_2$ = 1:10-1:20 |
| BPSG | PECVD | 300-500° C. |  | $B_2H_6$, Phosphine & $SiH_4$ |

TABLE 3-continued

| Oxide Type | CVD Reactor Type | Temperature | Pressure | Reactant gases & flow ratio |
| --- | --- | --- | --- | --- |
| BPSG | APCVD | 300-500° C. | 760 T | $B_2H_6$, Phosphine & $SiH_4$ |

The at least one dielectric material can be deposited as a single dielectric material layer, or can be deposited as a stack of multiple dielectric material layers. Excess portions of the at least one dielectric material can be removed from above the top surface including the contact level dielectric layer 73 by a planarization process, which can include chemical mechanical planarization (CMP) and/or a recess etch. Each remaining portion of the deposited at least one dielectric material fills a respective isolation trench 179, and can constitute a dielectric rail structure 75 having a substantially uniform vertical cross-sectional shape within horizontal planes that intersect the respective isolation trench 179 and perpendicular to the lengthwise direction of the respective isolation trench 179. The at least one dielectric material can fill each isolation trench 179 up to the top periphery of the isolation trenches 179.

Figure 12:
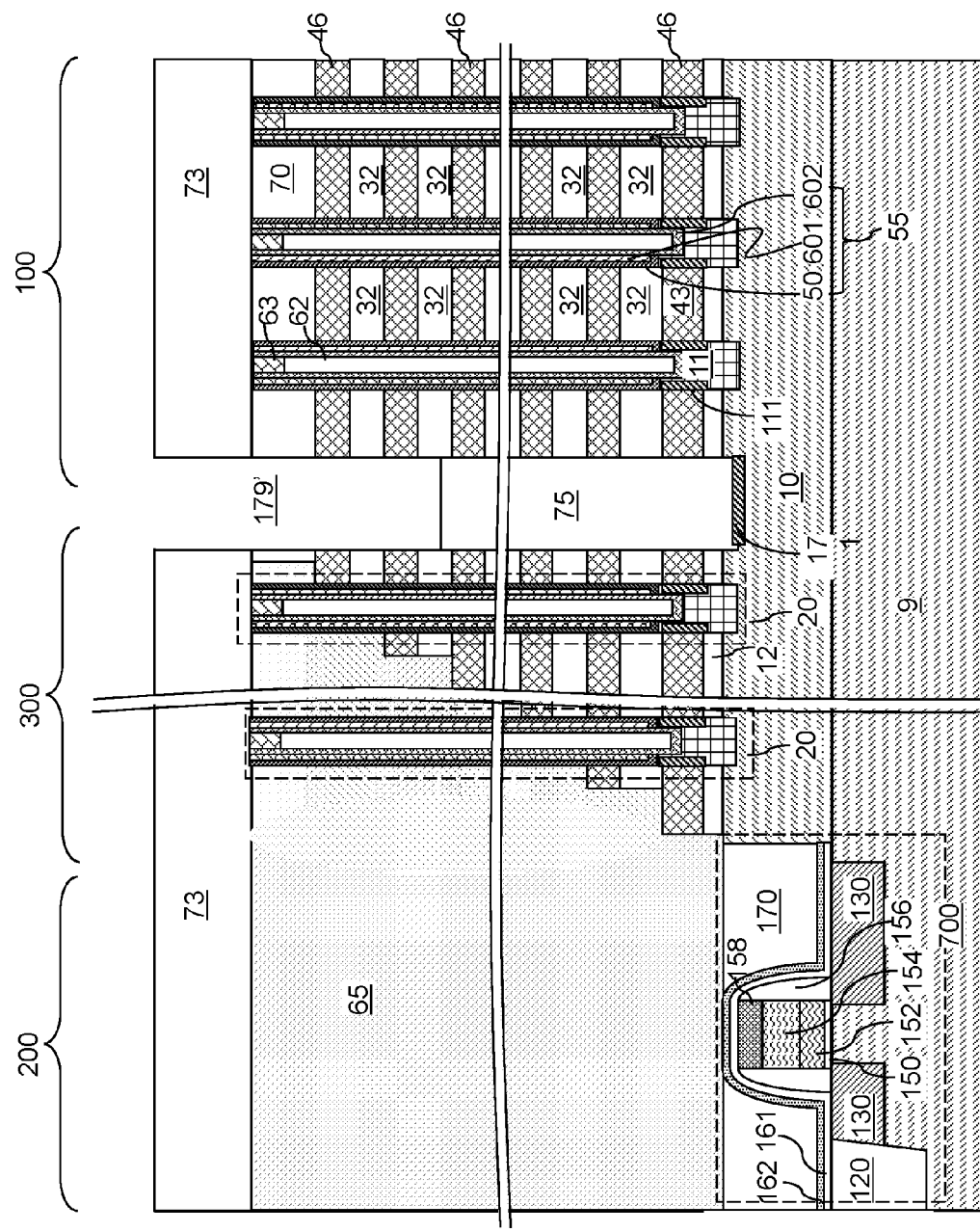
FIG. 12 is a schematic vertical cross-sectional view of the first exemplary structure after vertical recessing of the dielectric rail structures according to the first embodiment of the present disclosure.

Referring to FIG. 12, each top portion of the dielectric rail structures 75 can be vertically recessed selective to the dielectric materials of the contact level dielectric layer 73. An anisotropic etch or an isotropic etch process can be employed to vertically recess the top portions of the dielectric rail structures 75. A recess cavity, which is herein referred to as an isolation cavity 179', is formed over each remaining portion of the dielectric rail structures 75. The depth of recess is selected such that the bottom surface of each isolation cavity 179' is located at the level of an insulating layer 32 that is between the topmost control gate electrode level and the bottommost drain select gate level, i.e., between the electrically conductive layer 46 that functions as the topmost control gate electrode and the electrically conductive layer 46 that functions as the bottommost layer of a drain select gate electrode.

While the present disclosure is described employing an embodiment in which two topmost electrically conductive layers 46 are employed as drain select gate electrodes that are employed to select or deselect a vertical semiconductor channel from the drain side, embodiments are expressly employed herein in which three or more topmost electrically conductive layers 46 are employed as drain select gate electrodes.

The isolation trenches 179 extend from the top surface of the contact level dielectric layer 73 to the top surface of the substrate (9, 10). The dielectric rail structures 75 are formed by filling at least one dielectric material in the isolation trenches 179 up to the top periphery of each isolation trench 179 and vertically recessing top portions of the at least one dielectric material. Each dielectric rail structure 75 laterally extends along the horizontal direction at a lower portion of a respective isolation trench 179, and is located directly on the substrate (9, 10).

Figure 13:
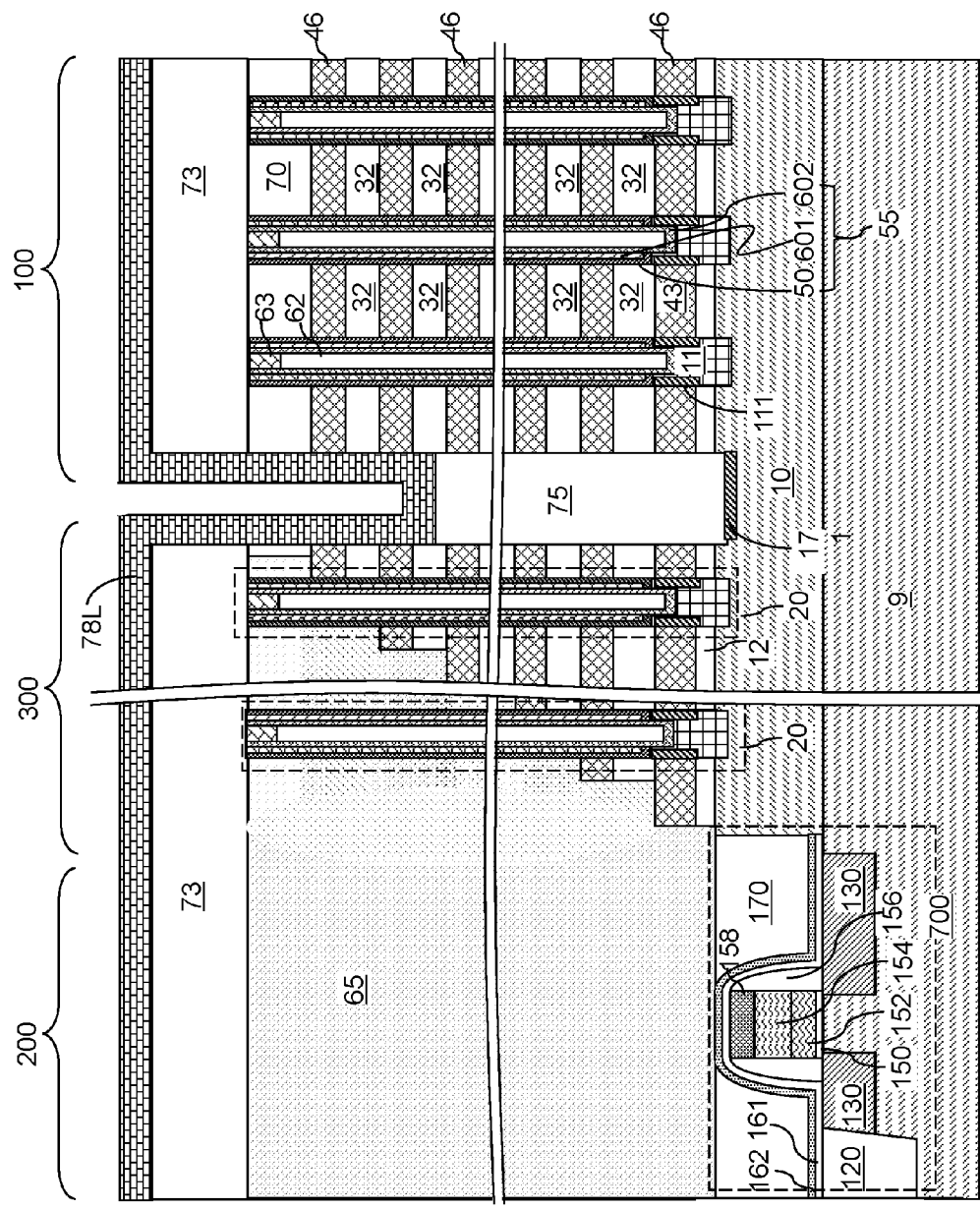
FIG. 13 is schematic vertical cross-sectional view of the first exemplary structure after formation of a conductive material layer according to the first embodiment of the present disclosure.

Referring to FIG. 13, a conductive material layer 78L can be deposited at the periphery of each isolation cavity 179' and over the top surface of the contact level dielectric layer 73. The isolation trenches 179 laterally divide the alternating stack (32, 46) of the insulating layers 32 and the electrically conductive layers 46 into multiple physically disjoined layer stacks. Specifically, each isolation trench 179' laterally divides the alternating stack (32, 46) into two physically disjoined layer stacks. Sidewalls of segments of at least two topmost electrically conductive layers 46 are physically exposed within each of the isolation cavities 179'. The conductive material layer 78L can be formed directly on the sidewalls of the segments of the at least two topmost electrically conductive layers 46 of the two physically disjoined layer stacks within each isolation cavity 179'.

The conductive material layer 78L includes a conductive material such as W, Co, Mo, Ru, Cu, Ti, Ta, conductive nitrides thereof, conductive alloys thereof, and/or combinations thereof (as in a layer stack). The conductive material layer 78L can be deposited by a conformal deposition method such as chemical vapor deposition. The thickness of the conductive material layer 78L can be selected such that vertical portions of the conductive material layer 78L do not merge in the isolation cavities 179'. In one embodiment, the thickness of the conductive material layer 78L can be in a range from 5% to 45% of the width of the isolation cavities 179'.

Figure 14A:
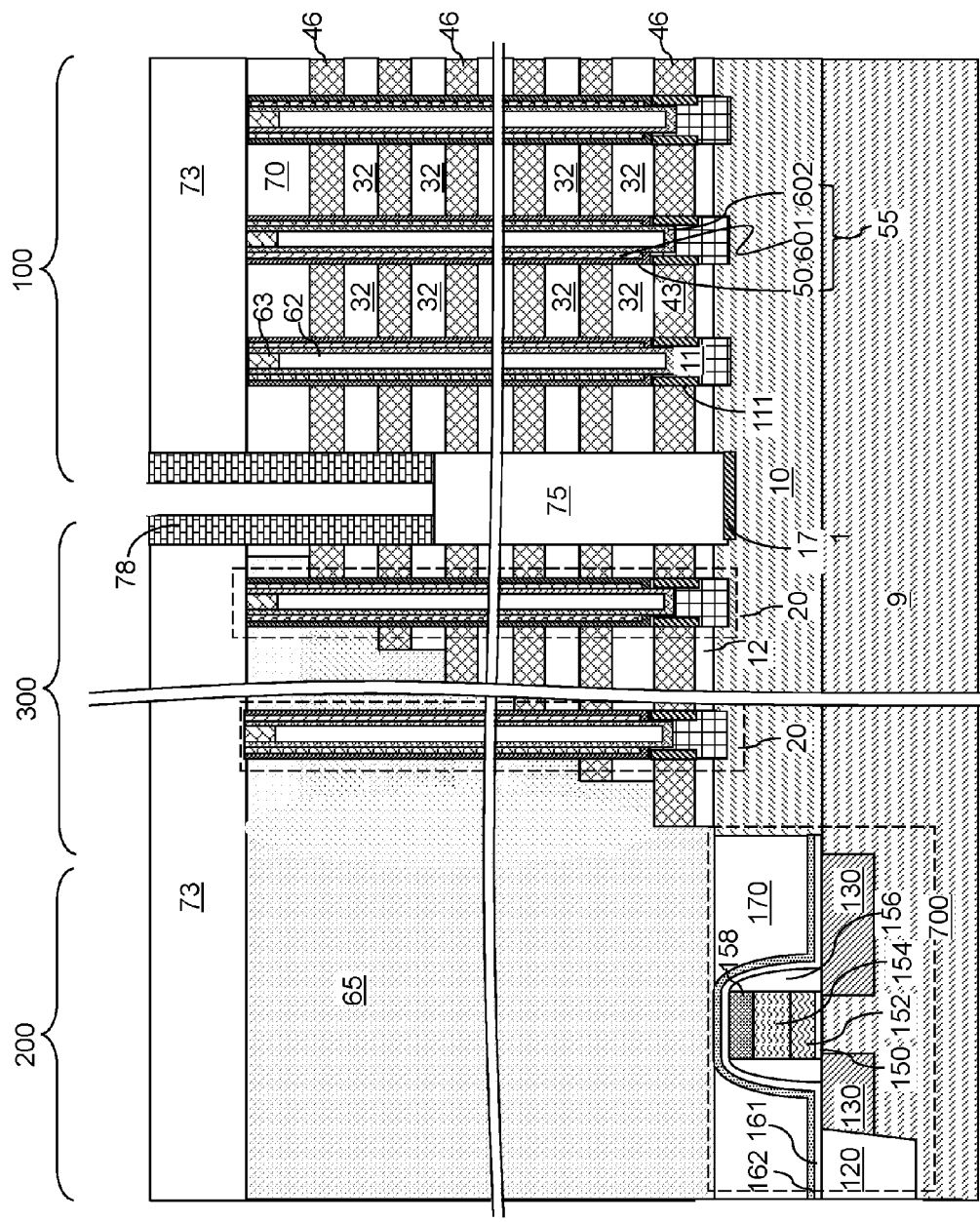
FIG. 14A is a schematic vertical cross-sectional view of the first exemplary structure after formation of two conductive rail structures within each recess region overlying a dielectric rail structure according to the first embodiment of the present disclosure.
Figure 14B:
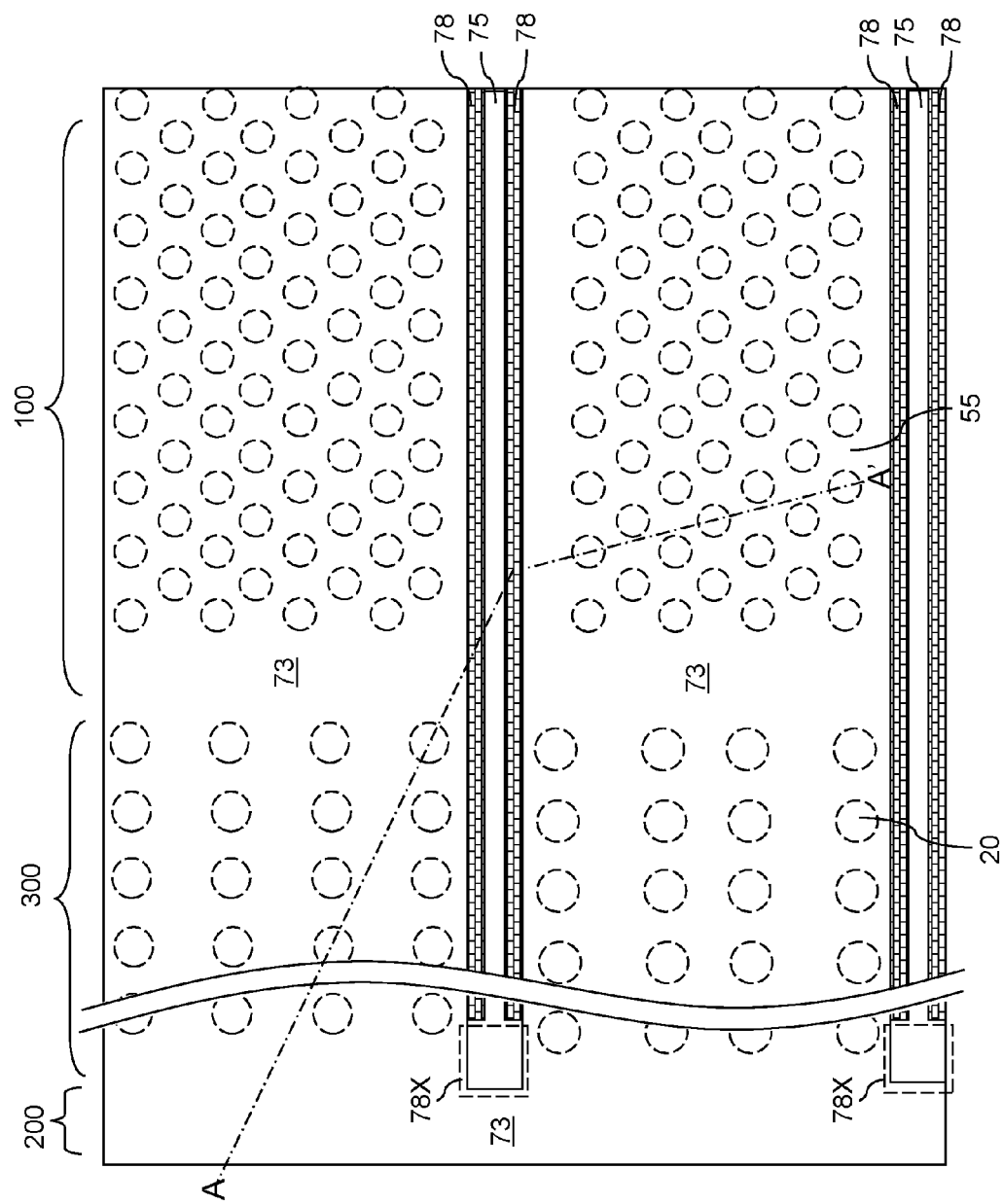
FIG. 14B is a partial see-through top-down view of the first exemplary structure of FIG. 14A. The vertical plane A-A' is the plane of the schematic vertical cross-sectional view of FIG. 14A.

Referring to FIGS. 14A and 14B, an anisotropic etch is performed to remove horizontal portions of the conductive material layer 78L. Each remaining portion of the conductive material layer 78L in an isolation trench 179 constitutes a generally ring-shaped conductive structure with a contiguous set of outer sidewalls that contact lengthwise sidewalls and widthwise sidewalls of the respective isolation trench 179. Each remaining horizontal portions of the conductive material layer 78L after the anisotropic etch includes two conductive rail structures that extend along the lengthwise direction of the respective isolation trench 179 and two widthwise portions that are located on the widthwise sidewalls of the isolation trench 179.

A photoresist layer (not shown) can be applied over the remaining portions of the conductive material layer and over the contact level dielectric layer 73, and can be lithographically patterned to form openings overlying end portions of each generally ring-shaped conductive structure. Each section of the generally ring-shaped conductive structure within the area of the openings in the photoresist layer can be removed, for example, by an isotropic etch. Two widthwise portions of each generally ring-shaped conductive structure (which are located within the two end portions 78X of a respective isolation trench 179), are removed by the isotropic etch. Each generally ring-shaped conductive structure is divided into two conductive rail structures 78 that are physically disjoined from each other. Two conductive rail structures 78 are formed within each recess region, i.e., within each isolation cavity 179', that overlies a dielectric rail structure 75. In one embodiment, the two conductive rail structures 78 can be formed directly on sidewalls of the at least two topmost electrically conductive layers 46 that are vertically coincident with a sidewall of each intervening insulating layer 32.

Two conductive rail structures 78 are formed on lengthwise sidewalls of each isolation trench 179. Each of the two conductive rail structures 78 is electrically shorted to segments of at least two topmost electrically conductive layers 46 (i.e., drain select gate electrodes, SGD) provided within a respective one of two physically disjoined layer stacks that are separated by the isolation trench 179. In one embodiment, the two conductive rail structures 78 can be formed directly on sidewalls of the at least two topmost electrically conductive layers 46 that are vertically coincident with a sidewall of one of the insulating layers 32 (i.e., an intervening insulating layer 32) that is physically exposed to the isolation trench 179. The photoresist layer can be subsequently removed, for example, by ashing. In one embodiment, each conductive rail structure 78 can have a uniform thickness throughout, which can be the thickness of the conductive material layer 78L as deposited.

Figure 15:
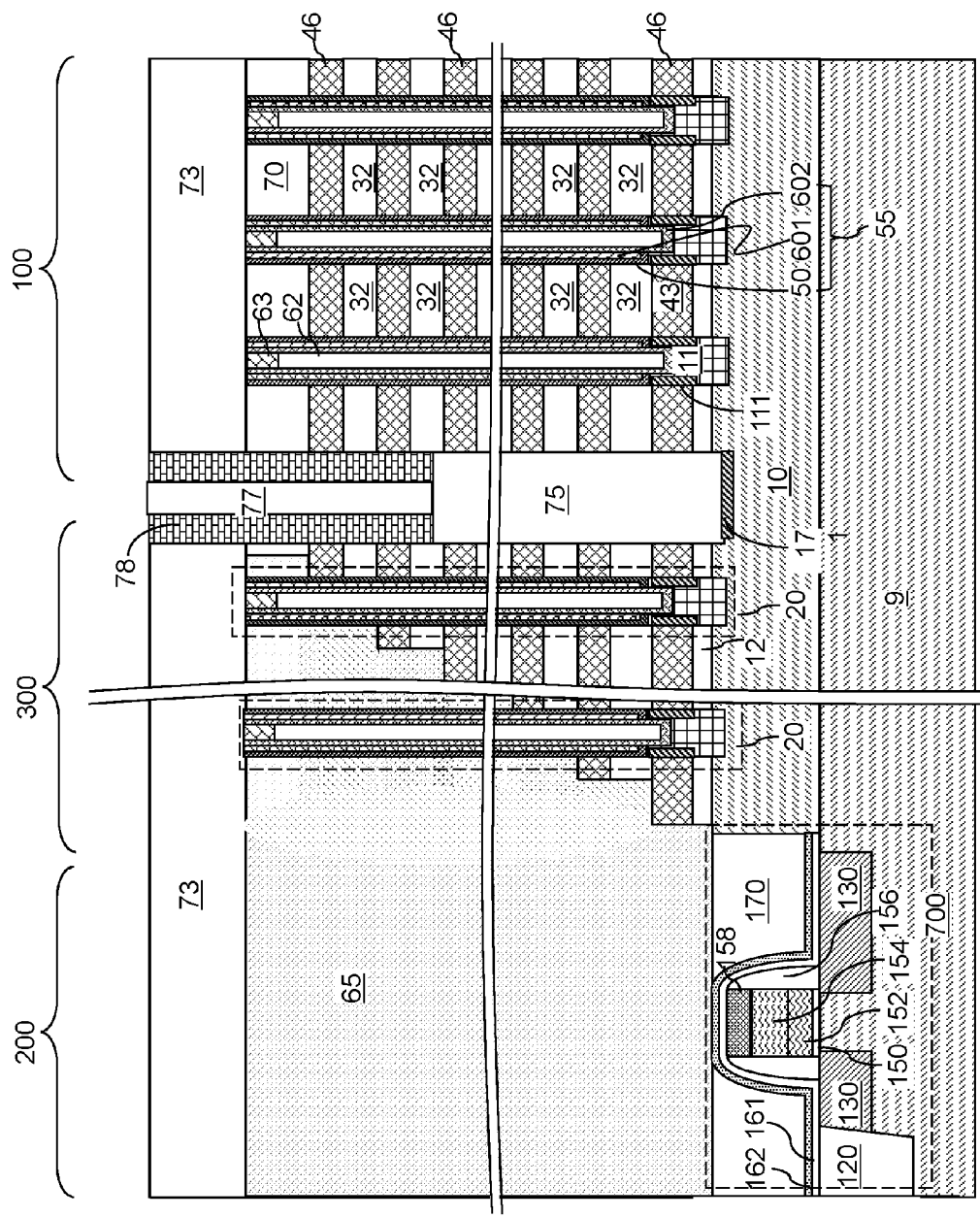
FIG. 15 is a schematic vertical cross-sectional view of the first exemplary structure after formation of a dielectric fill material portion within each recess region according to the first embodiment of the present disclosure.

Referring to FIG. 15, a dielectric material can be deposited within remaining unfilled volumes of the isolation trenches 179. Excess portions of the dielectric material may be removed from above the top surface of the contact level dielectric layer 73. A dielectric fill material portion 77 can be formed within each recess region between a pair of conductive rail structures 78. The dielectric fill material portion 77 can be formed on widthwise sidewalls of the isolation trench 179 and inner sidewalls of the two conductive rail structures 78.

Figure 16B:
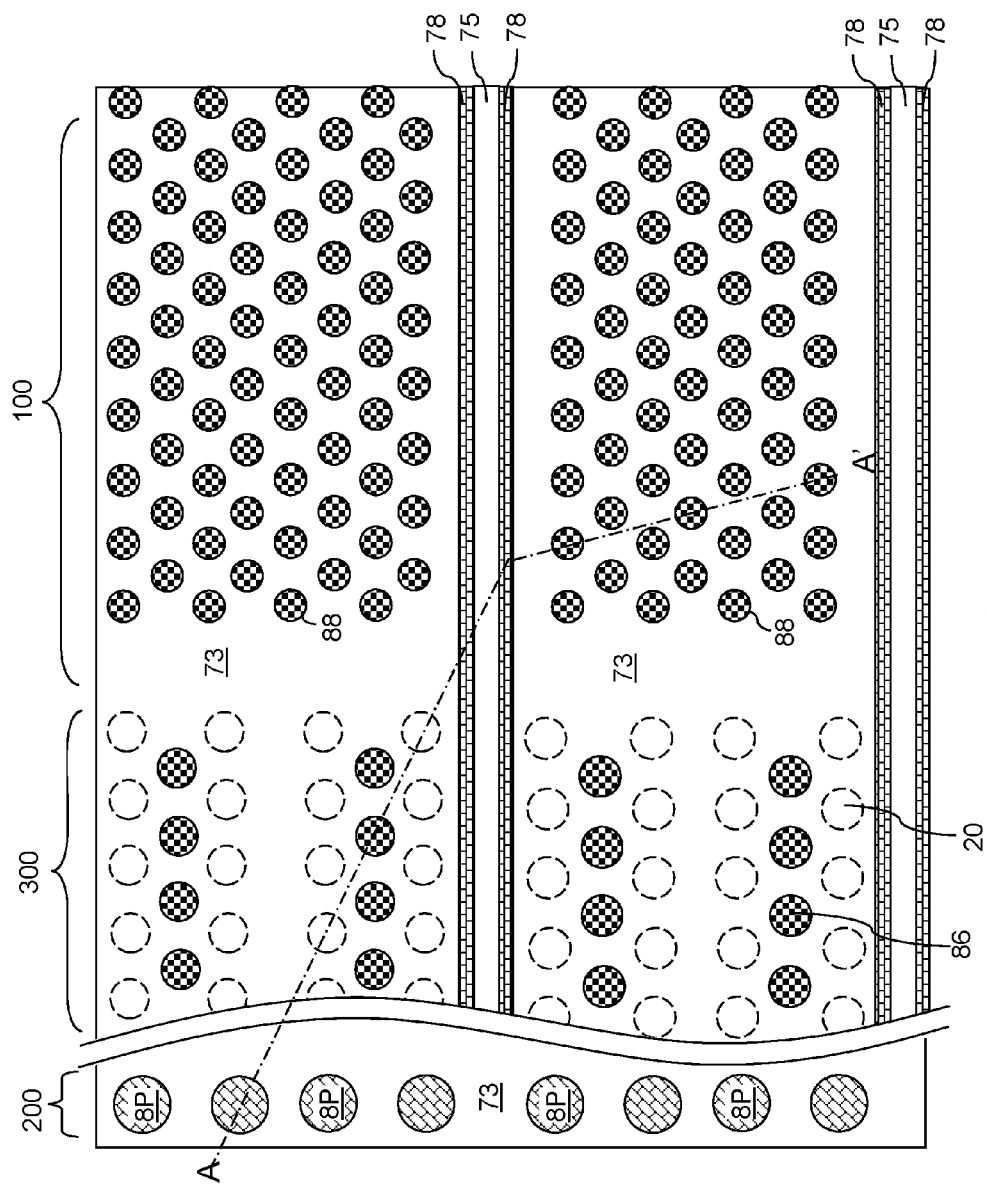
FIG. 16B is a top-down view of the first exemplary structure of FIG. 16A. The vertical plane A-A' is the plane of the schematic vertical cross-sectional view of FIG. 16A.

Referring to FIGS. 16A and 16B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. In a subsequent step, a bit line is electrically connected to each drain region 63 which contacts the memory stack structure 55, but not to the dummy drain regions 63 of the support pillar structures 20. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 17:
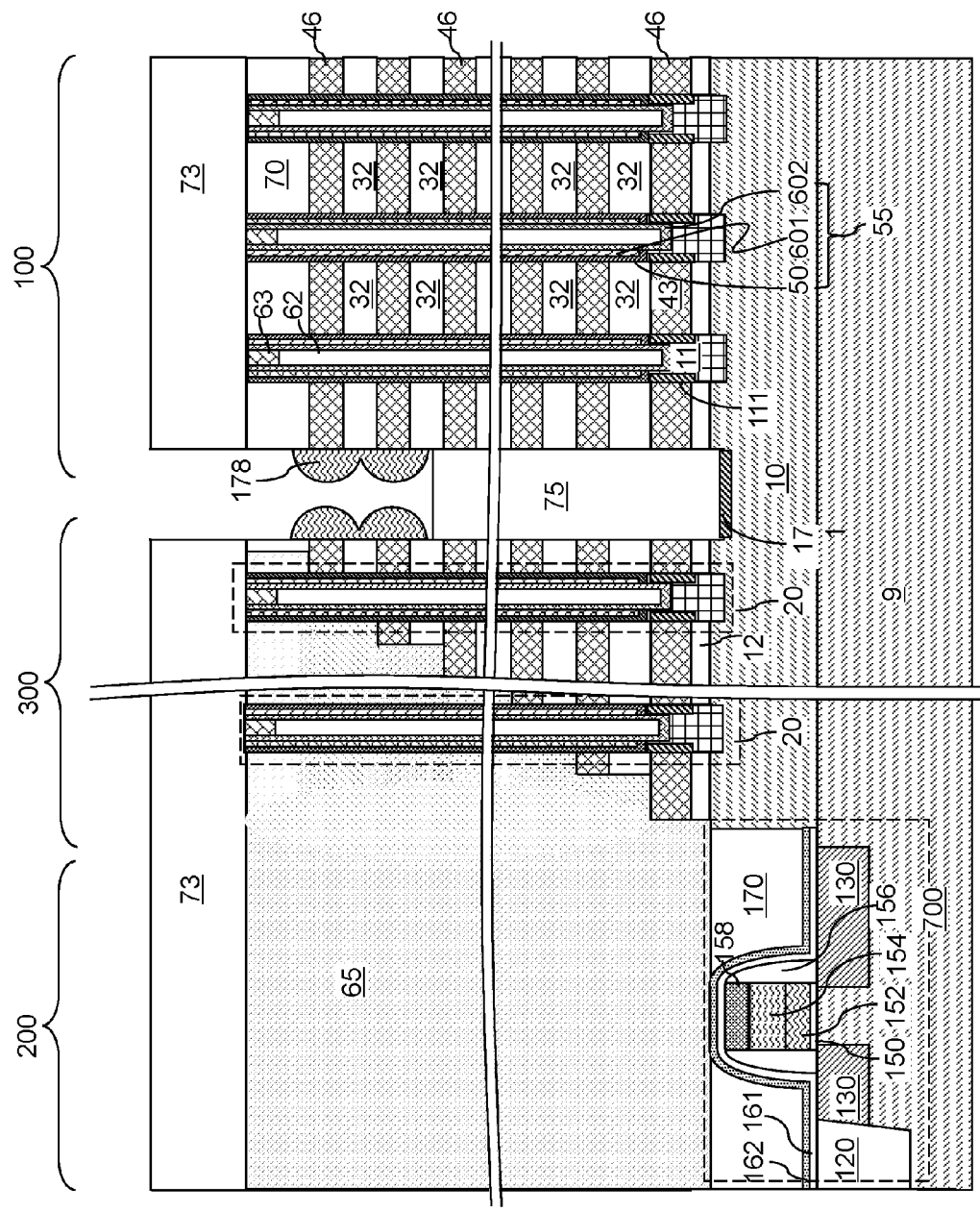
FIG. 17 is a schematic vertical cross-sectional view of a first alternative embodiment of the first exemplary structure after formation of two conductive rail structures within each recess region overlying a dielectric rail structure according to the first embodiment of the present disclosure.

Referring to FIG. 17, a first alternative embodiment of the first exemplary structure can be derived from the first exemplary structure of FIG. 12 by forming two conductive rail structures 178 within each recess region, i.e., within each isolation cavity 179', overlying a dielectric rail structure 75. The two conductive rail structures 178 within each isolation cavity 179' can be formed by selectively depositing a conductive material on physically exposed sidewalls of the segments of the at least two topmost electrically conductive layers 46 of the two physically disjoined layer stacks, while preventing growth of the conductive material from physically exposed surfaces of insulating material portions such as the physically exposed surfaces of the insulating layers 32, the retro-stepped dielectric material portion 65, and the contact level dielectric layer 73.

The conductive rail structures 178 include a metallic material that can be deposited selectively on metallic surface while not growing from insulator surfaces. For example, the conductive rail structures 178 can include cobalt, ruthenium, tungsten, or combinations thereof. Initially, the conductive material of the conductive rail structures 178 nucleate on the sidewalls of the electrically conductive layers 46 that are physically exposed in the isolation trenches 179' to form discrete conductive material portions that laterally extend along the lengthwise direction within each isolation trench 179, and does not nucleate on the physically exposed sidewalls of the insulating layer(s) 32 and the contact level dielectric layer 73 that are physically exposed in the isolation trenches 179'. As additional conductive material accumulates on the discrete conductive material portions, each vertically neighboring pair of discrete conductive material portions merge to form a respective conductive rail structure 178. The conductive rail structures 178 can have the same composition as, or a different composition from, the conductive material of the electrically conductive layers 46.

In one embodiment, each of the two conductive rail structures 178 can have a variable thickness that has local maxima at levels of the at least two topmost electrically conductive layers 46 and has at least one local minimum at each level of an insulating layer 32 within the set of layers including the at least two topmost electrically conductive layers 46. In one embodiment, the two conductive rail structures 178 can comprise a different conductive material than the electrically conductive layers 46. In one embodiment, the two conductive rail structures 178 can be formed directly on sidewalls of the at least two topmost electrically conductive layers 46 that are vertically coincident with a sidewall of one of the insulating layers 32 that is physically exposed to the isolation trench 179 prior to formation of the conductive rail structures 178.

Figure 18:
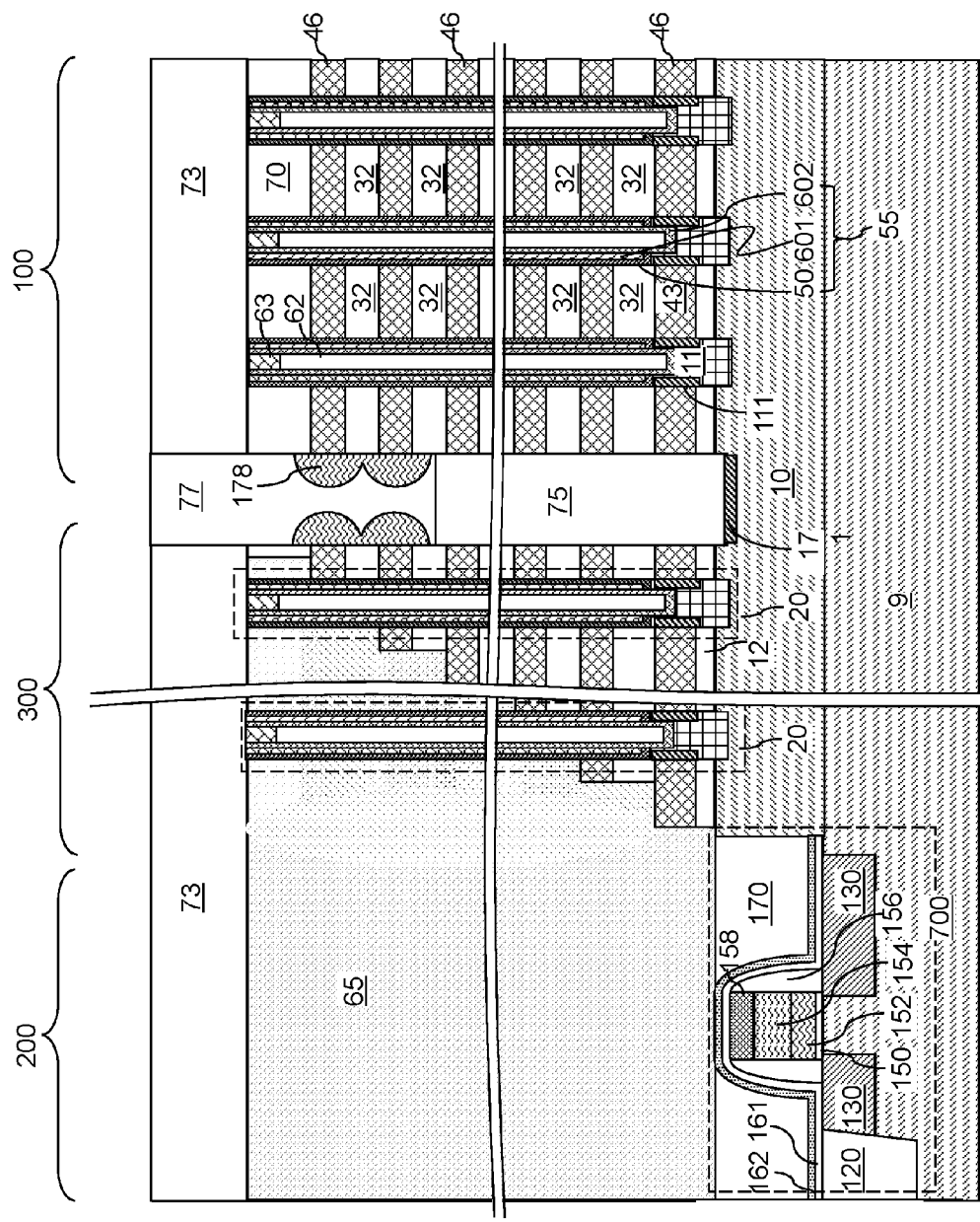
FIG. 18 is a schematic vertical cross-sectional view of the first alternative embodiment of the first exemplary structure after formation of a dielectric fill material portion within each recess region according to the first embodiment of the present disclosure.

Referring to FIG. 18, a dielectric material can be deposited in each unfilled volume of the isolation trenches 179 to form dielectric fill material portions 77 within each recess, i.e., within each isolation cavity. Subsequently, the processing steps of FIGS. 16A and 16B can be performed to form various contact via structures (86, 88, 8P).

Figure 19:
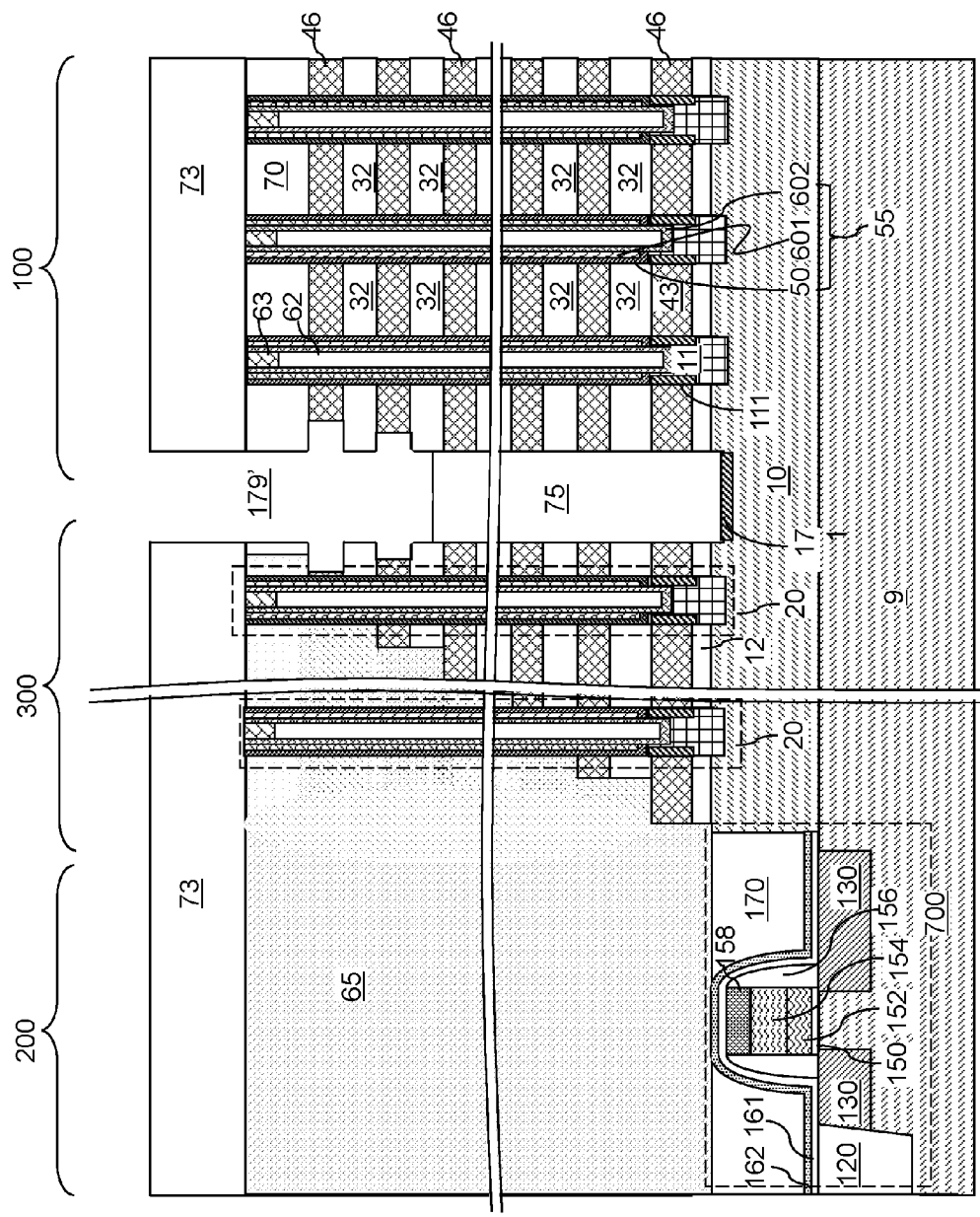
FIG. 19 is a schematic vertical cross-sectional view of a second alternative embodiment of the first exemplary structure after vertically recessing the dielectric rail structures and laterally recessing at least two topmost electrically conductive layers according to the first embodiment of the present disclosure.

Referring to FIG. 19, a second alternative embodiment of the first exemplary structure can be derived from the first exemplary structure of FIG. 11 by vertically recessing top surfaces of the dielectric rail structures 75 to form isolation cavities 179' while collaterally laterally recessing a subset of the electrically conductive layers 46 that are physically exposed to the isolation cavities 179'. In this case, the etch chemistry employed at the processing steps of FIG. 12 can be modified to induce collateral etching of the physically exposed portions of the electrically conductive layers 46. The vertical recessing of the top surfaces of the dielectric rail structures 75 may be performed by an isotropic etch or an anisotropic etch. Alternatively, recessing of the top surfaces of the dielectric rail structures 75 can be performed in a first etching step, and the recessing of the physically exposed portions of the electrically conductive layers 46 can be performed in a subsequent second etching step which can use an etching medium which selectively etches the electrically conductive layers 46 which can be different from the etching medium used in the first etching step.

Figure 20:
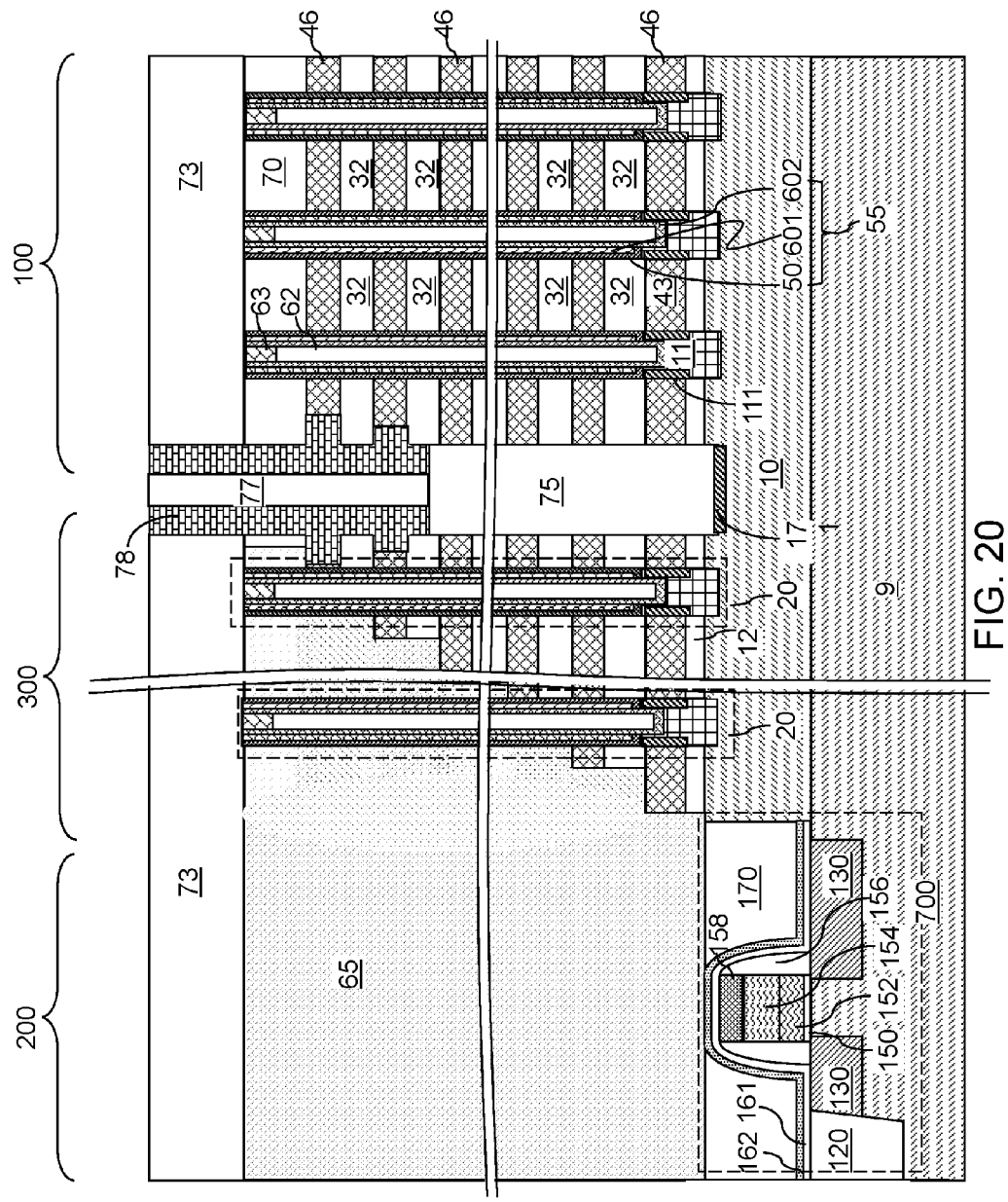
FIG. 20 is a schematic vertical cross-sectional view of the second alternative embodiment of the first exemplary structure after forming two conductive rail structures and a dielectric fill material portion within each recess region according to the first embodiment of the present disclosure.

Referring to FIG. 20, the processing steps of FIGS. 13, 14A-14B, and 15 can be performed to form two conductive rail structures 78 and a dielectric fill material portion 77 within each recess region of the isolation trenches 179. The conductive rail structures 78 can be formed by depositing a conductive material layer 78L in the isolation trenches 179 and directly on sidewalls of the segments of the at least two topmost electrically conductive layers 46 of the two physically disjoined layer stacks employing the processing steps of FIG. 13, and by removing horizontal portions of the conductive material layer 78L by an anisotropic etch employing the processing steps of FIGS. 14A and 14B.

Remaining vertical portions of the conductive material layer 78L within each isolation trench 179 comprise the two conductive rail structures 78 and two widthwise portions of a generally ring-shaped conductive structure. The widthwise portions are removed by the isotropic etch through a patterned photoresist layer that includes openings within each end portions 78X of the isolation trenches 179. Each generally ring-shaped conductive structure is divided into two conductive rail structures 78 that are physically disjoined from each other. Two conductive rail structures 78 are formed within each recess region, i.e., within each isolation cavity 179', that overlies a dielectric rail structure 75. In one embodiment, the two conductive rail structures 78 within each isolation trench 179 can be formed directly on sidewalls of the at least two topmost electrically conductive layers 46 that are laterally offset, i.e., laterally recessed, with a sidewall of one of the insulating layers 32 that is physically exposed to the isolation trench 179. The dielectric fill material portions 77 are formed within remaining volumes of the isolation cavities 179. Subsequently, the processing steps of FIGS. 16A and 16B can be performed.

Figure 21:
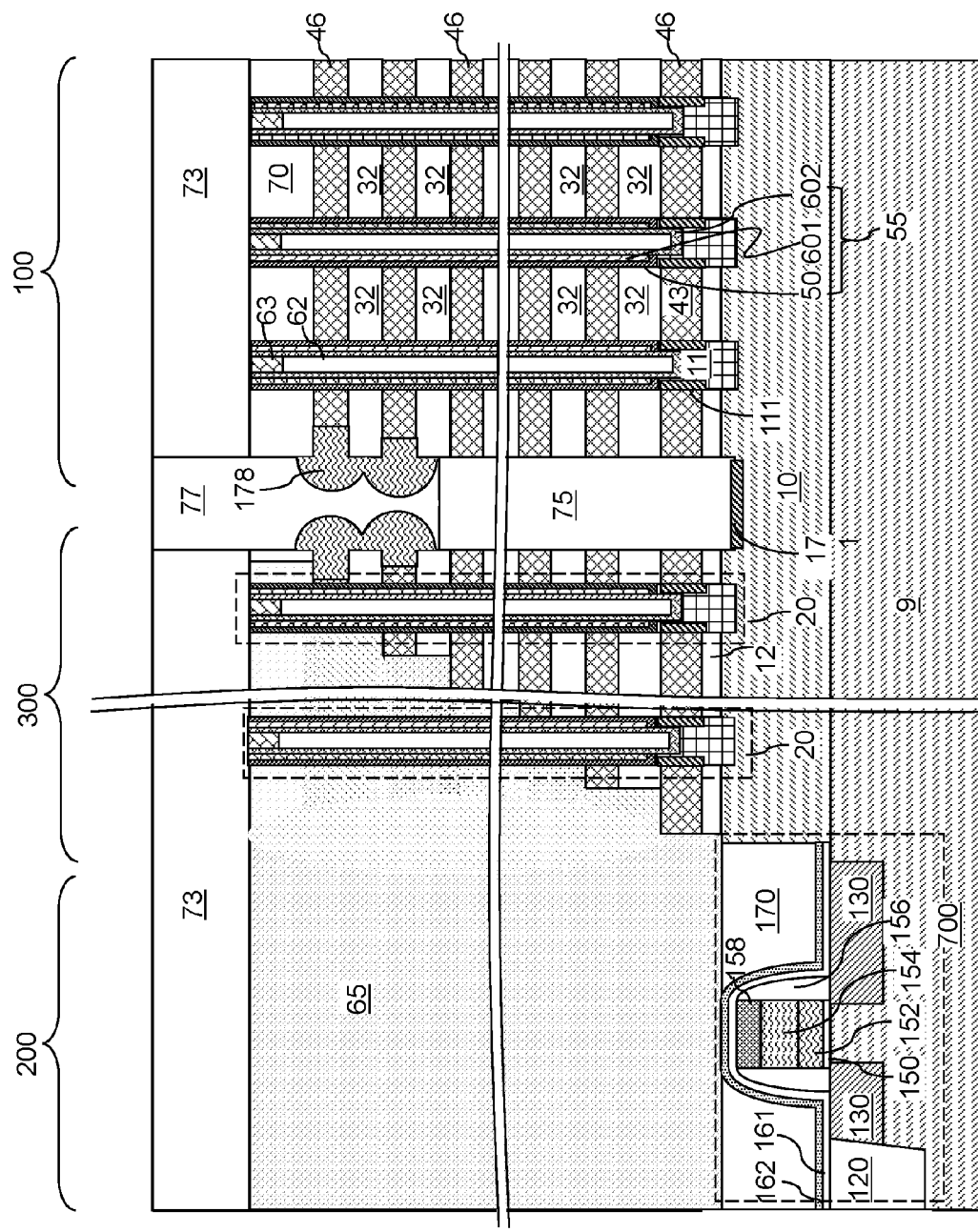
FIG. 21 is a schematic vertical cross-sectional view of a third alternative embodiment of the first exemplary structure after forming two conductive rail structures and a dielectric fill material portion within each recess region according to the first embodiment of the present disclosure.

Referring to FIG. 21, a third alternative embodiment of the first exemplary structure can be derived from the structure illustrated in FIG. 19 by performing the processing steps of FIG. 17 in lieu of the processing steps of FIGS. 13 and 14A-14B. Subsequently, the processing steps of FIG. 15 can be performed to provide the structure illustrated in FIG. 21. Subsequently, the processing steps of FIGS. 16A and 16B can be performed.

Figure 22:
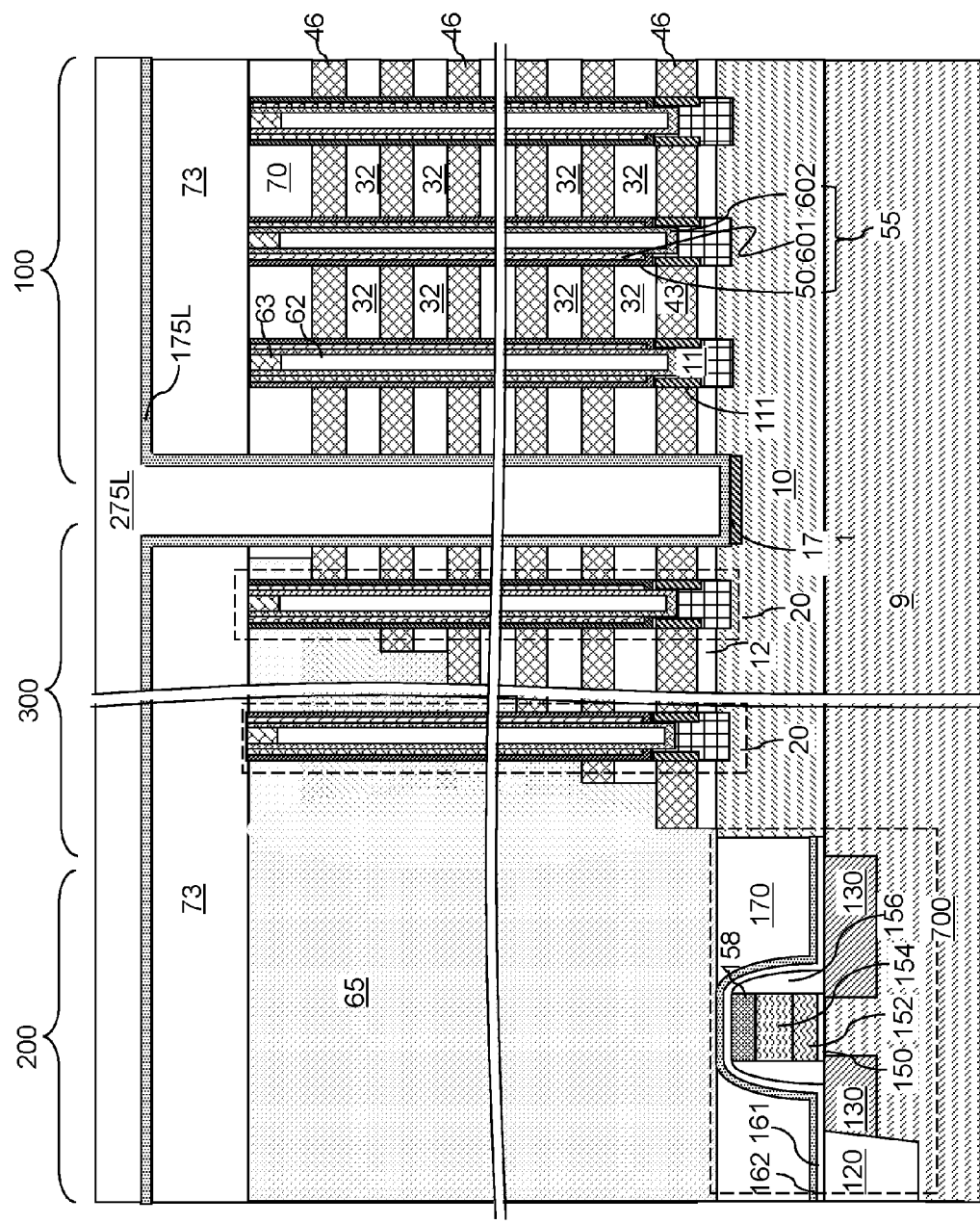
FIG. 22 is a schematic vertical cross-sectional view of a fourth alternative embodiment of the first exemplary structure after formation of first and second dielectric rail material layers according to the first embodiment of the present disclosure.

Referring to FIG. 22, a fourth alternative embodiment of the first exemplary structure can be derived from the first exemplary structure of FIG. 10 by depositing a first dielectric material layer 175L and a second dielectric material layer 275L to fill the isolation trenches 179. In one embodiment, the materials of the first dielectric material layer 175L and the second dielectric material layer 275L can be selected such that the first dielectric material layer 175L is more resistant than the second dielectric material layer 275L to an etch chemistry to be employed to remove the second dielectric material layer 275L. In one embodiment, the first dielectric material layer 175L can include silicon nitride or a dielectric metal oxide (such as aluminum oxide), the second dielectric material layer 275L can include a silicon oxide-based dielectric material (such as doped silicate glass, undoped silicate glass, or organosilicate glass).

Figure 23:
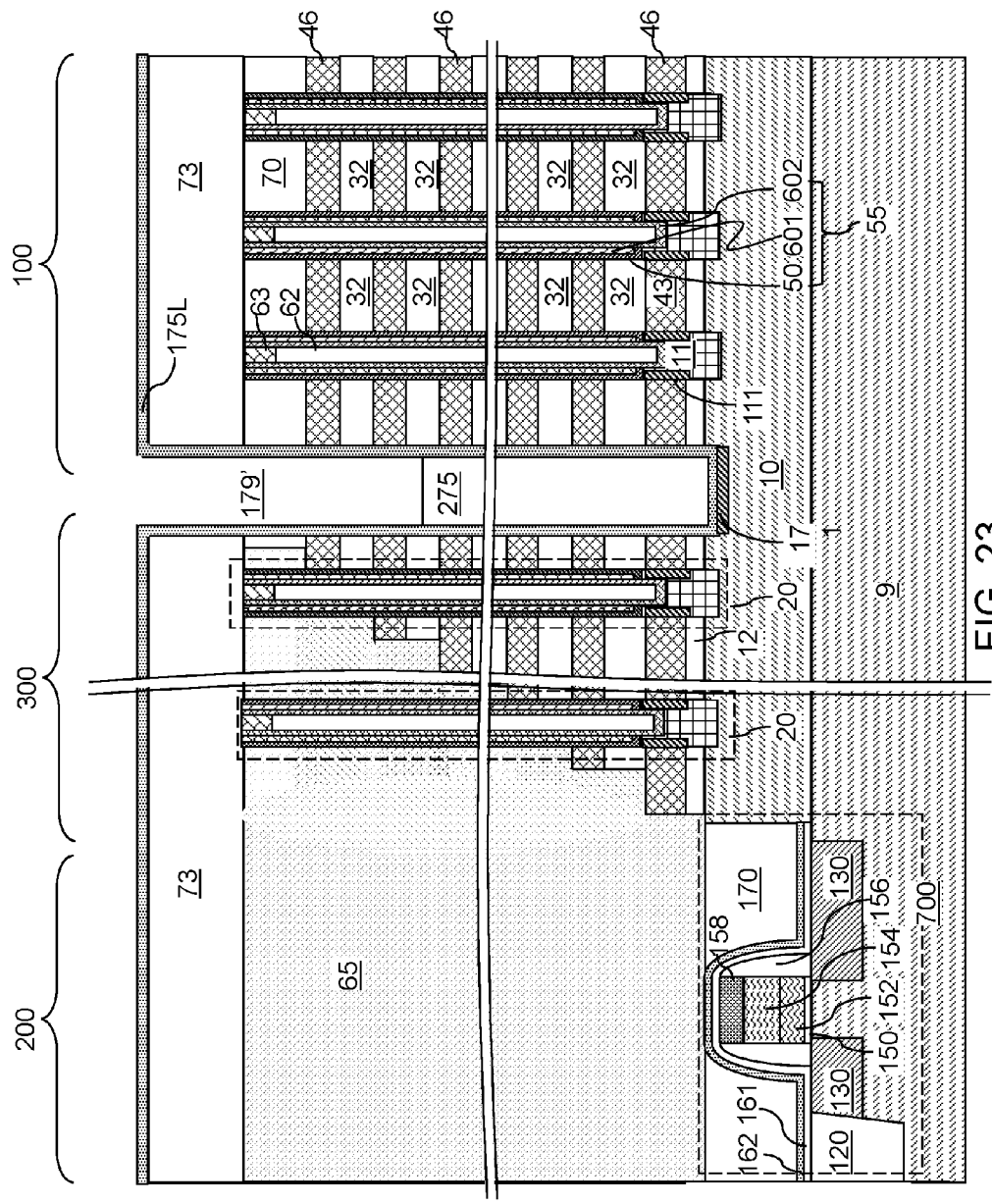
FIG. 23 is a schematic vertical cross-sectional view of the fourth alternative embodiment of the first exemplary structure after recessing the second dielectric rail material layer according to the first embodiment of the present disclosure.

Referring to FIG. 23, the second dielectric material layer 275L can be etched selective to the first dielectric material layer 175L by an etch process, which can include an isotropic etch process and/or an anisotropic etch process. For example, if the second dielectric material layer 275L includes a silicon oxide-based dielectric material, a wet etch employing hydrofluoric acid can be employed to etch portions of the second dielectric material layer 275L while not etching the first dielectric material layer 175L. The dielectric material of the second dielectric material layer 275 can be recessed to form discrete dielectric material portions, which are herein referred to as a dielectric rail fill portions 275. An isolation cavity 179' is formed above each dielectric rail fill portion 275. The depth of recess is selected such that the bottom surface of each isolation cavity 179' is located at the level of an insulating layer 32 that is between the topmost control gate electrode level and the bottommost drain select gate level, i.e., between the electrically conductive layer 46 that functions as the topmost control gate electrode and the electrically conductive layer 46 that functions as the bottommost layer of a drain select gate electrode. Each isolation cavity 179' can be laterally surrounded by vertical portions of the first dielectric material layer 175L.

Figure 24:
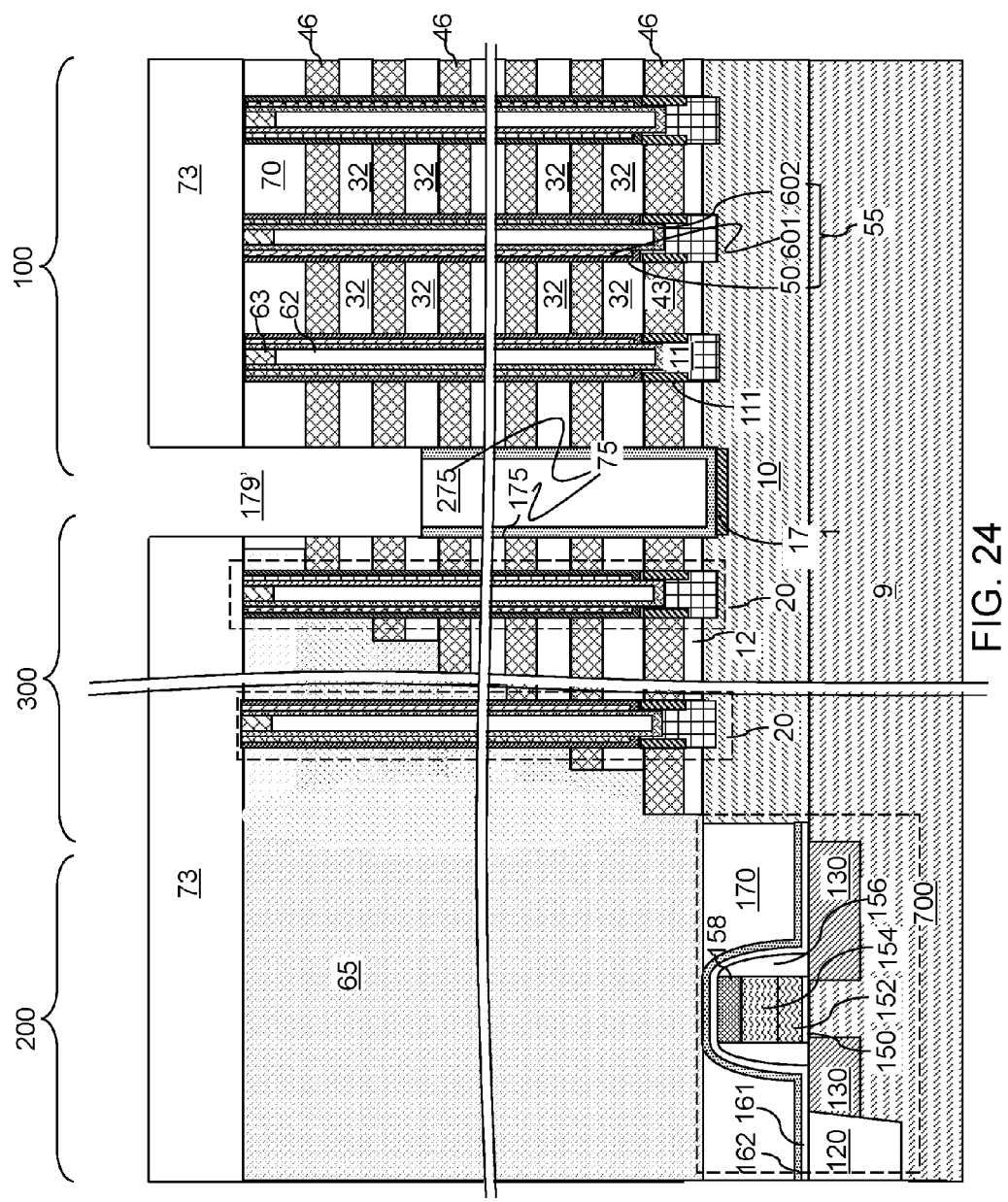
FIG. 24 is a schematic vertical cross-sectional view of the fourth alternative embodiment of the first exemplary structure after formation of a dielectric rail structure in each isolation trench according to the first embodiment of the present disclosure.

Referring to FIG. 24, physically exposed portions of the first dielectric material layer 175L can be etched by an isotropic etch, which may, or may not, be selective to the material of the dielectric rail fill portions 275. Each remaining portion of the first dielectric material layer 175L constitutes a dielectric rail liner 175. Each adjoining pair of a dielectric rail liner 175 and a dielectric rail fill portion 275 constitutes a dielectric rail structure 75. Each dielectric rail structure 75 can be formed by filling multiple dielectric materials in the isolation trenches 179 up to the top peripheries of the isolation trenches 179, and vertically recessing top portions of the multiple dielectric materials. Each dielectric rail structure 75 laterally extends along the horizontal direction at a lower portion of a respective isolation trench 179 and is located directly on the substrate (9, 10).

Figure 25:
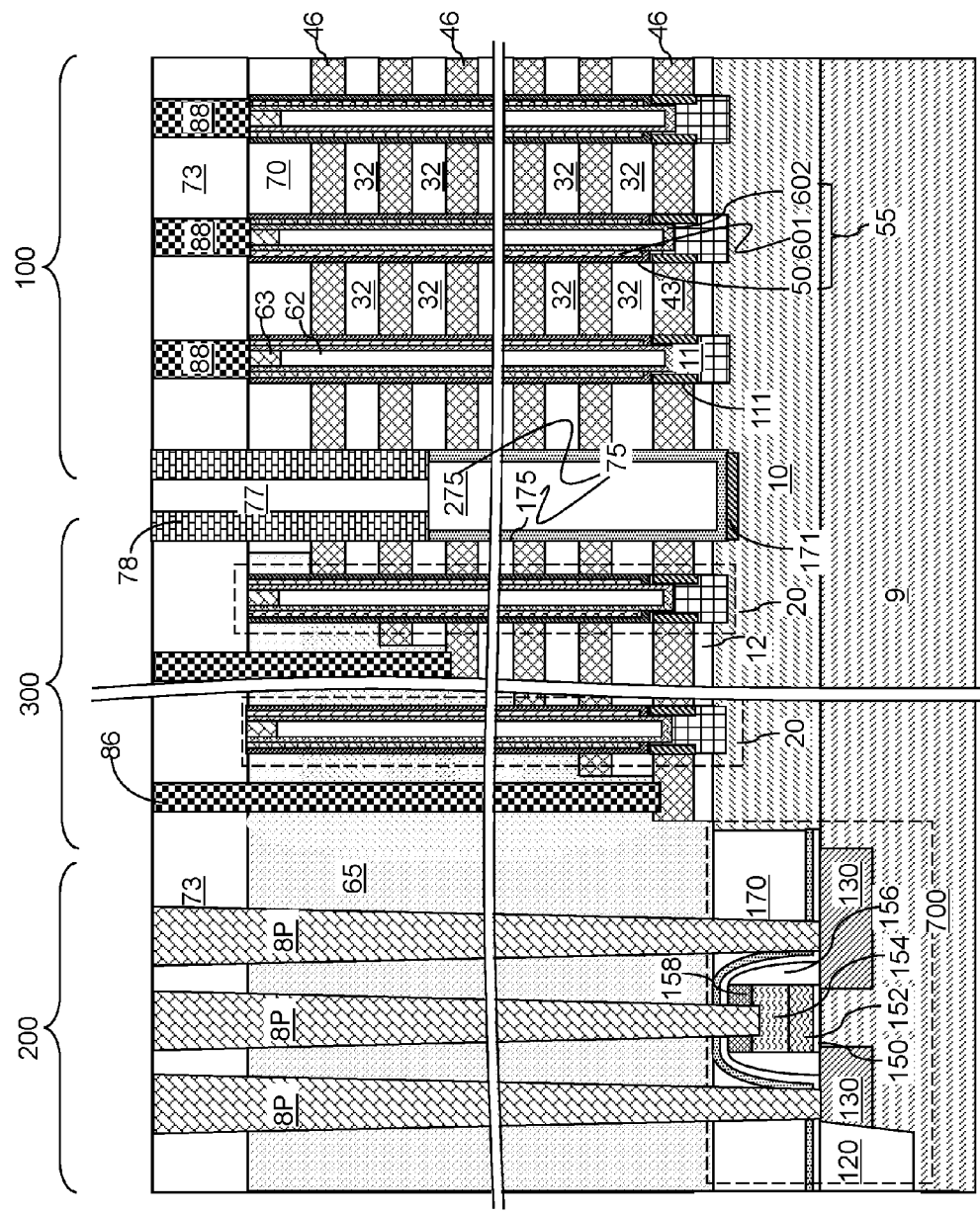
FIG. 25 is a schematic vertical cross-sectional view of the fourth alternative embodiment of the first exemplary structure after formation of conductive rail structures and contact via structures according to the first embodiment of the present disclosure.

Referring to FIG. 25, the processing steps of FIGS. 13, 14A-14B, and 15 can be performed to form conductive rail structures 78 and dielectric fill material portions 77. Subsequently, the processing steps of FIGS. 16A and 16B can be performed to form various contact via structures (86, 88, 8P).

Figure 26:
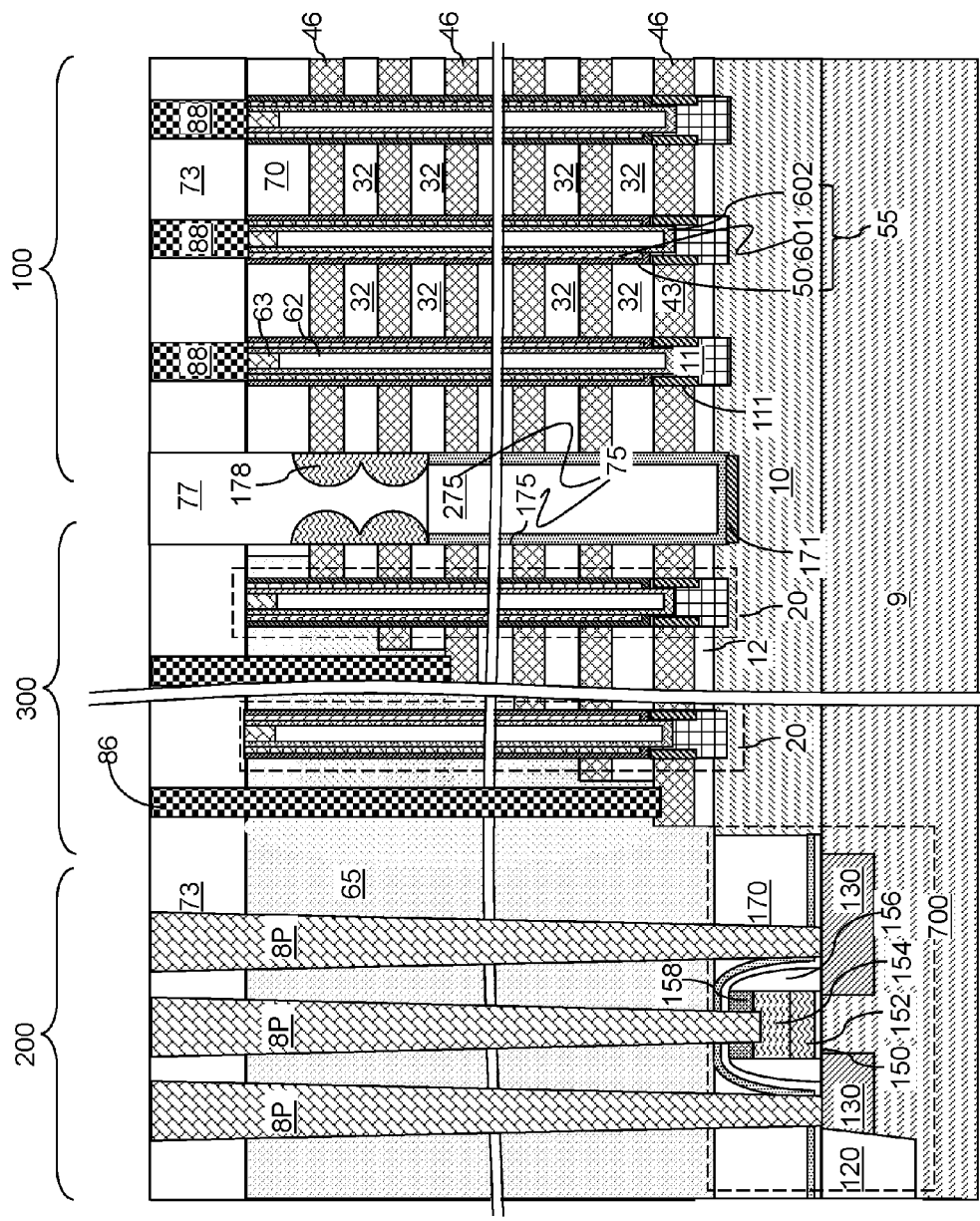
FIG. 26 is a schematic vertical cross-sectional view of a fifth alternative embodiment of the first exemplary structure after formation of conductive rail structures and contact via structures according to the first embodiment of the present disclosure.

Referring to FIG. 26, a fifth alternative embodiment of the first exemplary structure can be derived from the fourth alternative embodiment of the first exemplary structure by employing the processing steps of FIG. 17 in lieu of the processing steps of FIGS. 13 and 14A-14B to form the conductive rail structures 178.

Figure 27:
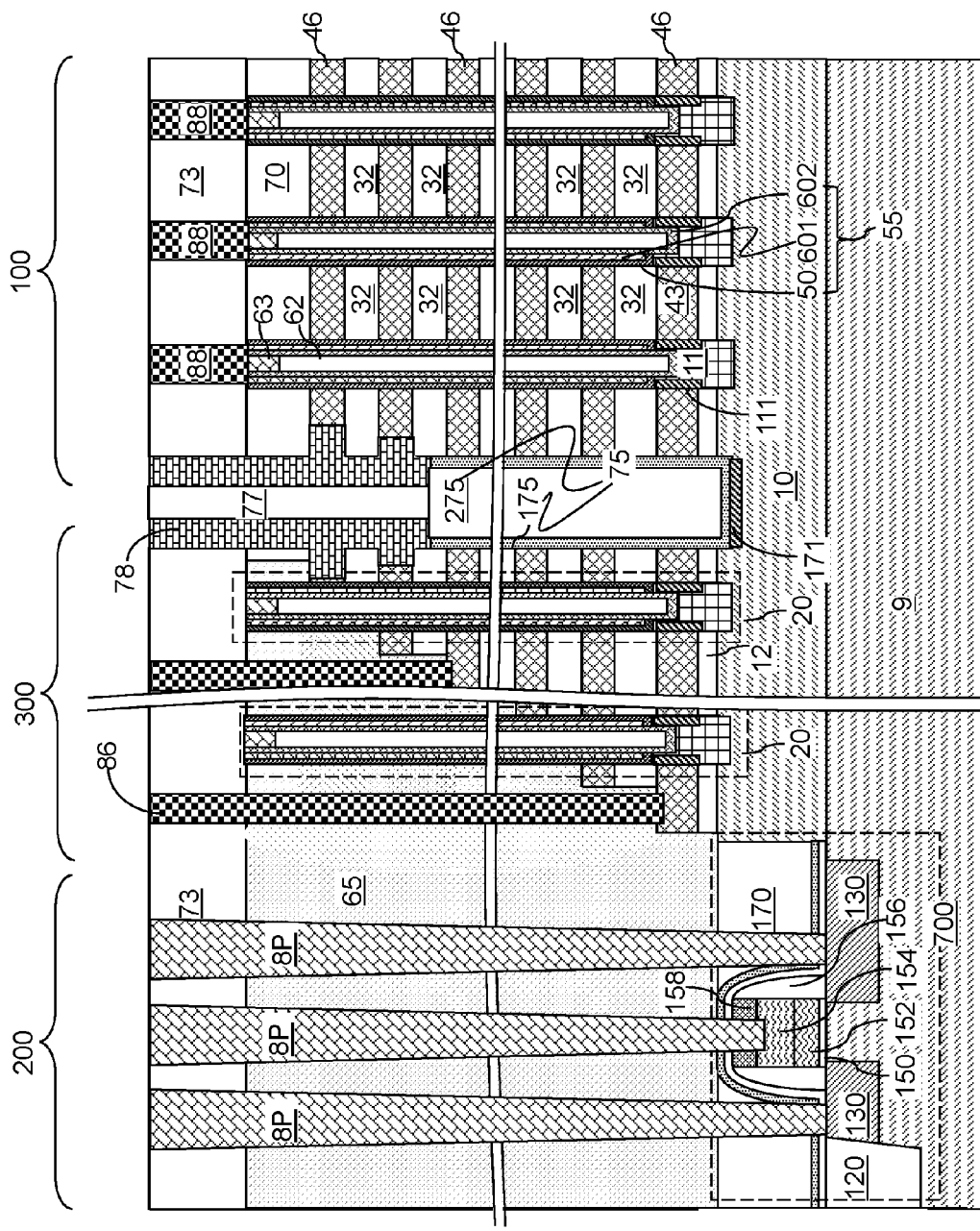
FIG. 27 is a schematic vertical cross-sectional view of a sixth alternative embodiment of the first exemplary structure after formation of conductive rail structures and contact via structures according to the first embodiment of the present disclosure.

Referring to FIG. 27, a sixth alternative embodiment of the first exemplary structure can be derived from the fourth alternative embodiment of the first exemplary structure by employing the processing steps of the second embodiment of the first exemplary structure to form the conductive rail structures 78.

Figure 28:
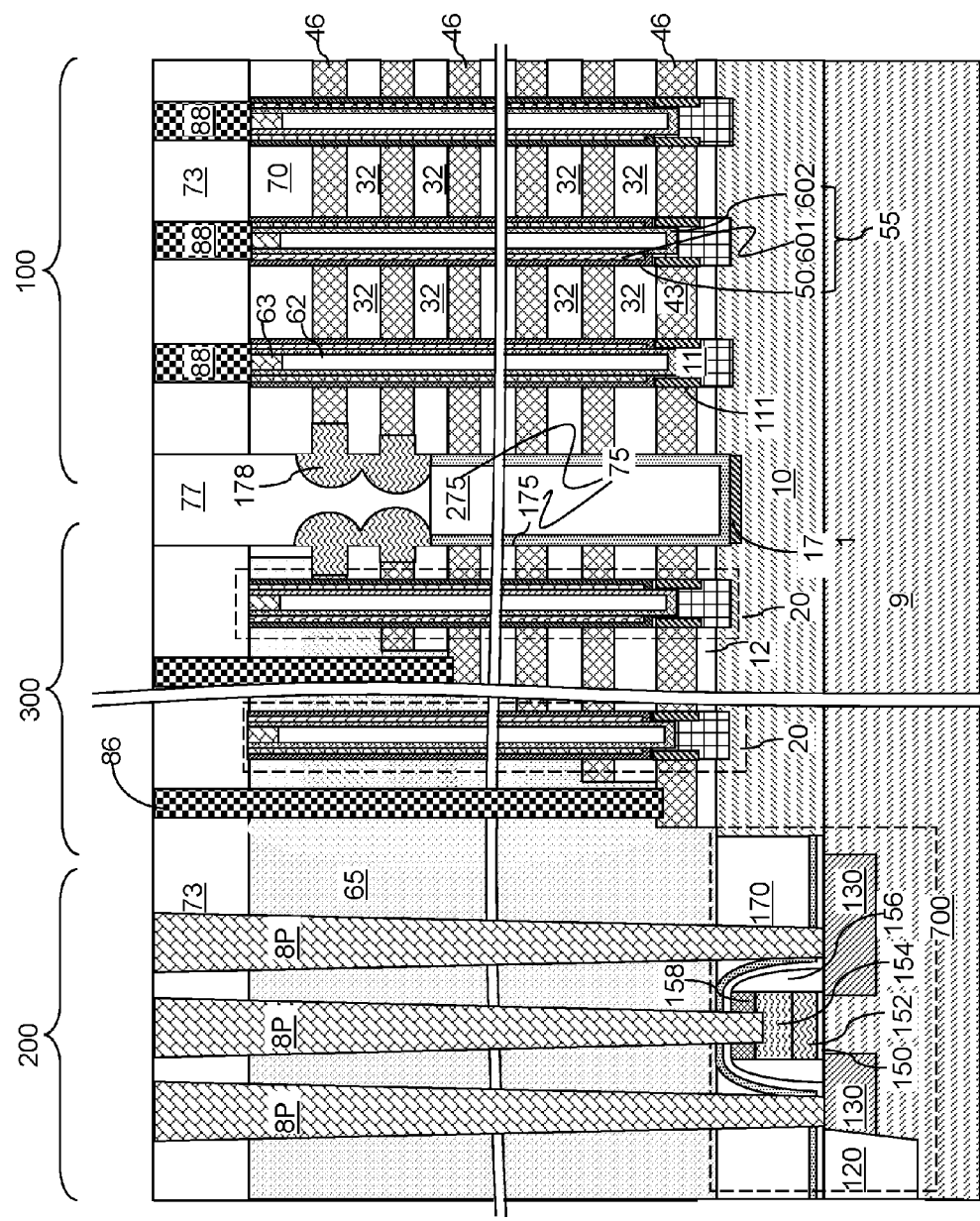
FIG. 28 is a schematic vertical cross-sectional view of a seventh alternative embodiment of the first exemplary structure after formation of conductive rail structures and contact via structures according to the first embodiment of the present disclosure.

Referring to FIG. 28, a seventh alternative embodiment of the first exemplary structure can be derived from the fourth alternative embodiment of the first exemplary structure by employing the processing steps of the third embodiment of the first exemplary structure to form the conductive rail structures 178.

Figure 29A:
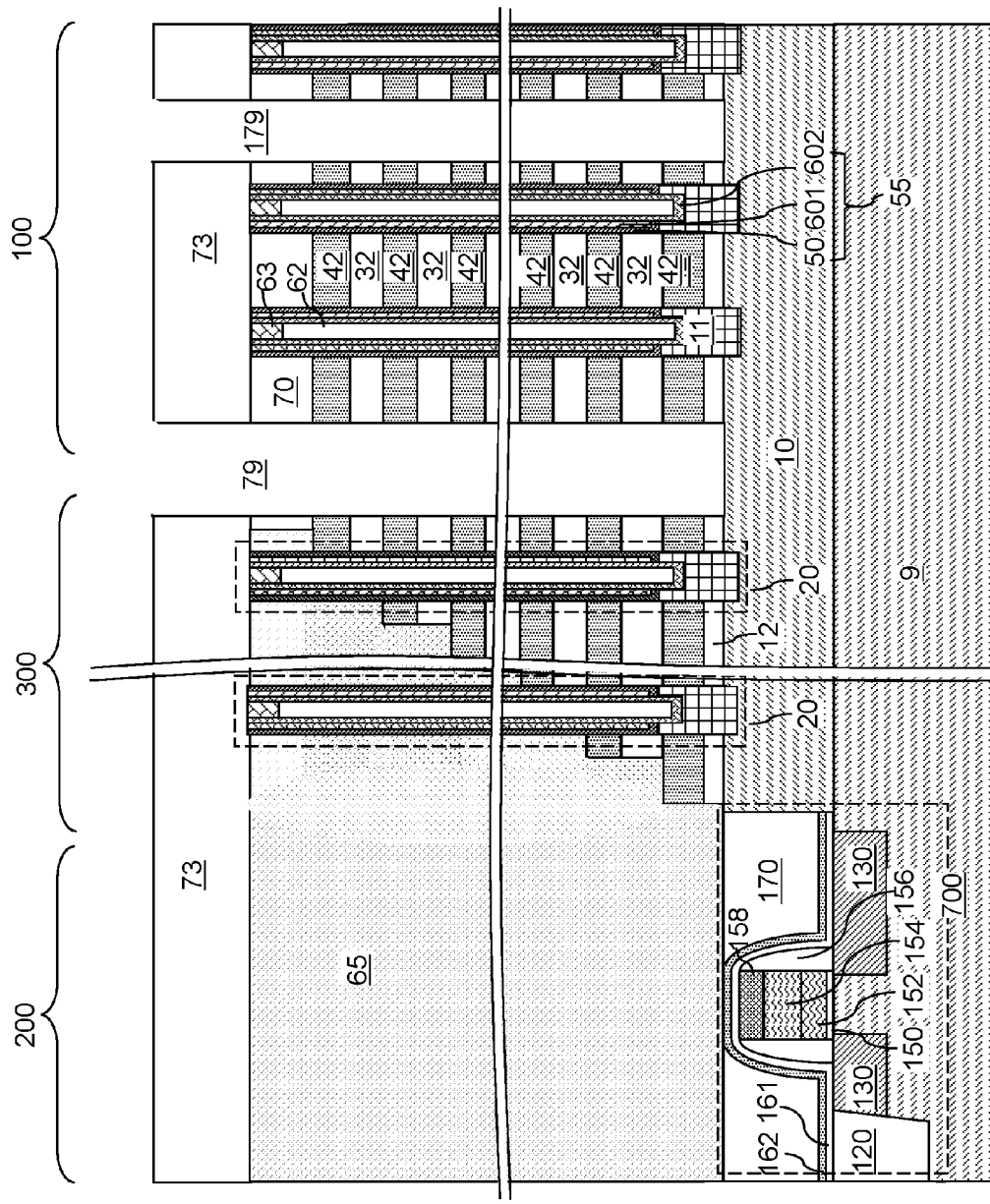
FIG. 29A is a schematic vertical cross-sectional view of a second exemplary structure after formation of backside trenches and isolation trenches according to a second embodiment of the present disclosure.
Figure 29B:
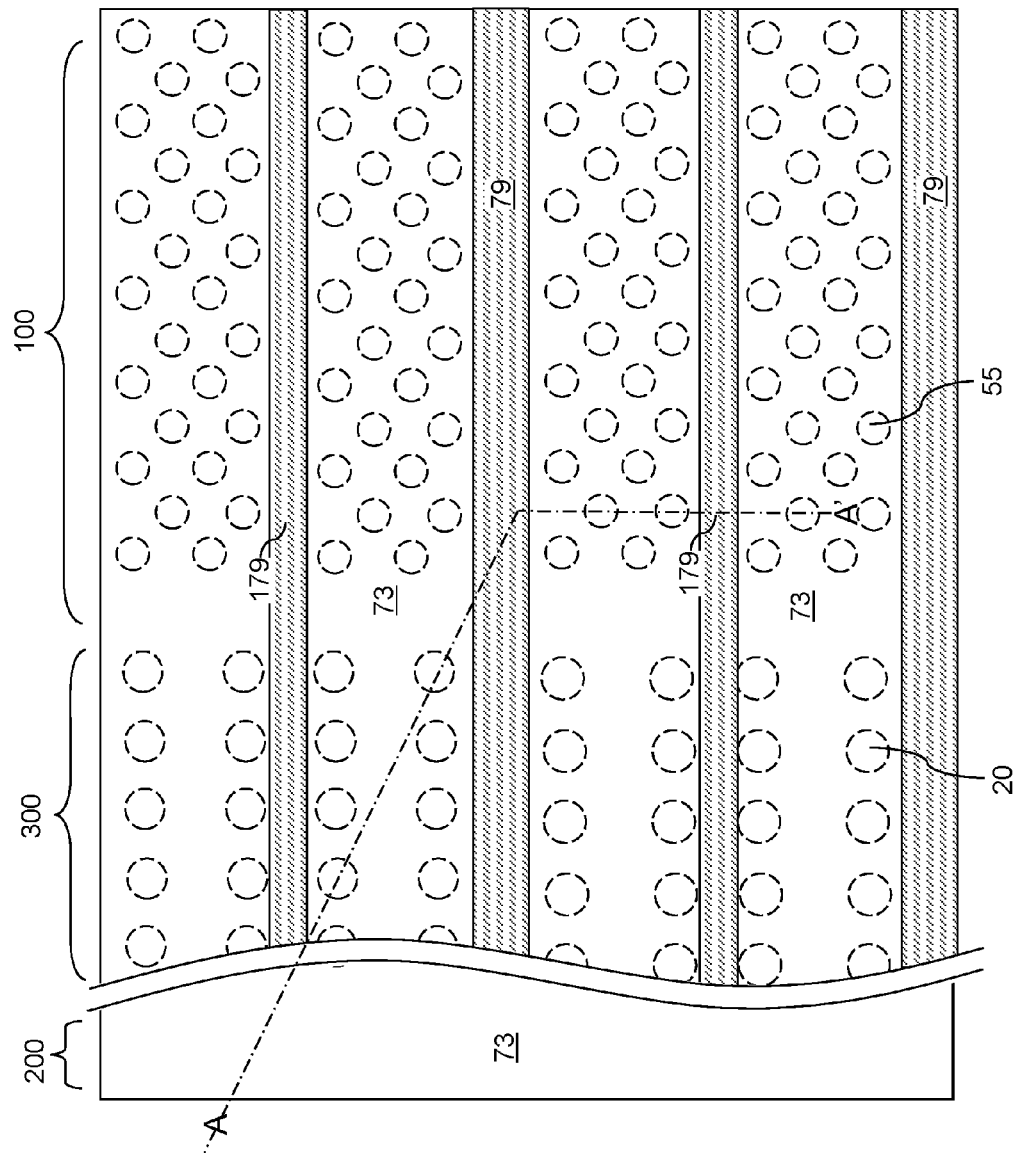
FIG. 29B is a partial see-through top-down view of the second exemplary structure of FIG. 29A. The vertical plane A-A' is the plane of the schematic vertical cross-sectional view of FIG. 29A.

The first exemplary structure illustrated in FIGS. 7A to 28 can include a buried source line (e.g., a horizontal source electrode located under the alternating stack (32, 46)) FIGS. 29A and 29B illustrate a second exemplary structure according to a second embodiment of the present disclosure which contains a vertical source line (e.g., a vertical source electrode or local interconnect) which extends vertically through the alternating stack. The second exemplary structure can be derived from the first exemplary structure of FIG. 6 by forming backside trenches 79 and isolation trenches 179 through the alternating stacks (32, 42). The vertical source line (referred to herein as a contact via structure 76) will be formed in the respective backside trenches 79 in a subsequent step. Each of the backside trenches 79 and the isolation trenches 179 can laterally extend along a horizontal direction, and can be parallel among one another. The backside trenches 79 and the isolation trenches 179 can be simultaneously formed, for example, by applying and patterning a photoresist layer over the contact level dielectric layer 73, and anisotropically etching portions of the contact level dielectric layer 73, the alternating stack (32, 42), and the gate dielectric layer 12 employing the patterned photoresist layer as an etch mask.

Each backside trench 79 can have a first width along the horizontal direction that is perpendicular to the lengthwise direction, and each isolation trench 179 can have a second width along the horizontal direction that is less than the first width. In other words, the isolation trenches 179 can be narrower than the backside trenches 79. In one embodiment, one or more isolation trenches 179 may be provided between each neighboring pair of backside trenches 79. In one embodiment, the anisotropic etch process of FIGS. 7A and 7B can be employed to form the backside trenches 79 and the isolation trenches 179. In one embodiment, each of the backside trenches 79 and the isolation trenches 179 can vertically extend from the top surface of the contact level dielectric layer 73 to the top surface of the substrate (9, 10).

Figure 30:
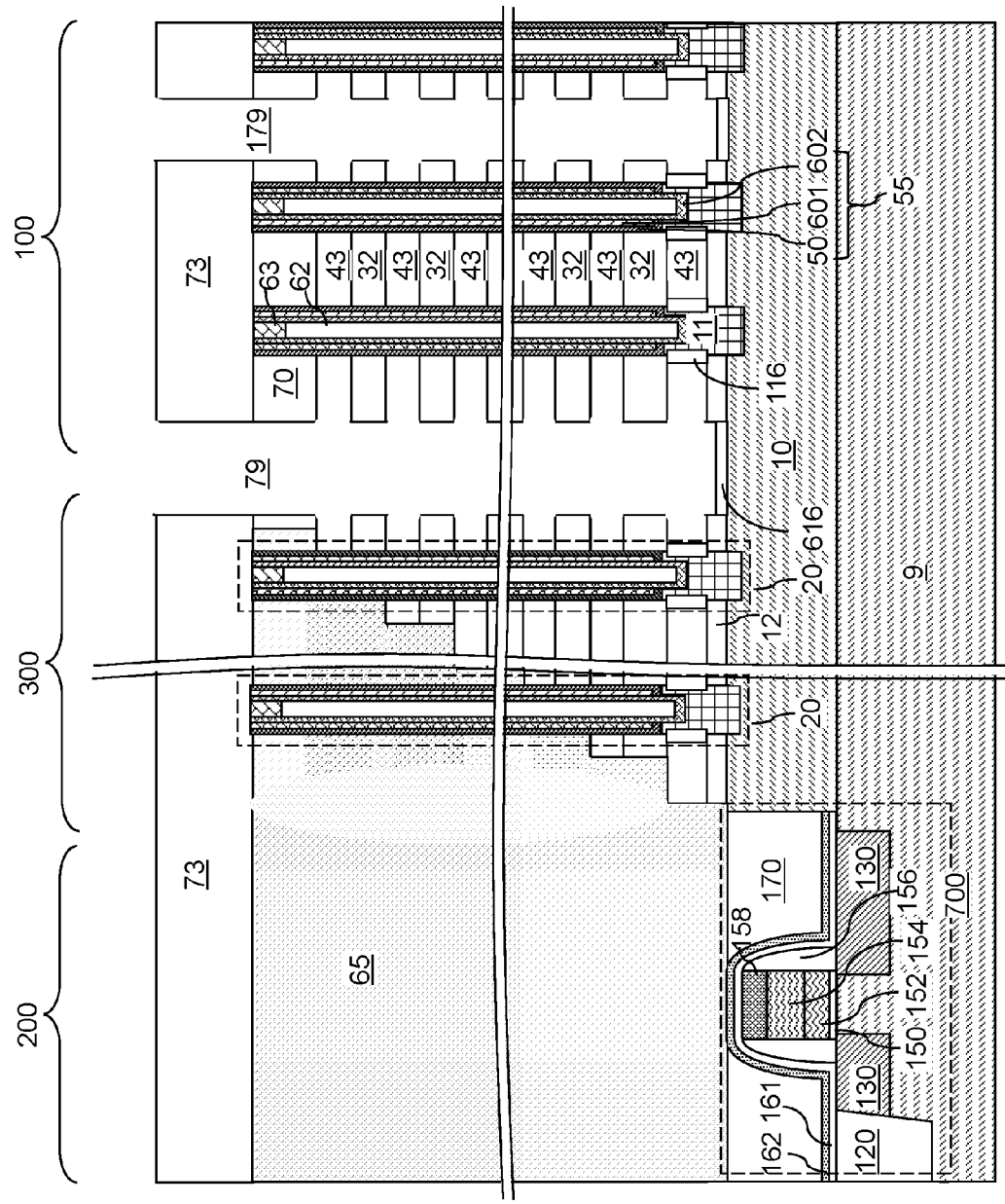
FIG. 30 is a schematic vertical cross-sectional view of the second exemplary structure after formation of backside recesses according to the second embodiment of the present disclosure.

Referring to FIG. 30, an etchant that selectively etches the second material of the sacrificial material layers 42 with respect to the first material of the insulating layers 32 can be introduced into the backside trenches 79 and the isolation trenches 179, for example, employing an etch process. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the outer layer of the memory stack structures 55 and the support pillar structures 20, and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 31:
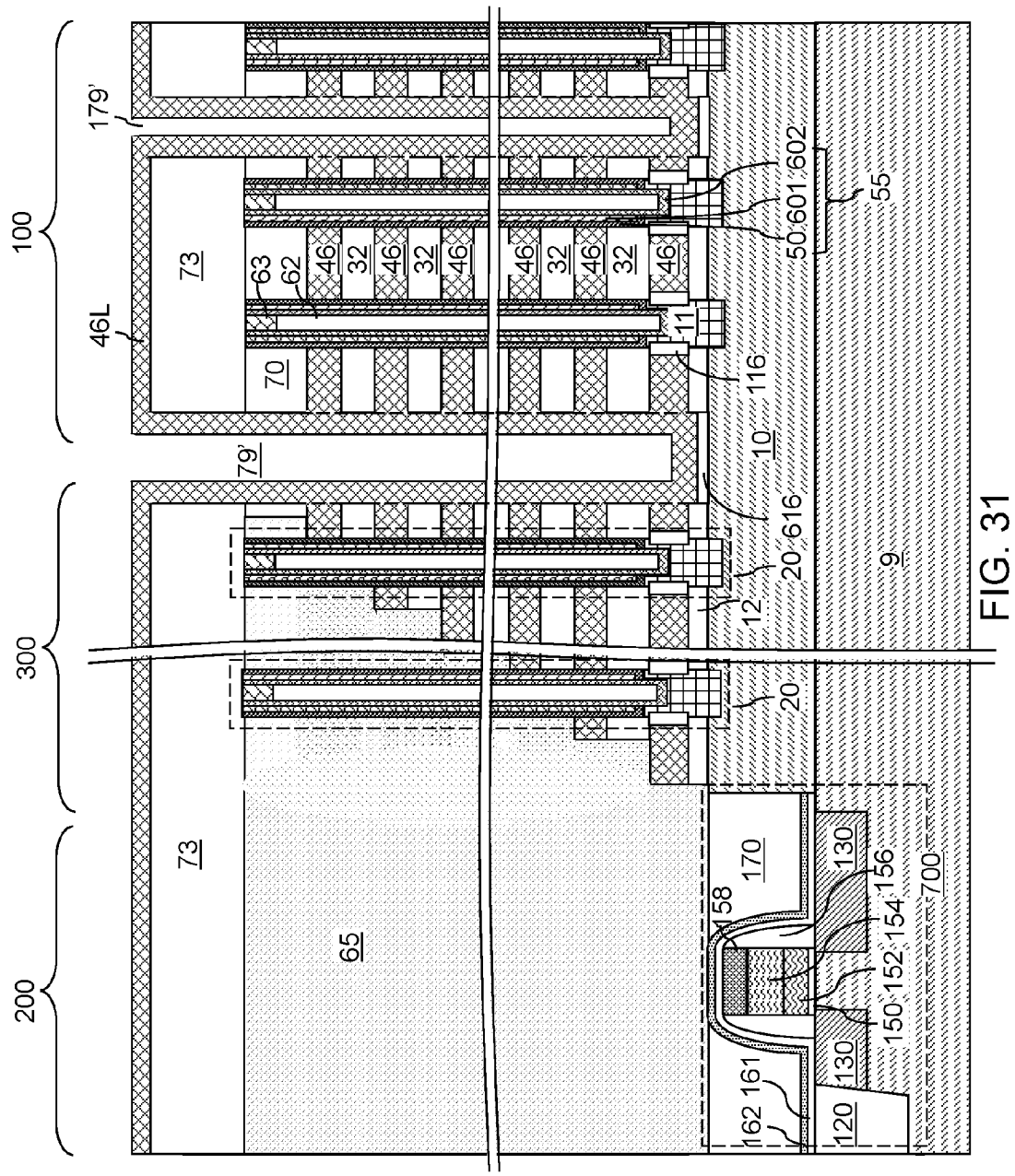
FIG. 31 is a schematic vertical cross-sectional view of the second exemplary structure after deposition of at least one electrically conductive material in the backside recesses and peripheral portions of the backside trenches and the isolation trenches according to the second embodiment of the present disclosure.

Referring to FIG. 31, a backside blocking dielectric layer (not shown) can be optionally formed. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present. The backside blocking dielectric layer can include a dielectric metal oxide layer (such as an aluminum oxide layer), a semiconductor oxide layer (such as a silicon oxide layer), or a layer stack thereof.

At least one conductive material can be deposited in the backside recesses 43, peripheral portions of the backside trenches 79, peripheral portions of the isolation trenches 179, and over the contact level dielectric layer 73 by conformal deposition. Each continuous portion of the at least one conductive material deposited in a backside recess 43 constitutes an electrically conductive layer 46. The conductive material deposited outside of the backside recesses 43 collectively constitute a continuous metallic material layer 46L, which is a continuous layer of the conductive material that is deposited over the contact level dielectric layer 73 and at peripheral portions of the backside trenches 79 and at peripheral portions of the isolation trenches 179.

In an illustrative example, a metallic barrier layer (not explicitly shown) can be deposited in the backside recesses. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the backside trenches 79 and the isolation trenches 179, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43. The continuous metallic material layer 46L can be formed on the sidewalls of each backside trench 79 and each isolation trench 179 and over the contact level dielectric layer 73. Each electrically conductive layer 46 includes a portion of the metallic barrier layer and a portion of the metallic fill material layer that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer and a continuous portion of the metallic fill material layer that are located in the backside trenches 79, in the isolation trenches 179, or above the contact level dielectric layer 73. A backside cavity 79' is present in each unfilled volume of a backside trench 79. An isolation cavity 179' can be present in each unfilled volume of an isolation trench 179.

Each sacrificial material layer 42 can be replaced with an electrically conductive layer 46. A tubular dielectric spacer 116 laterally surrounds an epitaxial channel portion 11. A bottommost electrically conductive layer 46 laterally surrounds each tubular dielectric spacer 116 upon formation of the electrically conductive layers 46. In embodiments in which the epitaxial channel portions 11 are employed, the epitaxial channel portions 11 are formed at the bottom of each of the memory openings 49 as semiconductor material portions, and can have a doping of the first conductivity type. Each vertical semiconductor channel 60 can be formed on a respective epitaxial channel portion 11.

Figure 32:
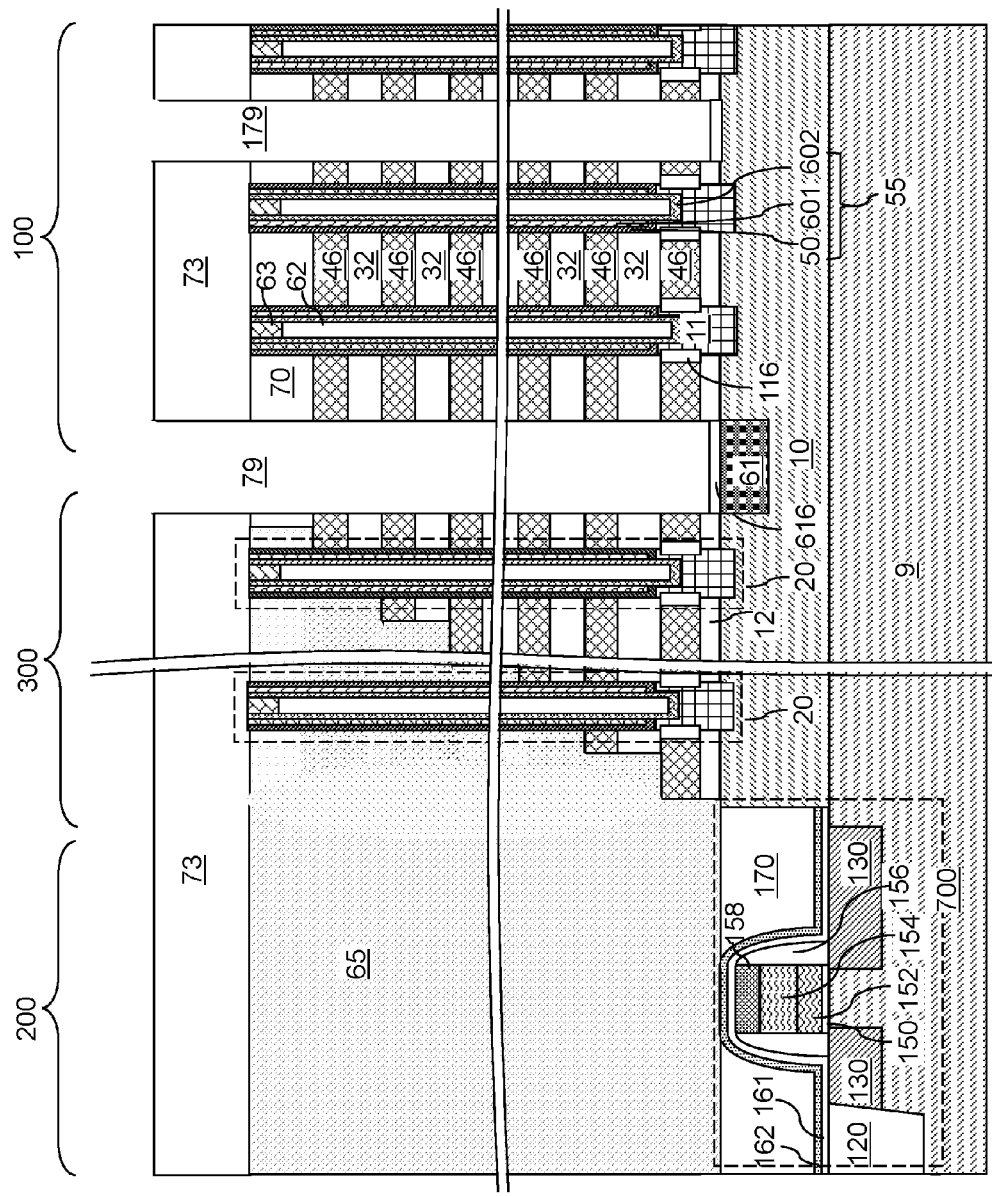
FIG. 32 is a schematic vertical cross-sectional view of the second exemplary structure after formation of source regions according to the second embodiment of the present disclosure.

Referring to FIG. 32, the deposited metallic material of the continuous electrically conductive material layer 46L is etched back from the sidewalls of each backside trench 79 and each isolation trench 179 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

A subset of the electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. In one embodiment, a subset of the electrically conductive layers 46 that includes at least two topmost electrically conductive layers can function as drain select gate electrodes, while another subset of the electrically conductive layers 46 that includes at least one bottommost electrically conductive layer can function as source select gate electrodes.

Figure 33:
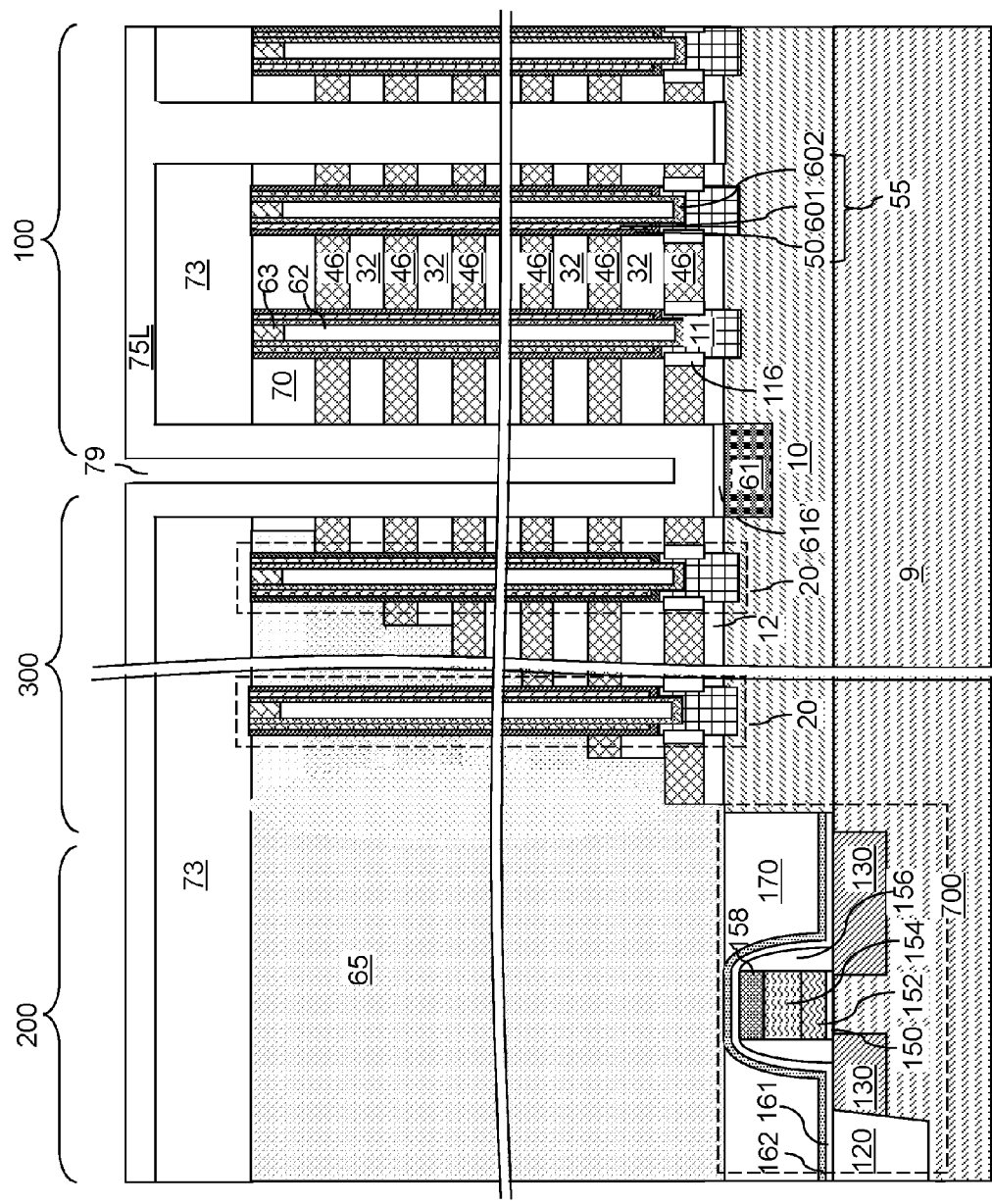
FIG. 33 is a schematic vertical cross-sectional view of the second exemplary structure after formation of a dielectric rail material layer according to the second embodiment of the present disclosure.

Referring to FIG. 33, a dielectric material layer 75L can be deposited at peripheral portions of the backside trenches 79, in the entirety of each isolation trench 179, and over the contact level dielectric layer 73. The thickness of the dielectric material layer 75L (as measured on vertical sidewalls of the backside trenches 79) can be greater than one half of the width of the isolation trenches 179, and can be less than one half of the width of the backside trenches 79. The dielectric material layer 75L partially fills the wider backside trenches 79 to leave a backside cavity 79' therein and completely fills the narrower isolation trenches 179. The dielectric material layer 75L can include a silicon oxide-based dielectric material (such as doped silicate glass, undoped silicate glass, or organosilicate glass), silicon nitride, and/or a dielectric metal oxide (such as aluminum oxide). The dielectric material layer 75L can be deposited by a conformal deposition process such as chemical vapor deposition (CVD) or atomic layer deposition (ALD).

Figure 34:
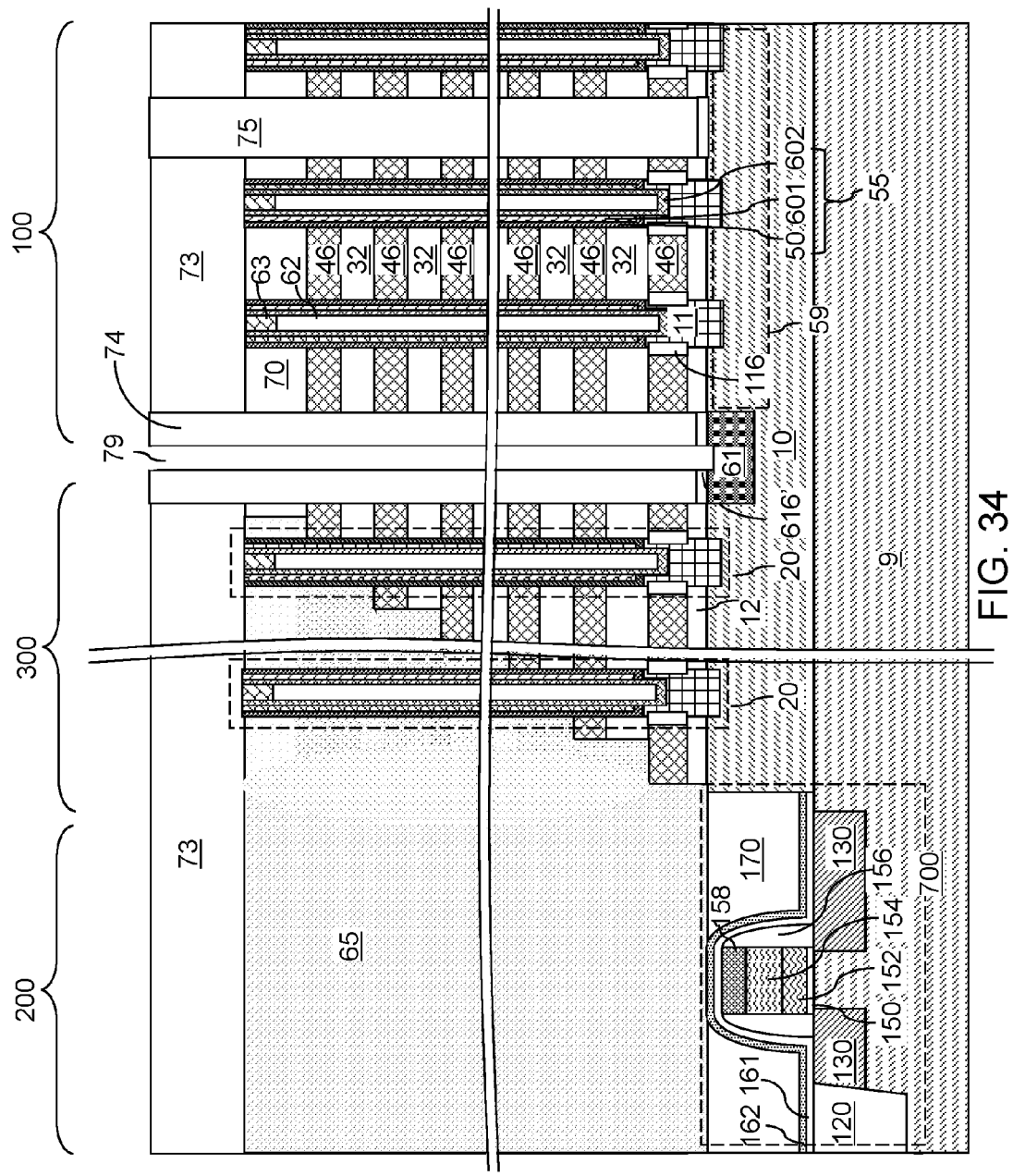
FIG. 34 is a schematic vertical cross-sectional view of the second exemplary structure after formation of dielectric rail structures and insulating spacers according to the second embodiment of the present disclosure.

Referring to FIG. 34, an anisotropic etch is performed to remove horizontal portions of the dielectric material layer 75L in the backside trenches 79. Since the dielectric material layer 75L completely fills the isolation trenches 179, the isolation trenches remain completely filled with the dielectric material after the anisotropic etch step. An insulating spacer 74 is formed around the periphery of each backside trench 79. An anisotropic etch is performed to remove horizontal portions of the dielectric material layer 75L from above the contact level dielectric layer 73 and at the bottom of each backside trench 79. Each remaining portion of the dielectric material layer 75L in the wider backside trenches 79 constitutes an insulating spacer 74. A backside cavity 79' is present within a volume surrounded by each insulating spacer 74. Each remaining portion of the dielectric material layer 75L inside the narrower isolation trenches 179 constitutes a dielectric rail structure 75 which completely fill the isolation trenches 179. Each dielectric rail structure 75 includes a dielectric material and laterally extends along a horizontal direction. The vertical cross-sectional shape of each dielectric rail structure 75 along vertical planes that are perpendicular to the lengthwise direction of the dielectric rail structures 75 can be uniform, i.e., invariant under translation along the lengthwise direction of each dielectric rail structure 75.

The anisotropic etch can be extended to physically expose a top surface of the substrate (9, 10) underneath each backside trench 79. An opening is formed though the planar dielectric portion 616 underneath each backside cavity 79', thereby vertically extending the backside cavity 79'. A top surface of the semiconductor material layer 10 can be physically exposed at the bottom of each backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a source select gate electrode for the select field effect transistors for each vertical NAND string. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Figure 35:
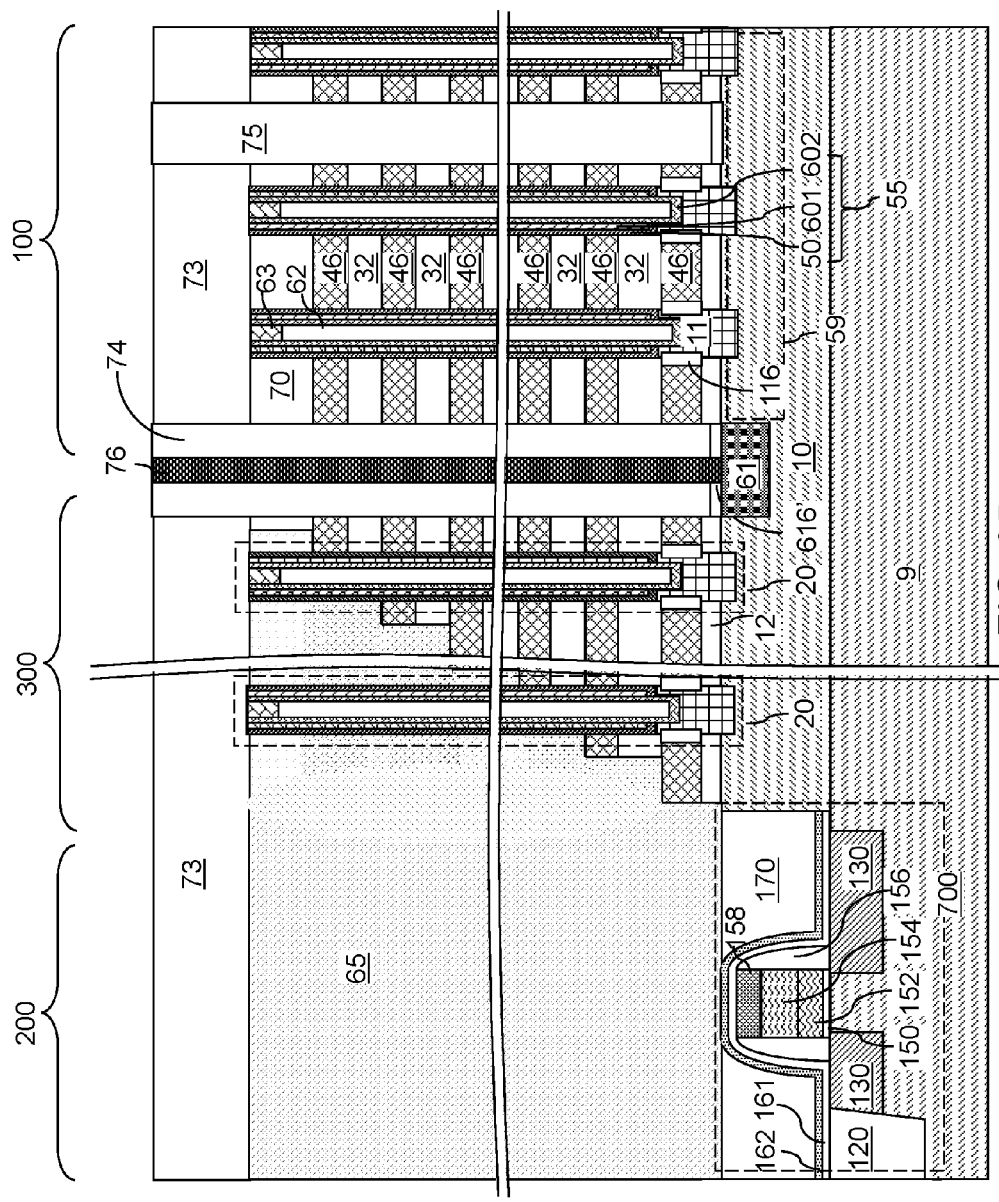
FIG. 35 is a schematic vertical cross-sectional view of the second exemplary structure after formation of backside contact via structures according to the second embodiment of the present disclosure.

Referring to FIG. 35, a contact via structure 76 can be formed within each backside cavity 79'. Each contact via structure 76 can fill a respective backside cavity 79'. The contact via structures 76 can be formed by depositing at least one conductive material in the remaining unfilled volumes (i.e., the backside cavities 79') of the backside trenches 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. Each backside contact via structure 76 extends through the alternating stack (32, 46), and contacts a top surface of a respective source region 61.

Figure 36:
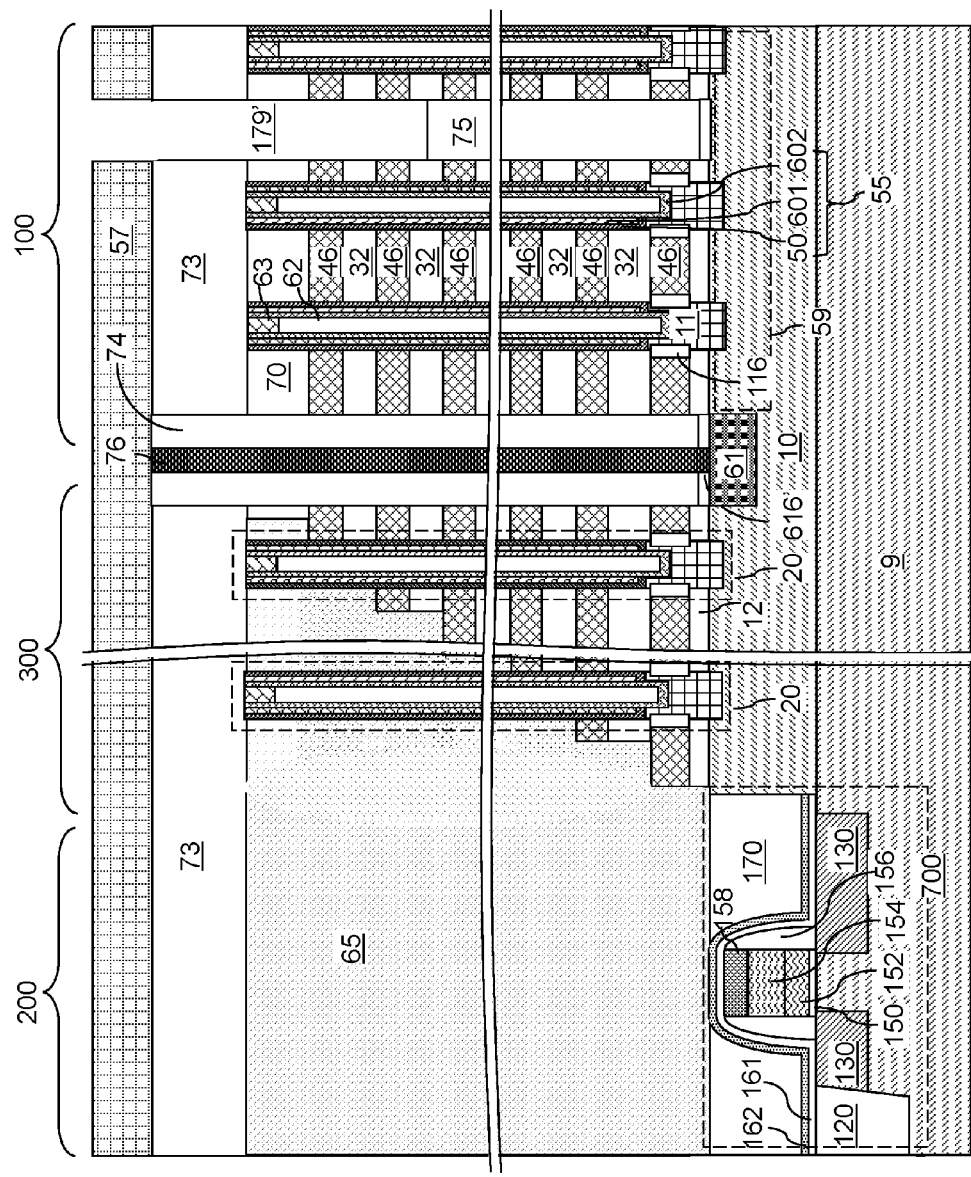
FIG. 36 is a schematic vertical cross-sectional view of the second exemplary structure after vertically recessing the dielectric rail structures according to the second embodiment of the present disclosure.

Referring to FIG. 36, a photoresist layer 57 can be applied over the contact level dielectric layer 73, and lithographically patterned to form openings in areas that overlap with the areas of the dielectric rail structures 75 in each isolation trench 179. Each top portion of the dielectric rail structures 75 can be vertically recessed employing the photoresist layer 57 as an etch mask. An anisotropic etch process can be employed to vertically recess the top portions of the dielectric rail structures 75 in each isolation trench. A recess cavity, which is herein referred to as an isolation cavity 179', is formed over each remaining portion of the dielectric rail structures 75. The depth of recess is selected such that the bottom surface of each isolation cavity 179' is located at the level of an insulating layer 32 that is between the topmost control gate electrode level and the bottommost drain select gate level, i.e., between the electrically conductive layer 46 that functions as the topmost control gate electrode and the electrically conductive layer 46 that functions as the bottommost layer of a drain select gate electrode. The photoresist layer 57 can be subsequently removed, for example, by ashing.

While the present disclosure is described employing an embodiment in which two topmost electrically conductive layers 46 are employed as drain select gate electrodes that are employed to select or deselect a vertical semiconductor channel from the drain side, embodiments are expressly employed herein in which three or more topmost electrically conductive layers 46 are employed as drain select gate electrodes.

Figure 37:
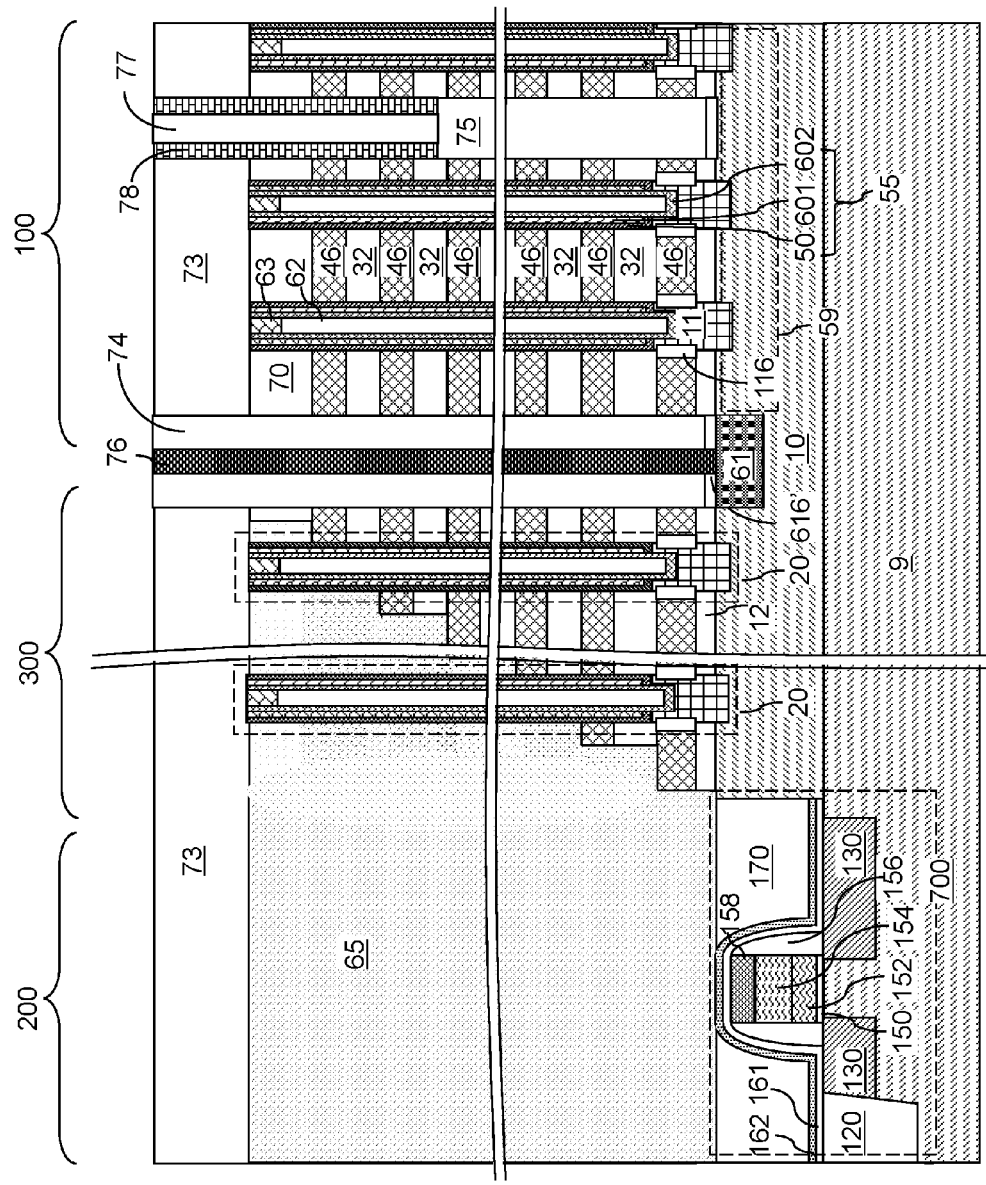
FIG. 37 is a schematic vertical cross-sectional view of the second exemplary structure after formation of two conductive rail structures within each recess region overlying the dielectric rail structures according to the second embodiment of the present disclosure.

Referring to FIG. 37, the processing steps of FIGS. 13 and 14A-14B can be performed to form conductive rail structures 78, which may have the same composition as the conductive rail structures 78 of the first embodiment. As in the first embodiment, two conductive rail structures 78 are formed on lengthwise sidewalls of each isolation trench 179. Each of the two conductive rail structures 78 is electrically shorted to segments of at least two topmost electrically conductive layers 46 provided within a respective one of two physically disjoined layer stacks that are separated by the isolation trench 179. In one embodiment, the two conductive rail structures 78 can be formed directly on sidewalls of the at least two topmost electrically conductive layers 46 that are vertically coincident with a sidewall of one of the insulating layers 32 (i.e., an intervening insulating layer 32) that is physically exposed to the isolation trench 179. In one embodiment, each conductive rail structure 78 can have a uniform thickness throughout, which can be the thickness of the conductive material layer as deposited at the processing steps of FIG. 13.

Subsequently, the processing steps of FIG. 15 can be performed to form a dielectric fill material portion 77 within each of the isolation trenches 179.

Figure 38A:
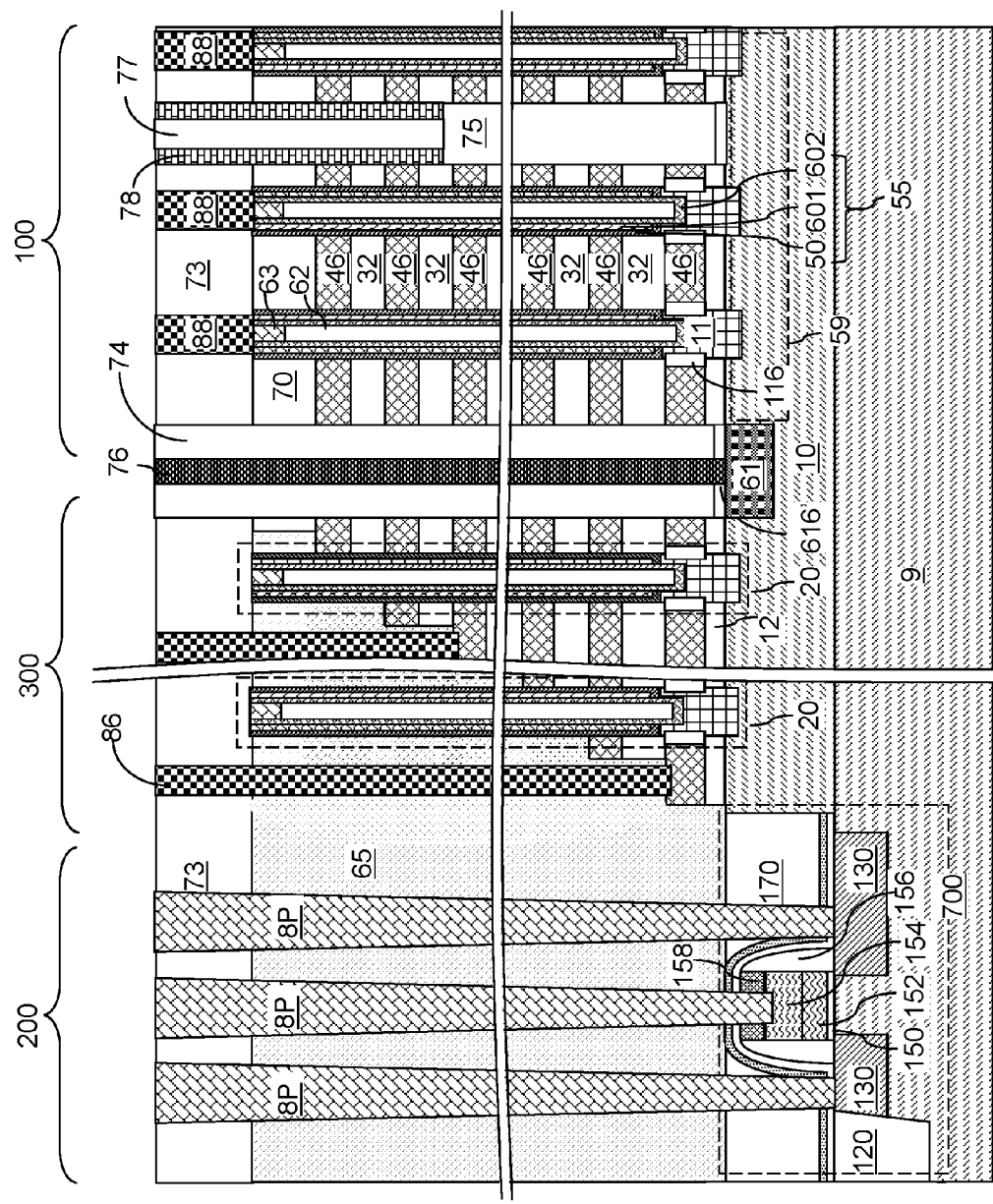
FIG. 38A is a schematic vertical cross-sectional view of the second exemplary structure after formation of contact via structures according to the first embodiment of the present disclosure.
Figure 38B:
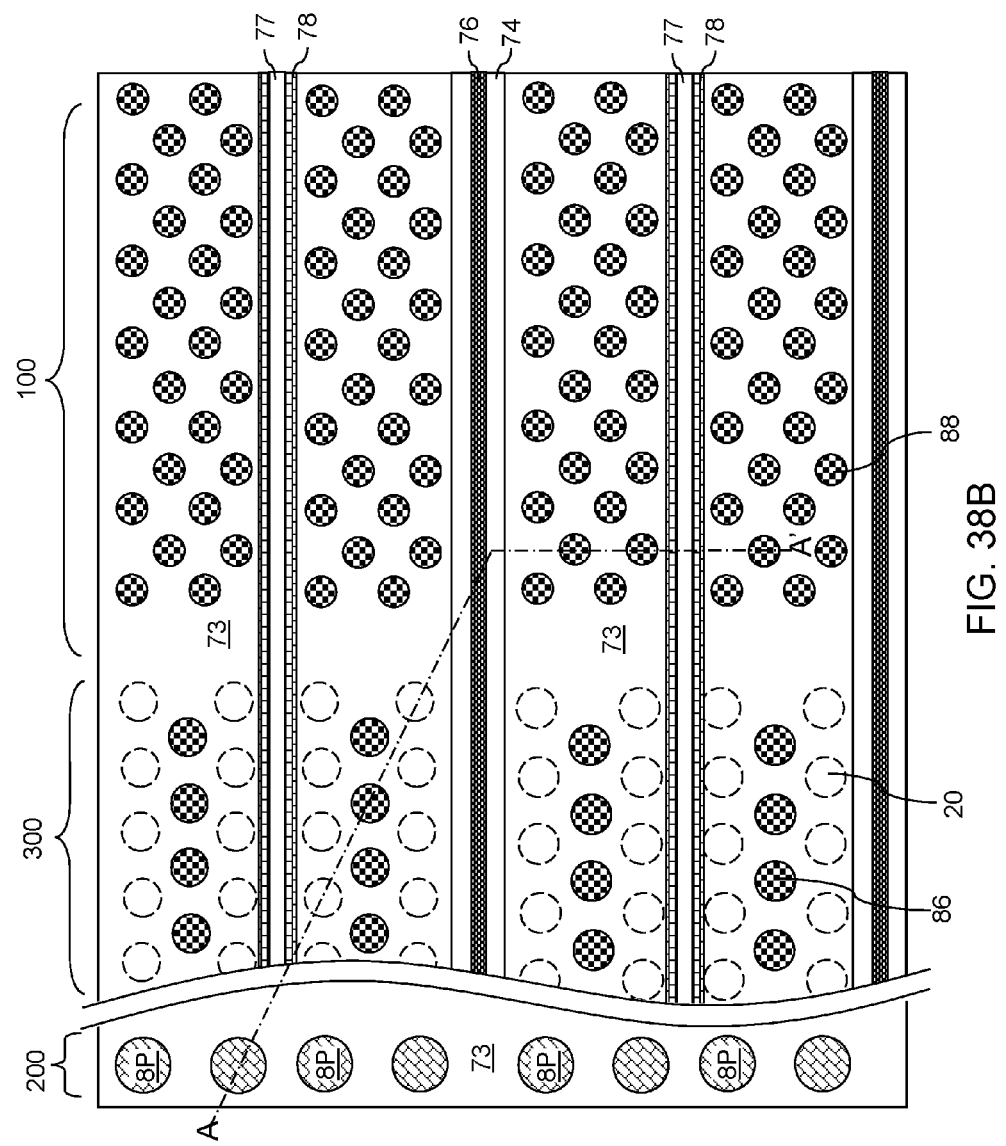
FIG. 38B is a top-down view of the second exemplary structure of FIG. 38A. The vertical plane A-A' is the plane of the schematic vertical cross-sectional view of FIG. 38A.

Referring to FIGS. 38A and 38B, the processing steps of FIGS. 16A and 16B can be performed to form various additional contact via structures (86, 88, 8P).

Figure 39:
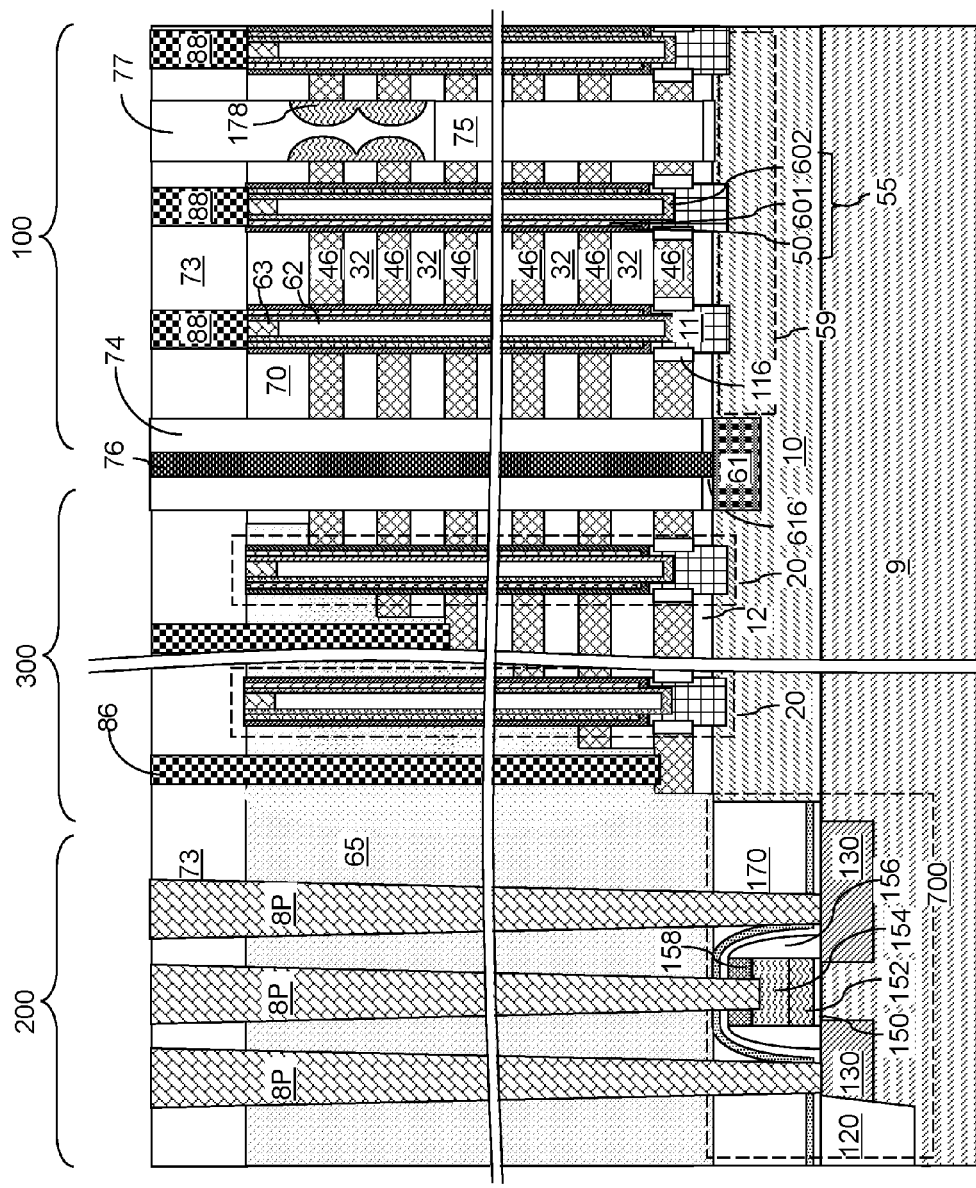
FIG. 39 is a schematic vertical cross-sectional view of a first alternative embodiment of the second exemplary structure after formation of contact via structures according to the first embodiment of the present disclosure.

Referring to FIG. 39, a first alternative embodiment of the second exemplary structure can be derived from the second exemplary structure of FIG. 36 by removing the photoresist layer 57, and by performing the processing steps of FIG. 17 to form conductive rail structures 178 instead of performing the processing steps of FIGS. 13 and 14A-14B to form conductive rail structures 78. The processing steps of FIG. 15 can be performed to form a dielectric fill material portion 77 within each of the isolation trenches 179. Subsequently, the processing steps of FIGS. 16A and 16B can be performed to form various additional contact via structures (86, 88, 8P).

Figure 40A:
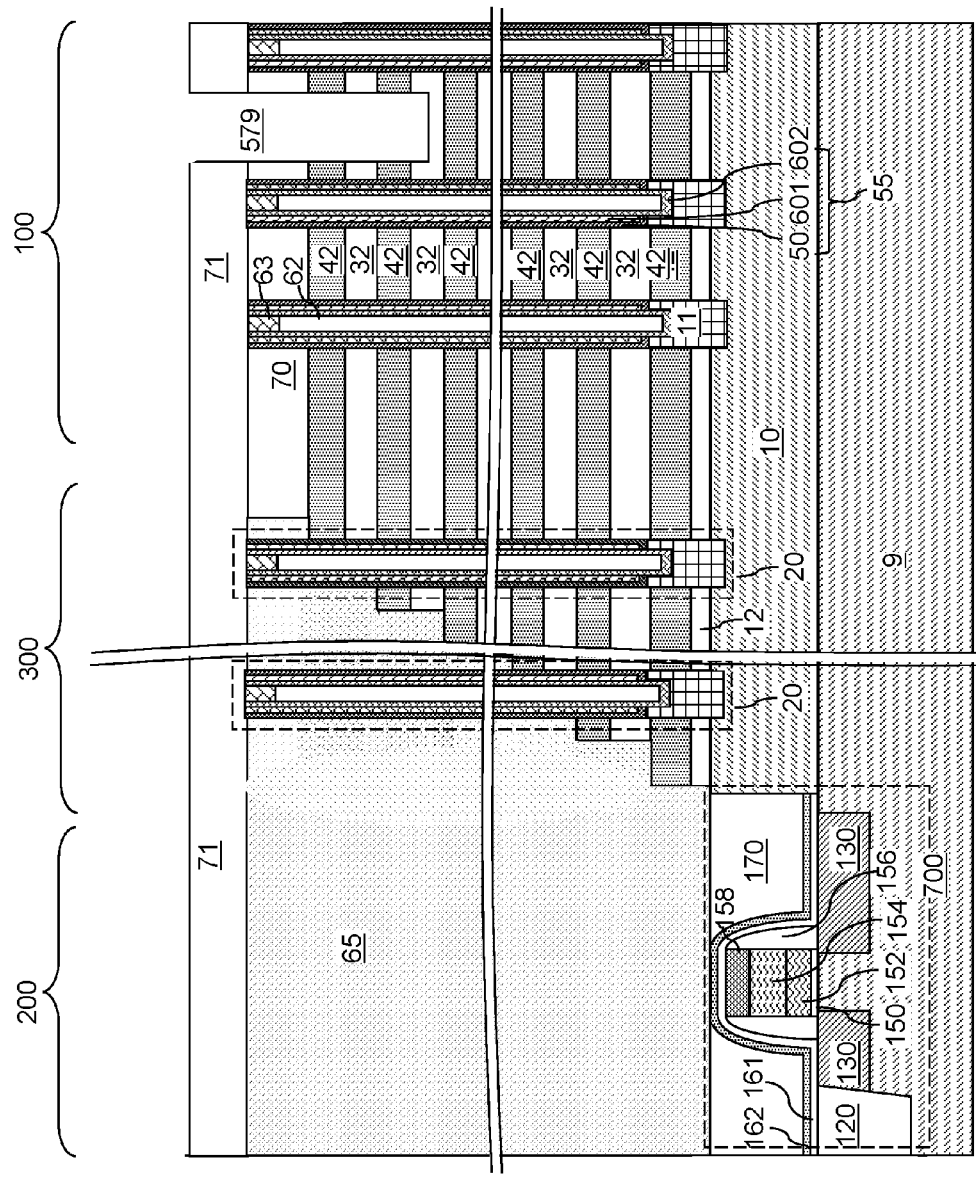
FIG. 40A is a schematic vertical cross-sectional view of a third exemplary structure after formation of isolation trenches according to a third embodiment of the present disclosure.
Figure 40B:
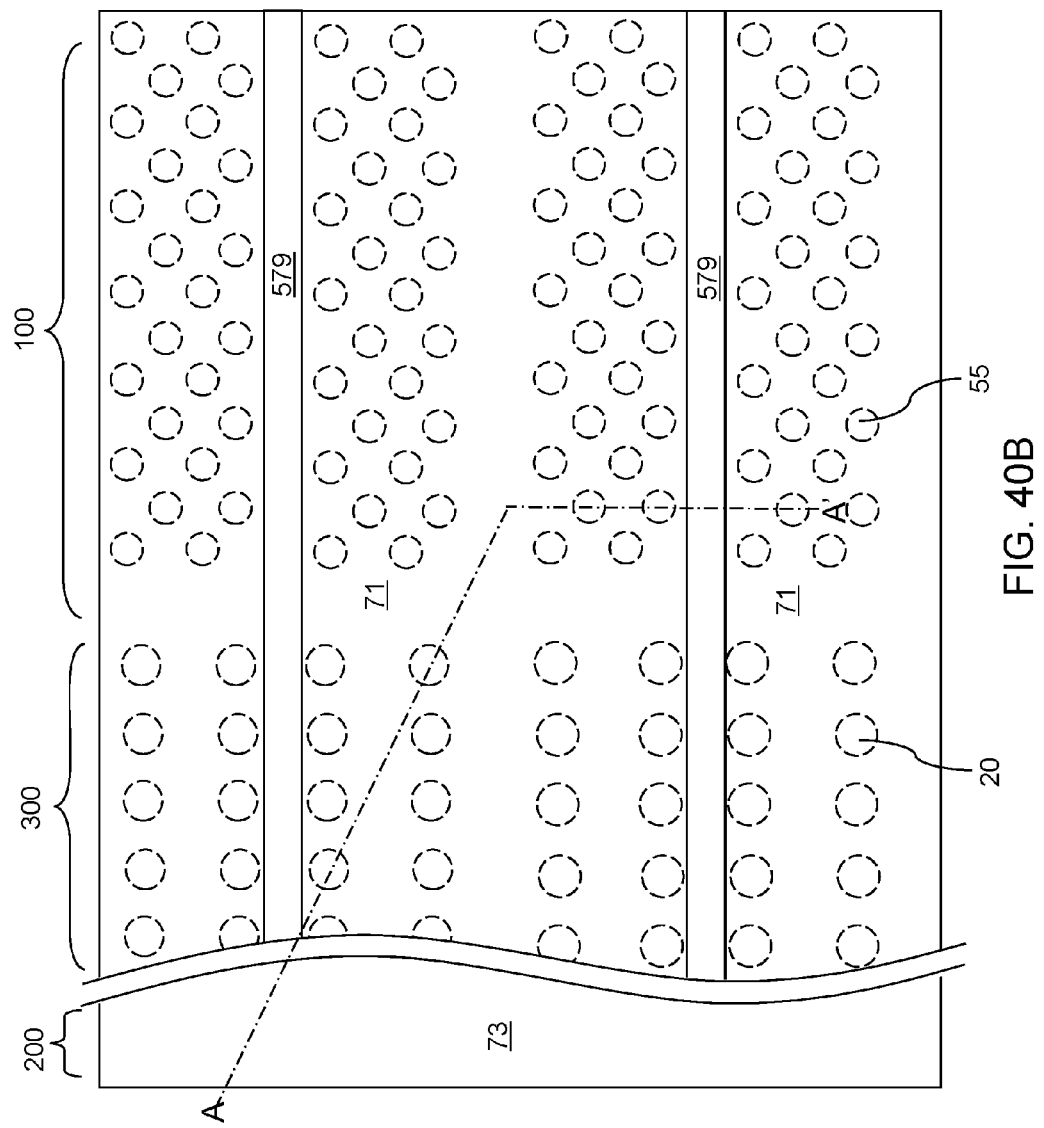
FIG. 40B is a top-down view of the third exemplary structure of FIG. 40A. The vertical plane A-A' is the plane of the schematic vertical cross-sectional view of FIG. 40A.

In the first and second embodiments, the isolation trenches extended through the entire alternating stack to the substrate. In the third embodiment, shallow isolation trenches are provided which extend only through the drain select gate levels. Referring to FIGS. 40A and 40B, a third exemplary structure according to the third embodiment of the present disclosure can be derived from the first exemplary structure of FIG. 6 by forming a first contact level dielectric layer 71 on the top surface of the insulating cap layer 70. The first contact level dielectric layer 71 can have the same composition as the contact level dielectric layer 73 illustrated in FIGS. 7A and 7B. Alternatively, the first contact level dielectric layer 71, the shallow isolation trenches and the materials filling the shallow isolation trenches can be formed after the steps shown in FIG. 3 (i.e., before formation of the memory openings 49 and the memory stack structures 55). The thickness of the first contact level dielectric layer 71 may be the same as, or may be lesser than, the thickness of the contact level dielectric layer 73 of the first embodiment.

Shallow isolation trenches 579 can be formed through the first contact level dielectric layer 71, the insulating cap layer 70, and a subset of layers of the alternating stack (32, 42) that are located at levels of drain select electrodes to be formed and each level of the insulating layers 32 located above the level of the bottommost drain select electrode to be subsequently formed. The isolation trenches 579 can be formed, for example, by applying and patterning a photoresist layer (not shown) over the first contact level dielectric layer 71 to form elongated openings having a uniform width throughout, and by transferring the pattern of the openings in the photoresist layer through the first contact level dielectric layer 71, the insulating cap layer 70, and the subset of layers within the alternating stack (32, 42) located above, or at, the level of the bottommost drain select electrode. Thus, the depth of the isolation trenches 579 is selected such that the bottom surface of each isolation trench 579 is located at the level of an insulating layer 32 that is between the topmost control gate electrode level and the bottommost drain select gate level. The isolation trenches 579 can be parallel among one another.

While the present disclosure is described employing an embodiment in which two topmost sacrificial material layers 42 are located at the levels of drain select gate electrodes to be subsequently employed to select or deselect a vertical semiconductor channel from the drain side, embodiments are expressly employed herein in which three or more topmost sacrificial material layers 42 are employed at drain select gate levels.

Each isolation trench 579 laterally extending along a horizontal direction at least through a set of layers including at least two topmost spacer material layers, which are at least two topmost sacrificial material layers 42, within the alternating stack (32, 42). The isolation trenches 579 collectively divide each layer within the set of layers into multiple segments. In one embodiment, the bottommost surface of each isolation trench 579 can be formed within one of the insulating layers 32 within the alternating stack (32, 42).

Figure 41A:
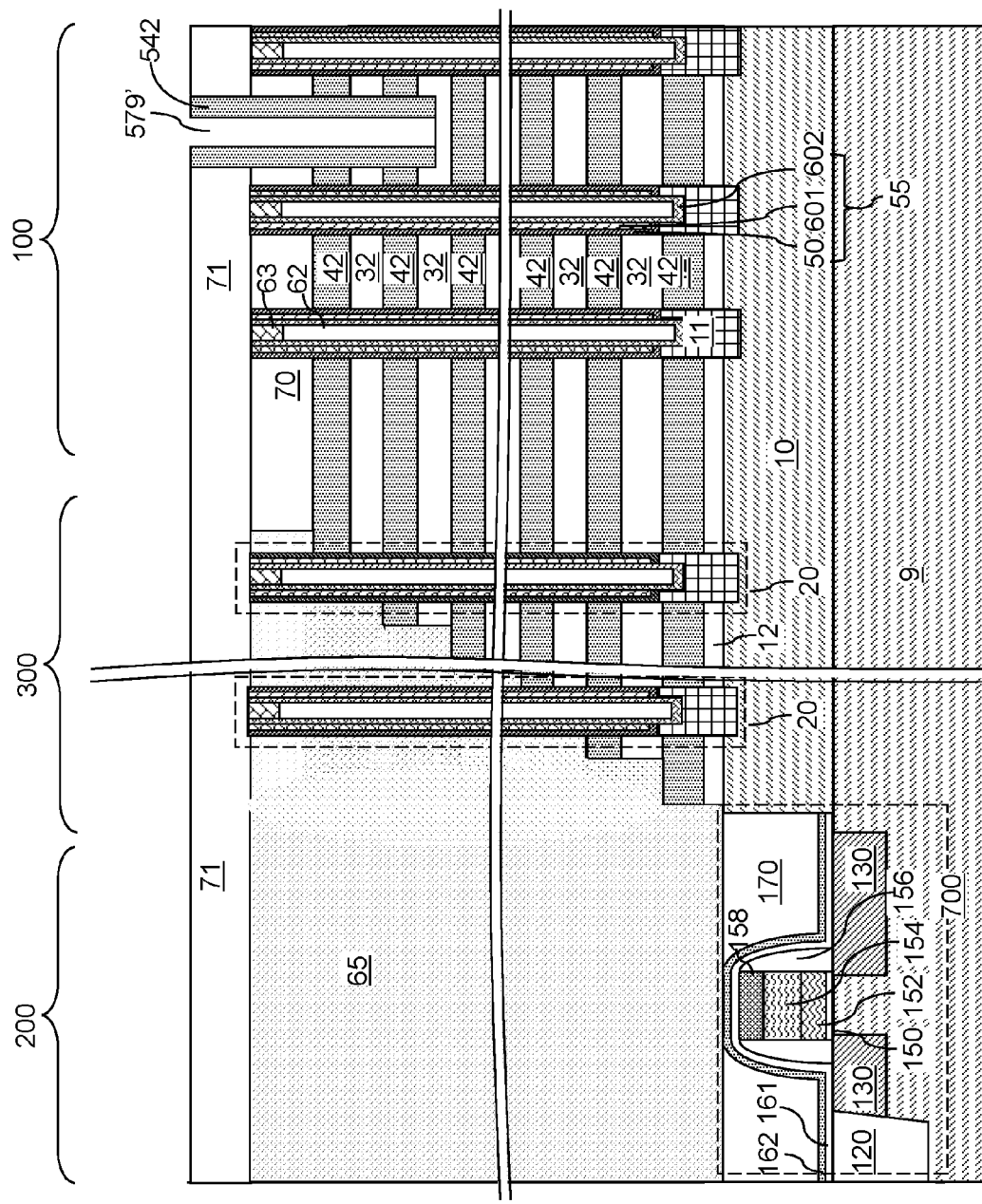
FIG. 41A is a schematic vertical cross-sectional view of the third exemplary structure after formation of sacrificial spacer structures within each isolation trench according to the third embodiment of the present disclosure.
Figure 41B:
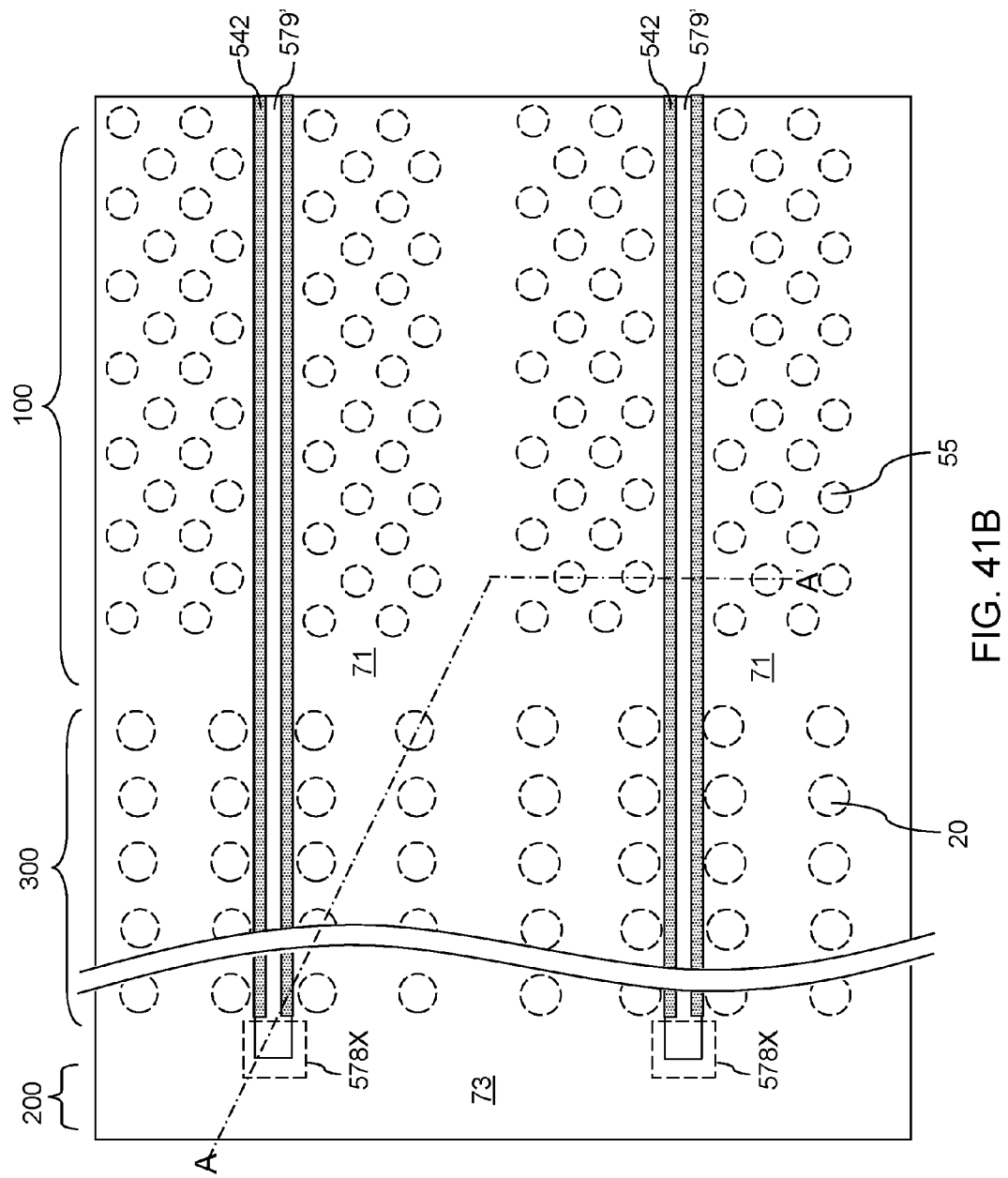
FIG. 41B is a top-down view of the third exemplary structure of FIG. 41A. The vertical plane A-A' is the plane of the schematic vertical cross-sectional view of FIG. 41A.

Referring to FIGS. 41A and 41B, sacrificial spacer structures 542 can be formed within each isolation trench 579. Specifically, a conformal sacrificial layer can be deposited as a continuous layer at the periphery of each isolation trench 579 and over the top surface of the first contact level dielectric layer 71. The isolation trenches 579 laterally divide the alternating stack (32, 42) of the insulating layers 32 and the sacrificial material layers 42 into multiple physically disjoined layer stacks. Specifically, each isolation trench 579 laterally divides the alternating stack (32, 42) into two physically disjoined layer stacks. Sidewalls of segments of at least two topmost sacrificial material layers 42 are physically exposed within each of the isolation trench 579. The conformal sacrificial layer can be formed directly on the sidewalls of the segments of the at least two topmost sacrificial material layers 42 of the two physically disjoined layer stacks within each isolation trench 579 to leave isolation cavities 579' between the sacrificial material spacer structures 542.

The conformal sacrificial layer includes a material that can be removed selective the material of the insulating layers 32 concurrently with removal of the sacrificial material layers 42. In one embodiment, the conformal sacrificial layer can include the same material as the sacrificial material layers 42. For example, the conformal sacrificial material layer and the sacrificial material layers 42 can include silicon nitride. The conformal sacrificial layer can be deposited by a conformal deposition method such as chemical vapor deposition. The thickness of the conformal sacrificial layer can be selected such that vertical portions of the conformal sacrificial layer do not merge in the isolation cavities 579'. In one embodiment, the thickness of the conformal sacrificial layer can be in a range from 5% to 45% of the width of the isolation trenches 579.

An anisotropic etch is performed to remove horizontal portions of the conformal sacrificial layer. Each remaining portion of the conformal sacrificial layer in an isolation trench 579 constitutes a generally ring-shaped conductive structure with a contiguous set of outer sidewalls that contact lengthwise sidewalls and widthwise sidewalls of a respective isolation trench 579. Each remaining horizontal portions of the conformal sacrificial layer after the anisotropic etch includes two sacrificial rail structures that extend along the lengthwise direction of the respective isolation trench 579 and two widthwise portions that are located on the widthwise sidewalls of the isolation trench 579.

A photoresist layer (not shown) can be applied over the remaining portions of the conformal sacrificial layer and over the first contact level dielectric layer 71, and can be lithographically patterned to form openings overlying end portions of each generally ring-shaped sacrificial structure. Each section of the generally ring-shaped sacrificial structure within the area of the openings in the photoresist layer can be removed, for example, by an isotropic etch. Two widthwise portions of each generally ring-shaped sacrificial structure (which are located within the two end portions 578X of a respective isolation trench 579, are removed by the isotropic etch. Each generally ring-shaped sacrificial structure is divided into two sacrificial spacer structures 542 that are physically disjoined from each other. Two sacrificial spacer structures 542 are formed within each isolation trench 579 and separated by each isolation cavity 579'. In one embodiment, the two sacrificial spacer structures 542 can be formed directly on sidewalls of the at least two topmost sacrificial material layers 42 that are vertically coincident with a sidewall of each intervening insulating layer 32.

Two sacrificial spacer structures 542 are formed on lengthwise sidewalls of each isolation trench 579. In one embodiment, the two sacrificial spacer structures 542 can be formed directly on sidewalls of the at least two topmost sacrificial material layers 42 that are vertically coincident with a sidewall of one of the insulating layers 32 (i.e., an intervening insulating layer 32) that is physically exposed to the isolation trench 579. The photoresist layer can be subsequently removed, for example, by ashing. In one embodiment, each sacrificial spacer structure 542 can have a uniform thickness throughout, which can be the thickness of the conformal sacrificial layer as deposited. An isolation cavity 579' is present within each unfilled volume of the isolation trenches 579.

Figure 42:
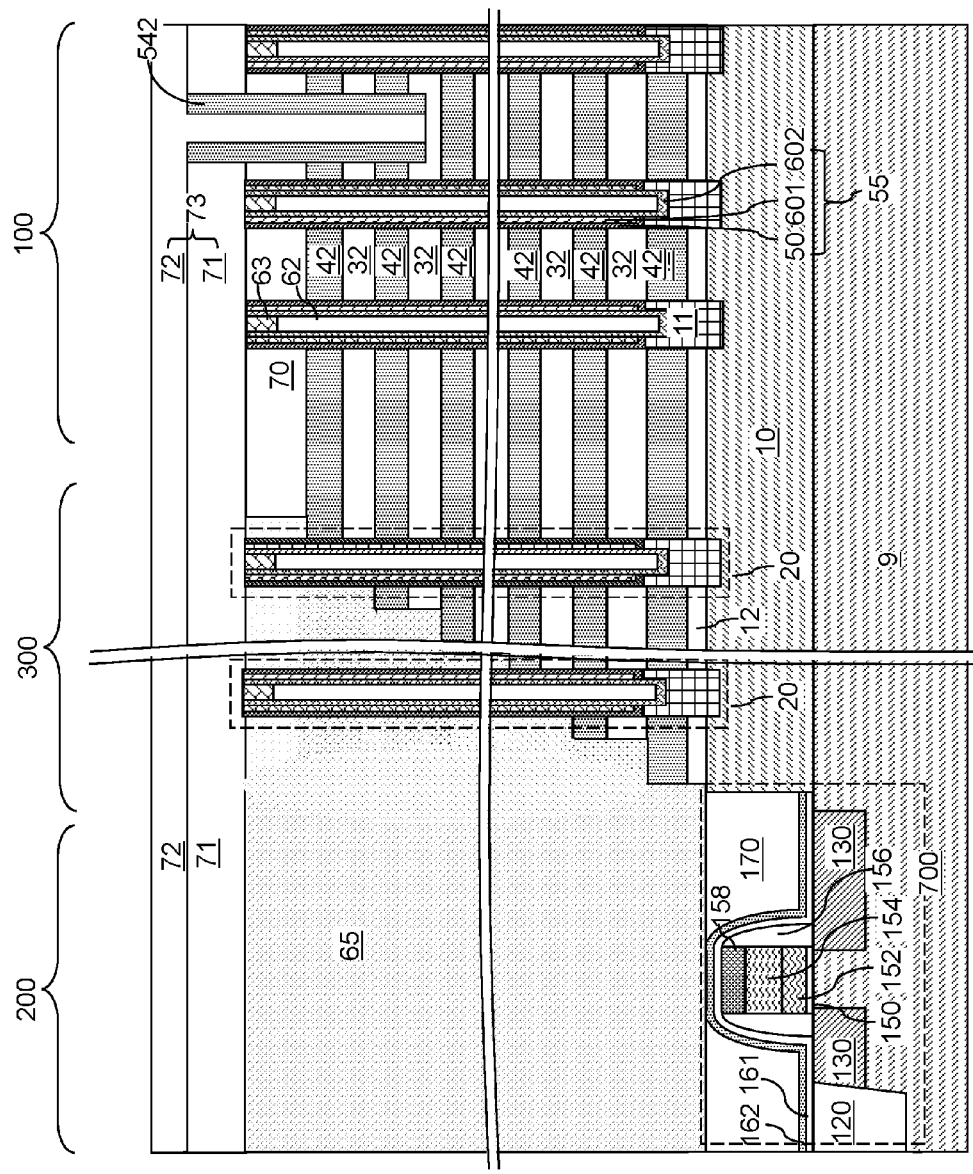
FIG. 42 is a schematic vertical cross-sectional view of the third exemplary structure after formation of a dielectric fill material layer according to the third embodiment of the present disclosure.

Referring to FIG. 42, a second contact level dielectric layer 72 can be formed by depositing a dielectric material. The dielectric material of the second contact level dielectric layer 72 is different from the material of the sacrificial spacer structures 542 and the sacrificial material layers 42, and may be the same, or may be different from, the dielectric materials of the first contact level dielectric layer 71 and/or the insulating layers 32.

The dielectric material of the second contact level dielectric layer 72 can fill remaining unfilled volumes of the isolation cavities 579'. A vertical portion of the second contact level dielectric layer 72, which is a dielectric fill material portion, can be formed within each isolation cavity 579' between a pair of sacrificial spacer structures 542. The dielectric material of the second contact level dielectric layer 72 can be deposited on widthwise sidewalls of the isolation trenches 579 and inner sidewalls of the sacrificial spacer structures 542. Each vertically extending portion of the second contact level dielectric layer 72 that fills a respective isolation cavity 579' constitutes a dielectric fill material portion 72V.

The first contact level dielectric layer 71 and the second contact level dielectric layer 72 are collectively referred to as a contact level dielectric layer 73, which can have the same thickness as, or a greater thickness than, the contact level dielectric layer 73 of the first embodiment. In one embodiment, the first contact level dielectric layer 71 and the second contact level dielectric layer 72 can include a semiconductor oxide-based dielectric material (such as doped silicate glass, undoped silicate glass, and/or organosilicate glass).

Figure 43A:
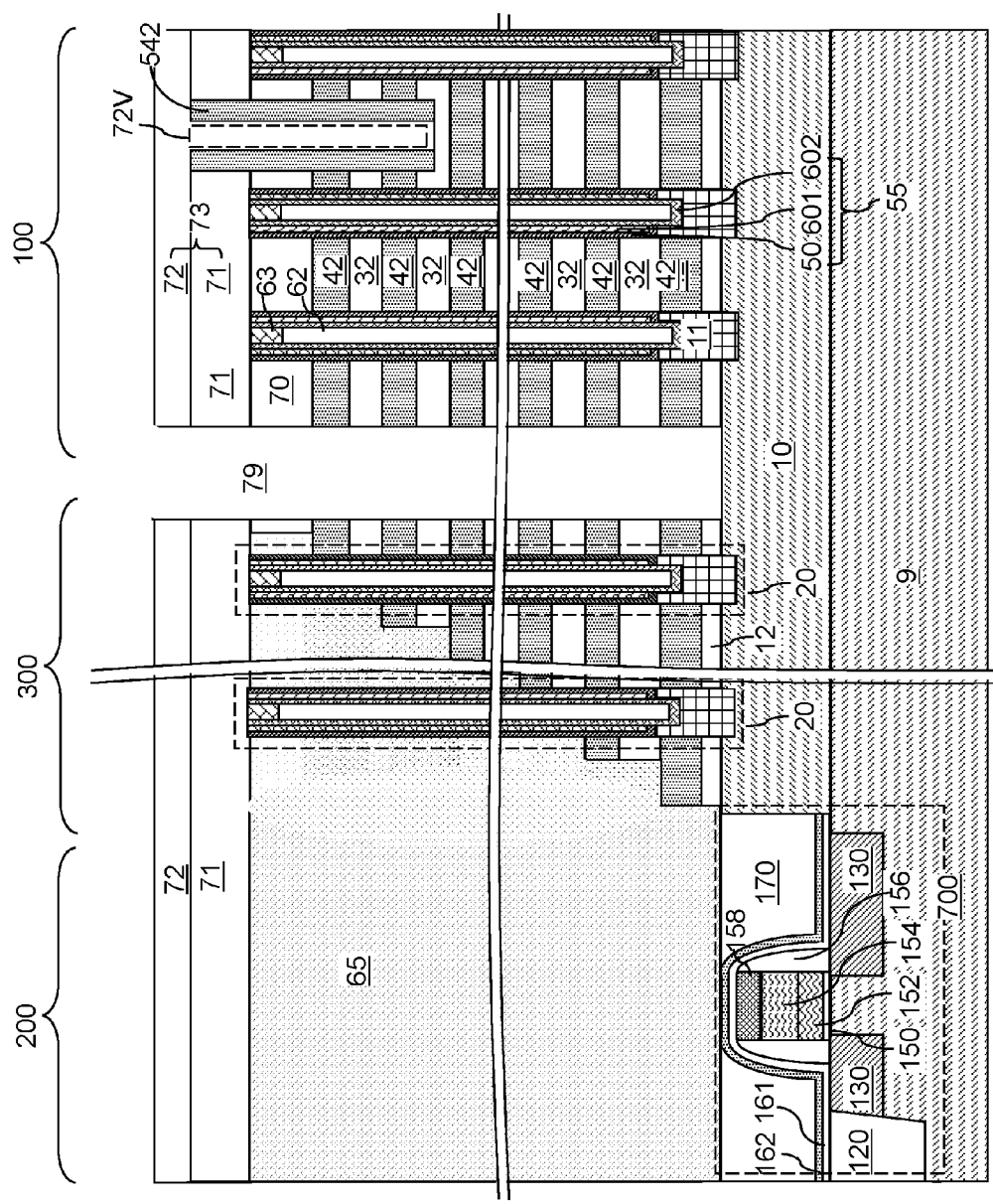
FIG. 43A is a schematic vertical cross-sectional view of the third exemplary structure after formation of backside trenches according to the third embodiment of the present disclosure.
Figure 43B:
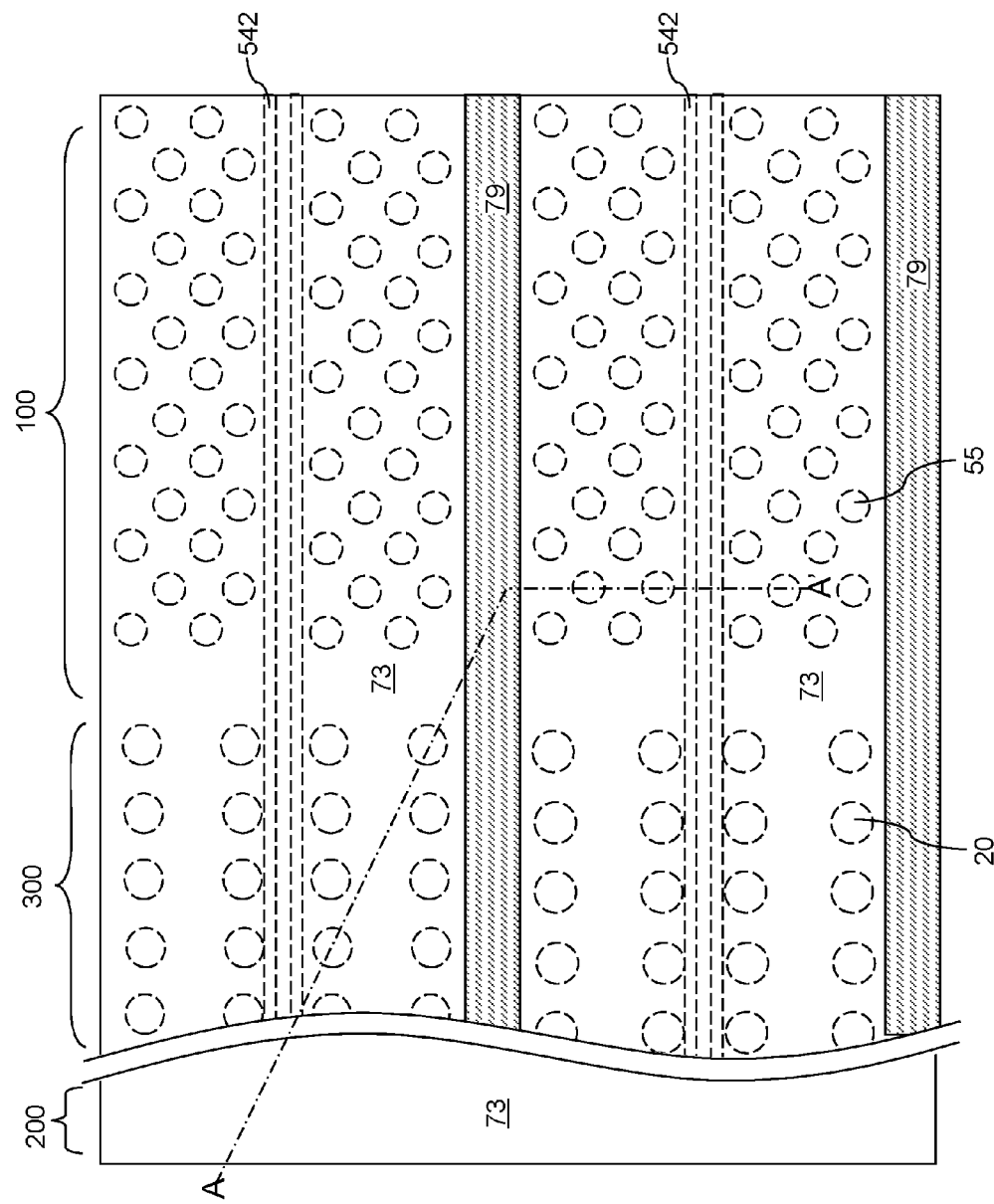
FIG. 43B is a top-down view of the third exemplary structure of FIG. 43A. The vertical plane A-A' is the plane of the schematic vertical cross-sectional view of FIG. 43A.

Referring to FIGS. 43A and 43B, a photoresist layer (not shown) can be applied over the contact level dielectric layer 73, and is lithographically patterned to form openings in areas between clusters of memory stack structures 55. In one embodiment, the openings in the photoresist layer can be elongated along the lengthwise direction of the isolation trenches 579 and the sacrificial spacer structures 542. Further, each opening in the photoresist layer may be located such that one or more isolation trench 579 is located between each neighboring pair of openings in the photoresist layer.

The pattern in the photoresist layer can be transferred through the contact level dielectric layer 73, the alternating stack (32, 42), and/or the retro-stepped dielectric material portion 65 employing an anisotropic etch to form backside trenches 79, which vertically extend from the top surface of the contact level dielectric layer 73 to at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing. The backside trenches 79 and the isolation trenches 579 can laterally extend along the same horizontal direction, i.e., can be parallel among one another.

Figure 44:
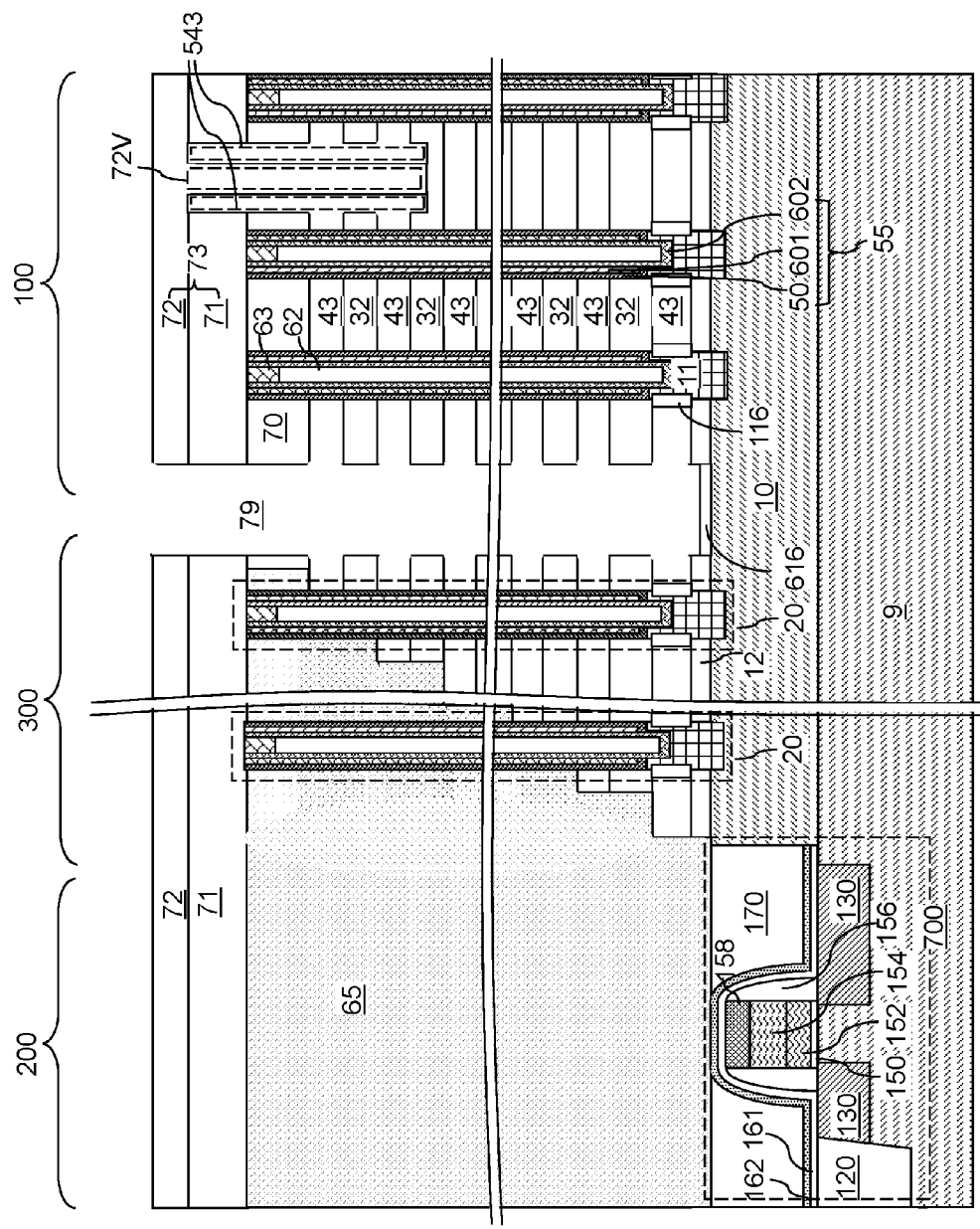
FIG. 44 is a schematic vertical cross-sectional view of the third exemplary structure after formation of backside recesses and rail cavities according to the third embodiment of the present disclosure.

Referring to FIG. 44, an etchant that selectively etches the second material of the sacrificial material layers 42 and the sacrificial spacer structures 542 with respect to the first material of the insulating layers 32 can be introduced into the backside trenches 79, for example, employing an etch process. Backside recesses 43 are formed in volumes from which the sacrificial material layers 42 are removed. A pair of rail cavities 543 that laterally extend along the lengthwise direction is formed within each isolation trench 579. The removal of the second material of the sacrificial material layers 42 and the material of sacrificial spacer structures 542 can be selective to the first material of the insulating layers 32, the material of the retro-stepped dielectric material portion 65, the semiconductor material of the semiconductor material layer 10, the material of the outermost layer of the memory films 50 and the material of the dielectric fill material portion 72V which remains in the isolation trenches 579. In one embodiment, the sacrificial material layers 42 and the sacrificial spacer structures 542 can include silicon nitride, and the materials of the insulating layers 32, the support pillar structure 20, the retro-stepped dielectric material portion 65 and the dielectric fill material portion 72V can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 and the sacrificial spacer structures 542 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42 and the rail cavities 543 are present within volumes previously occupied by the sacrificial spacer structures 542.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Each pair of rail cavities 543 located within the volume of an isolation trench 579 can be laterally spaced from each other by a respective dielectric fill material portion 72V, which may be a vertically protruding portion of the second contact level dielectric layer 72. Each rail cavity 543 vertically extends through at least two levels of backside recesses 43 located at each level of drain select gate electrodes to be subsequently formed, through an insulating cap layer 70, and through the first contact level dielectric layer 71. A first lengthwise sidewall of each rail cavity 543 can be a lengthwise sidewall of a dielectric fill material portion 72V, and a second lengthwise sidewall of each rail cavity 543 can include sidewalls of the first contact level dielectric layer 71, the insulating cap layer 70, and at least one insulating layer 32 located between backside recesses located at levels of drain select gate electrodes.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 45A:
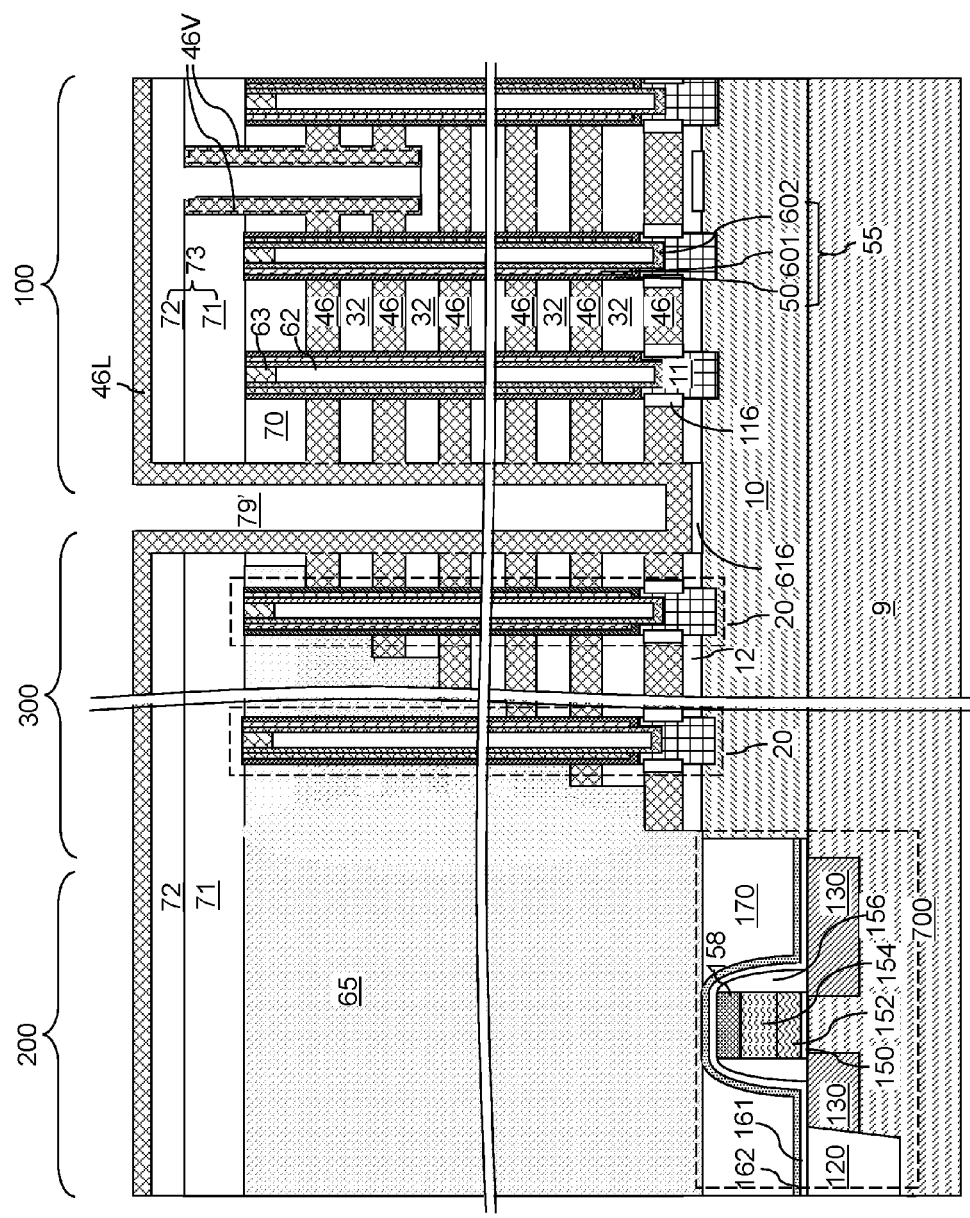
FIG. 45A is a schematic vertical cross-sectional view of the third exemplary structure after formation of electrically conductive layers and conductive rail structures according to the third embodiment of the present disclosure.
Figure 45B:
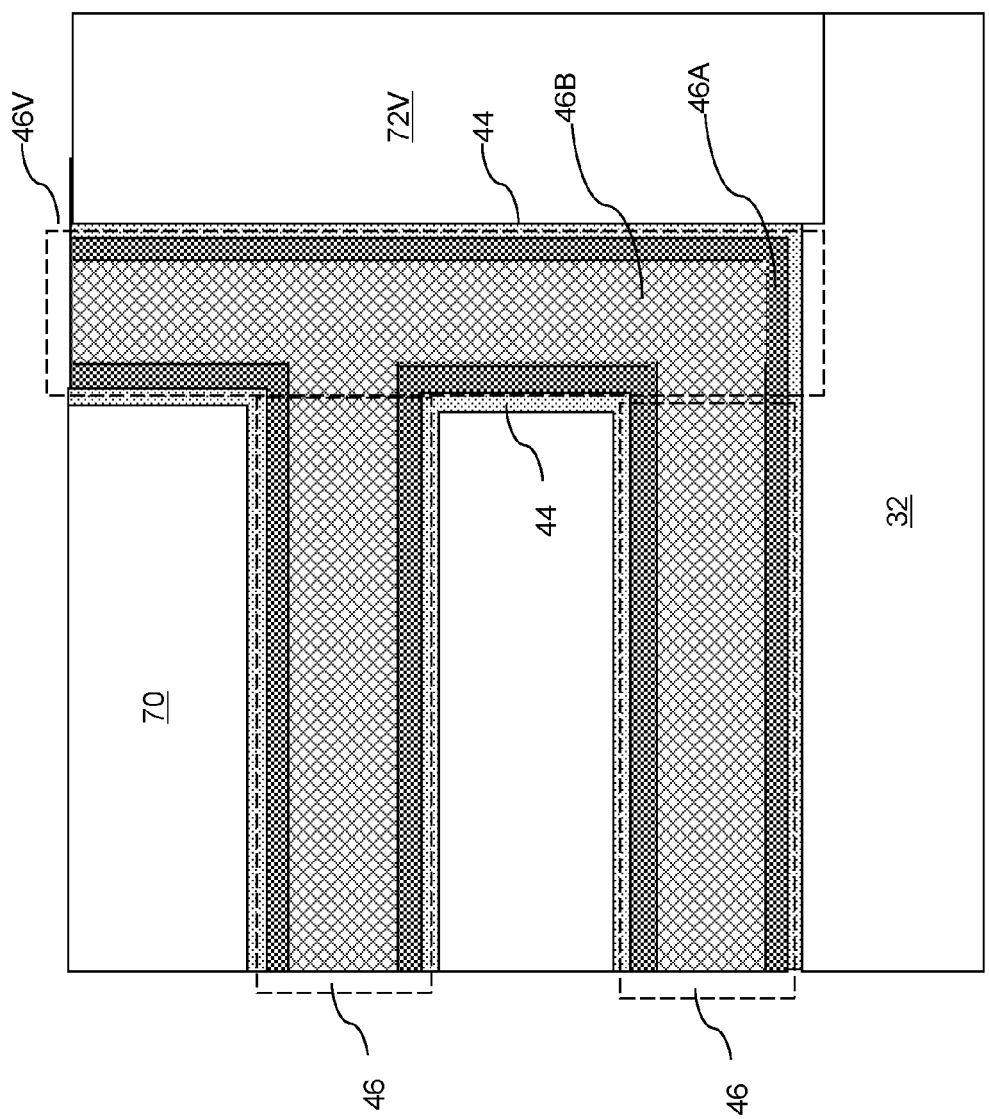
FIG. 45B is a magnified view of a region of the third exemplary structure of FIG. 45A that includes a conductive rail structure.

Referring to FIGS. 45A and 45B, a backside blocking dielectric layer 44 can be optionally formed. The backside blocking dielectric layer 44, if present, comprises a dielectric material that functions as a portion of a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43, in the rail cavities 543, and on a sidewall of the backside trench 79. The backside blocking dielectric layer 44 can be formed directly on horizontal surfaces of the insulating layers 32 and sidewalls of the memory stack structures 55 within the backside recesses 43. Further, the backside blocking dielectric layer 44 can be formed directly on sidewalls of the dielectric fill material portions 72V and sidewalls of the insulating layer(s) 32, the insulating cap layer 70, and the first contact level dielectric layer 71 around each rail cavity 543. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

At least one conductive material can be deposited in the backside recesses 43 and the rail cavities 543, sidewalls of the backside trenches 79, optionally peripheral portions of the isolation trenches 179, and over the contact level dielectric layer 73 by conformal deposition. Each continuous portion of the at least one conductive material deposited in a backside recess 43 constitutes an electrically conductive layer 46. Each portion of the at least one conductive material deposited in a rail cavity 543 constitutes a conductive rail structure 46V. The conductive material deposited outside of the backside recesses 43 and the rail cavities 543 collectively constitute a continuous metallic material layer 46L, which is a continuous layer of the conductive material that is deposited over the contact level dielectric layer 73, on sidewalls of the backside trenches 79 and optionally at peripheral portions of the isolation trenches 179.

For example, a metallic barrier layer 46A can be deposited as a continuous material layer in the backside recesses 43 and the rail cavities 543. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Subsequently, a metal fill material is deposited in the plurality of backside recesses 43, in remaining volumes of the rail cavities 543, on the sidewalls of the at least one the backside trench 79, and over the top surface of the contact level dielectric layer 73 to form a metallic fill material layer 46B (which can be a continuous material layer that is formed as a single continuous structure). The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, a plurality of conductive rail structures 46V can be formed in the plurality of rail cavities 543, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. Each conductive rail structure 46V includes a portion of the metallic barrier layer 46A and a portion of the metallic fill material layer 46B that extends laterally along the horizontal direction of the respective rail cavity 543. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. Each sacrificial spacer structure 542 can be replaced with a conductive rail structure 46V. A backside cavity 79' is present in the portion of each backside trench 79 that is not filled with the backside blocking dielectric layer and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

During the processing steps of FIGS. 45A and 45B, at least one conductive material is deposited in volumes from which the sacrificial spacer structures 542 and the sacrificial material layers 42 are removed. A pair of continuous conductive structures (46, 46V) is formed in, and around, each isolation trench 579. Each of the pair of continuous conductive structures (46, 46V) includes respective segments of the at least two topmost electrically conductive layers 46 and a respective one of the two conductive rail structures 46V. The two conductive rail structures 46V within each isolation trench 549 are formed on lengthwise sidewalls of the isolation trench 549. Each of the two conductive rail structures 46V is electrically shorted to segments of at least two topmost electrically conductive layers 46 provided within a respective one of two physically disjoined layer stacks that are separated by the isolation trench 549. A dielectric fill material portion 72V is located within a respective isolation trench 549 on widthwise sidewalls of the isolation trench 549 and inner sidewalls of the two conductive rail structures 46V.

Figure 46:
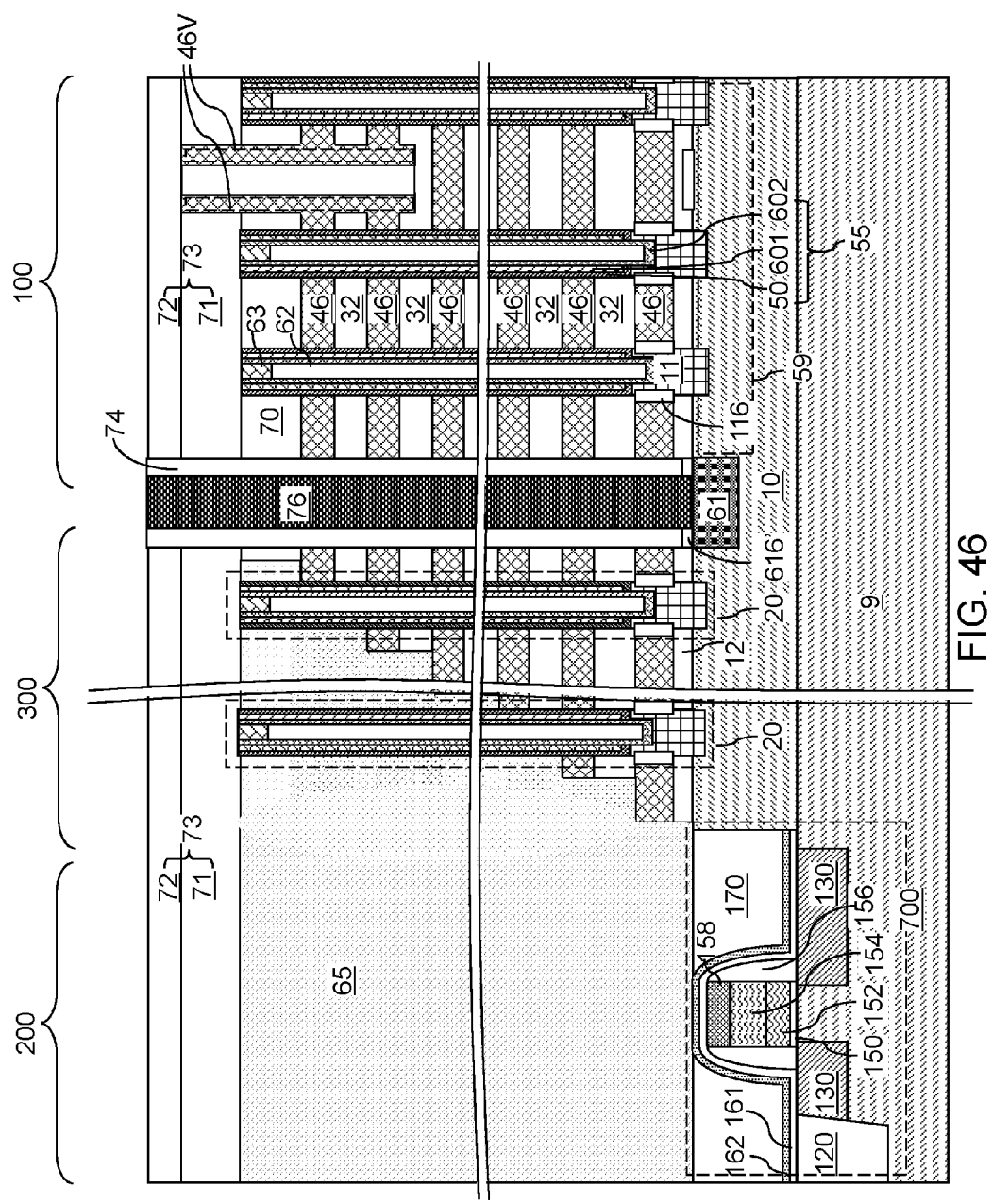
FIG. 46 is a schematic vertical cross-sectional view of the third exemplary structure after formation of source regions and backside contact via structures according to the third embodiment of the present disclosure.

Referring to FIG. 46, the deposited metallic material of the continuous electrically conductive material layer 46L is etched back from the sidewalls of each backside trench 79, for example, by an isotropic wet etch, an anisotropic dry etch, or a combination thereof. The processing steps of FIG. 32 may be employed. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

A subset of the electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. In one embodiment, a subset of the electrically conductive layers 46 that includes at least two topmost electrically conductive layers that are electrically shorted among one another through a respective conductive rail structure 46V can function as drain select gate electrodes.

An insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LP-CVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 47A:
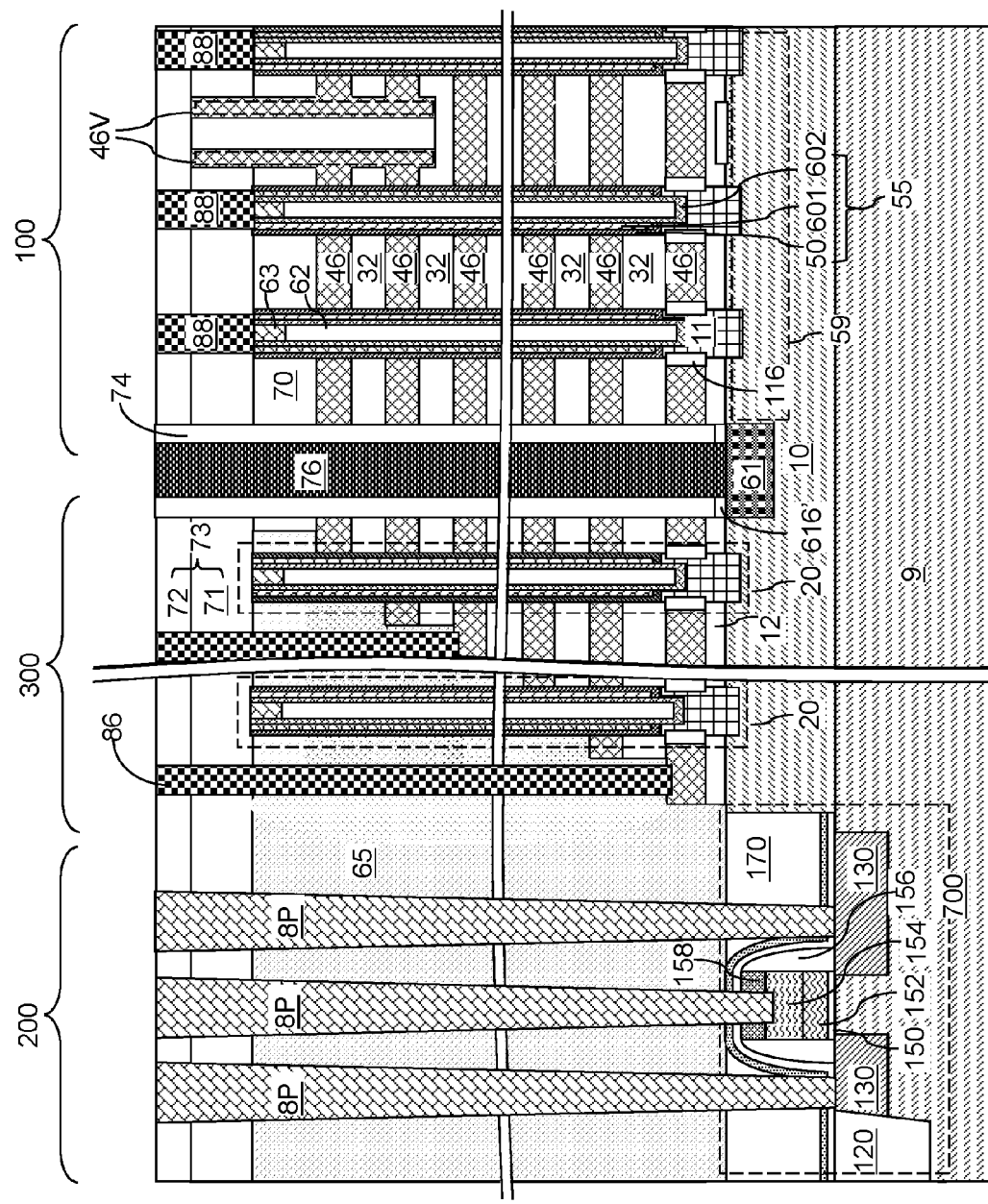
FIG. 47A is a schematic vertical cross-sectional view of the third exemplary structure after formation of additional contact via structures according to the third embodiment of the present disclosure.
Figure 47B:
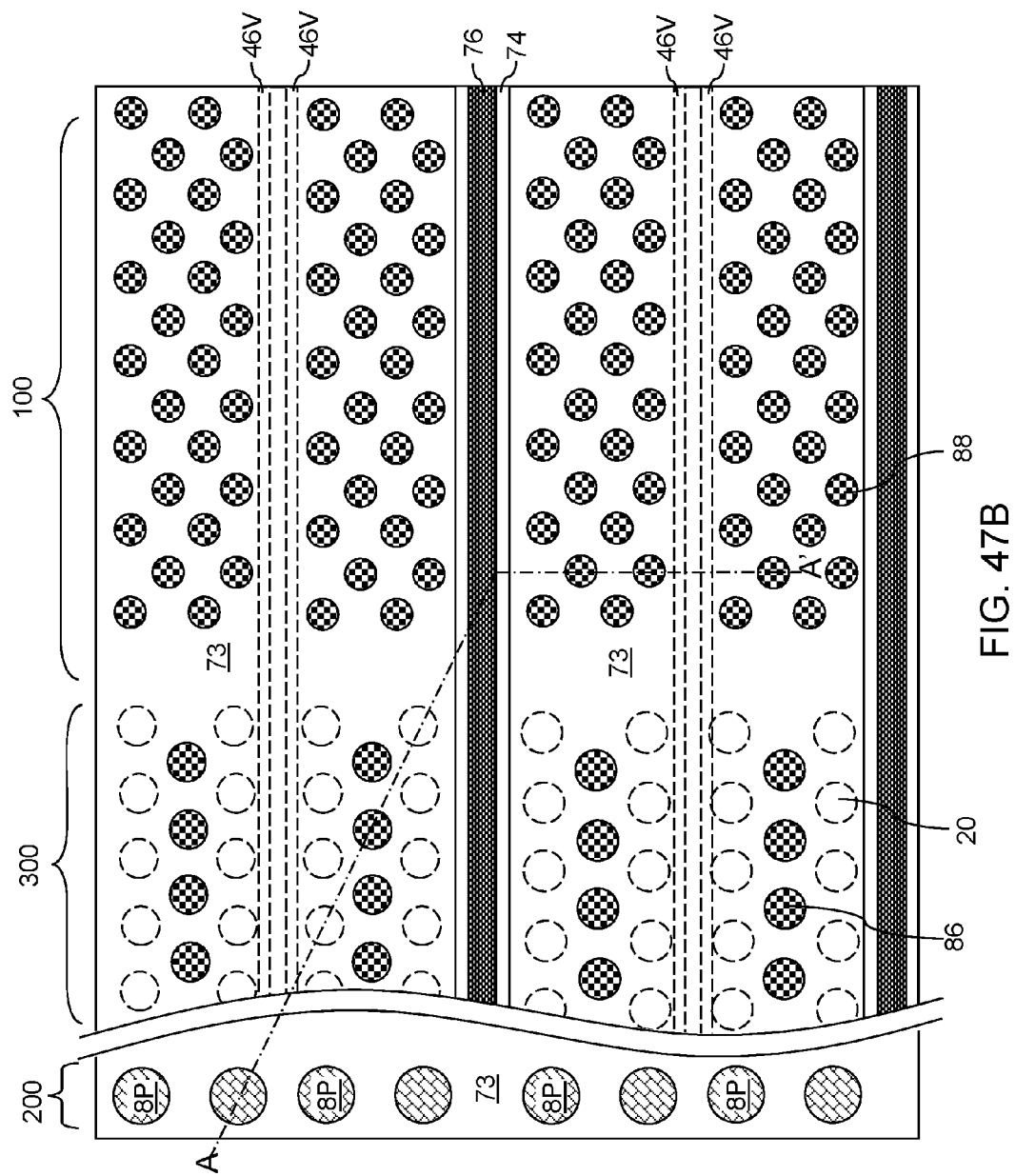
FIG. 47B is a top-down view of the third exemplary structure of FIG. 47A. The vertical plane A-A' is the plane of the schematic vertical cross-sectional view of FIG. 47A.

Referring to FIGS. 47A and 47B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63 except the dummy drain regions in the support pillar structures 20. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 48A:
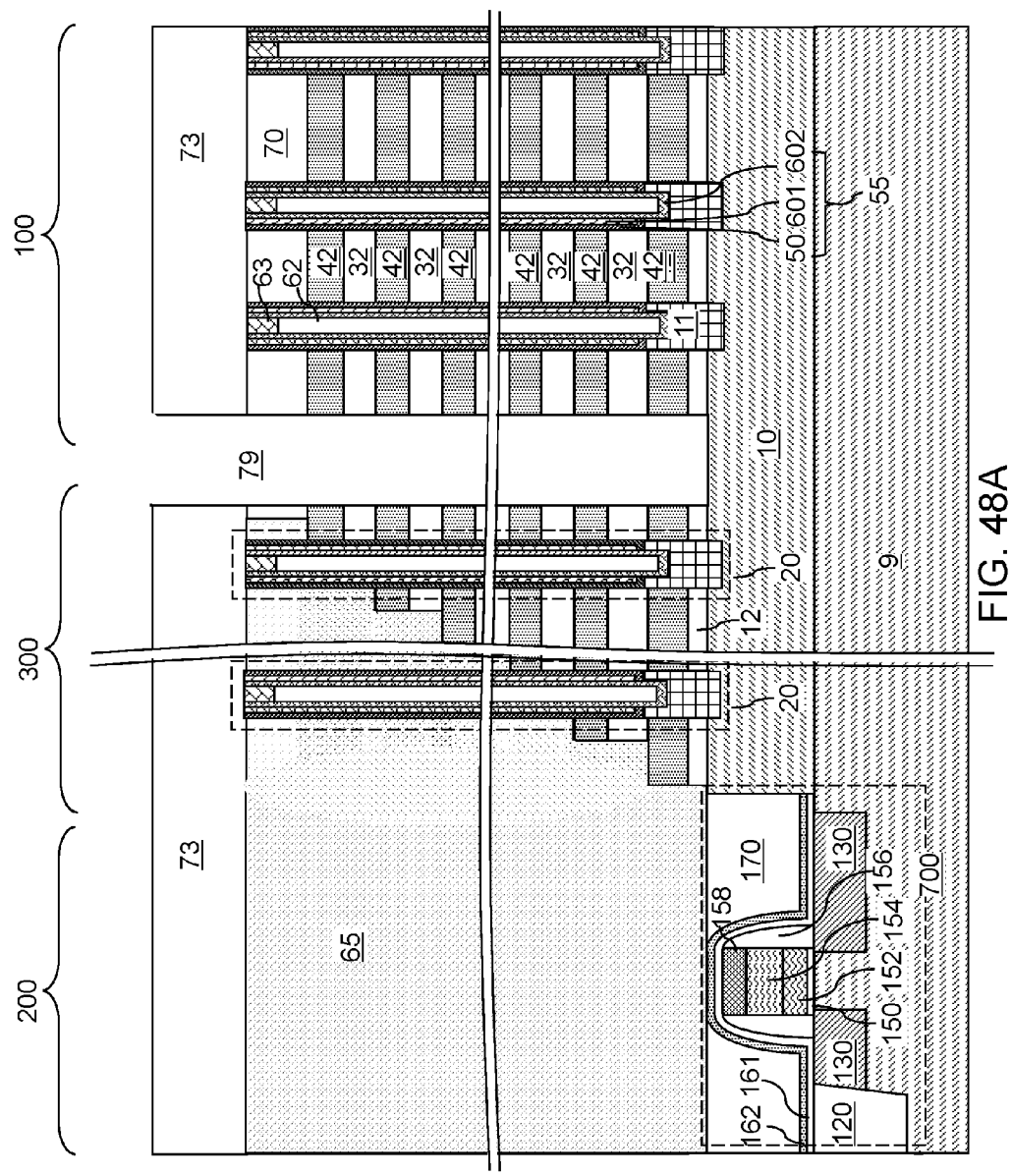
FIG. 48A is a schematic vertical cross-sectional view of a fourth exemplary structure after formation of backside contact via structures according to a fourth embodiment of the present disclosure.

In a fourth embodiment, the shallow isolation trench and the materials that fill the shallow isolation trench are formed in a later step than in the third embodiment, such as after replacing the sacrificial material layers with electrically conductive layers. Referring to FIGS. 48A and 48B, the fourth exemplary structure according to a fourth embodiment of the present disclosure can be derived from the first exemplary structure of FIG. 6 by forming a contact level dielectric layer 73 over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 49:
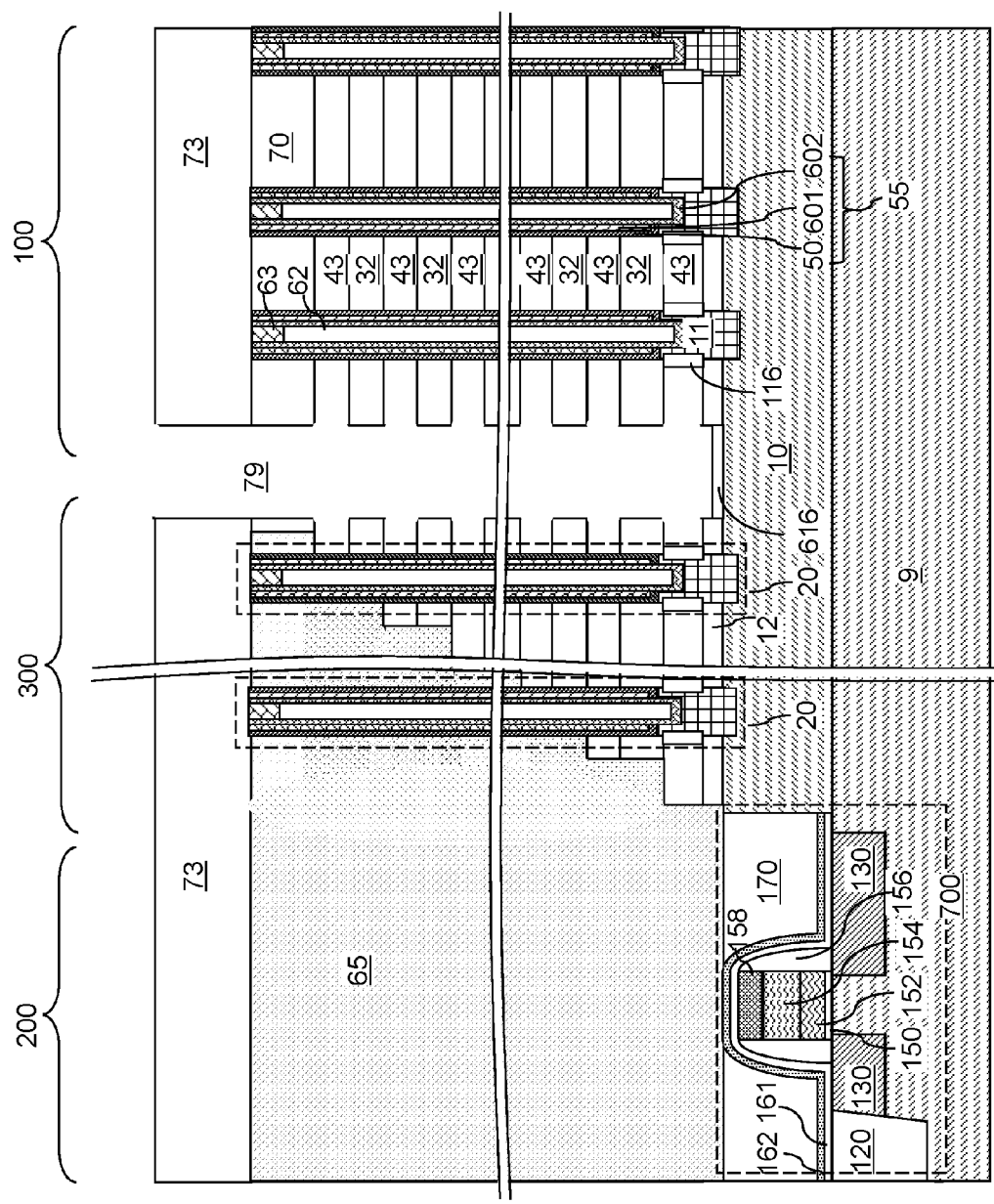
FIG. 49 is a schematic vertical cross-sectional view of the fourth exemplary structure after formation of backside recesses by removal of the sacrificial material layers according to the fourth embodiment of the present disclosure.

Referring to FIG. 49, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the support pillar structure 20, and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 50:
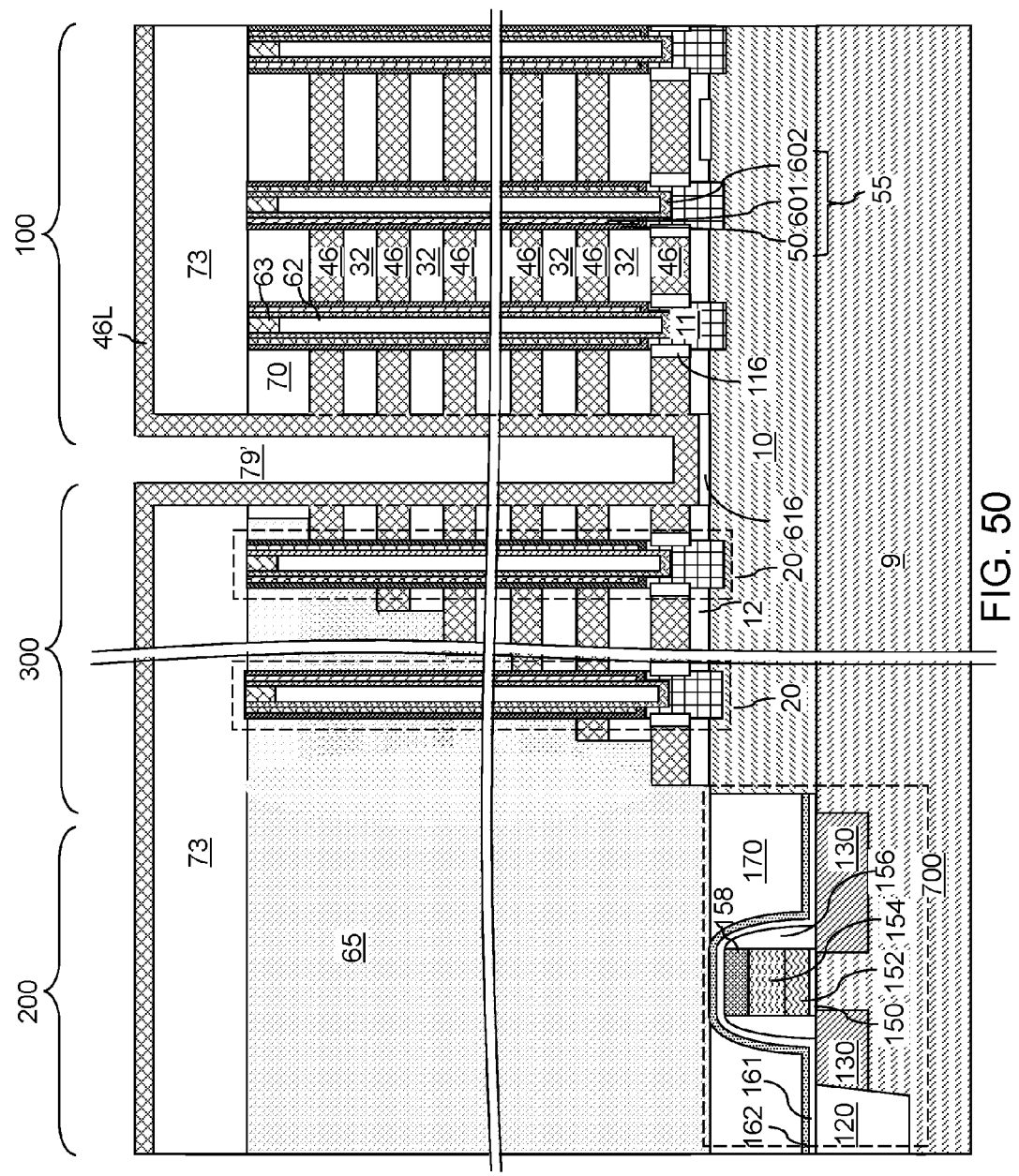
FIG. 50 is a schematic vertical cross-sectional view of the fourth exemplary structure after formation of electrically conductive layers in the backside recesses according to the fourth embodiment of the present disclosure.

Referring to FIG. 50, a backside blocking dielectric layer (not shown) can be optionally formed. The backside blocking dielectric layer, if present, comprises a dielectric material that functions as a portion of a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present. The backside blocking dielectric layer can include a dielectric metal oxide layer (such as an aluminum oxide layer), a semiconductor oxide layer (such as a silicon oxide layer), or a layer stack thereof.

At least one conductive material can be deposited in the backside recesses 43, peripheral portions of the backside trenches 79 and over the contact level dielectric layer 73 by conformal deposition. Each continuous portion of the at least one conductive material deposited in a backside recess 43 constitutes an electrically conductive layer 46. The conductive material deposited outside of the backside recesses 43 collectively constitute a continuous metallic material layer 46L, which is a continuous layer of the conductive material that is deposited over the contact level dielectric layer 73 and at peripheral portions of the backside trenches 79.

In an illustrative example, a metallic barrier layer (not explicitly shown) can be deposited in the backside recesses. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the backside trenches 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43. The continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer and a continuous portion of the metallic fill material layer that are located in the backside trenches 79 or above the contact level dielectric layer 73. A backside cavity 79' is present in each unfilled volume of a backside trench 79.

Each sacrificial material layer 42 can be replaced with an electrically conductive layer 46. A tubular dielectric spacer 116 laterally surrounds an epitaxial channel portion 11. A bottommost electrically conductive layer 46 laterally surrounds each tubular dielectric spacer 116 upon formation of the electrically conductive layers 46. In embodiments in which the epitaxial channel portions 11 are employed, the epitaxial channel portions 11 are formed at the bottom of each of the memory openings 49 as semiconductor material portions, and can have a doping of the first conductivity type. Each vertical semiconductor channel 60 can be formed on a respective epitaxial channel portion 60.

Figure 51:
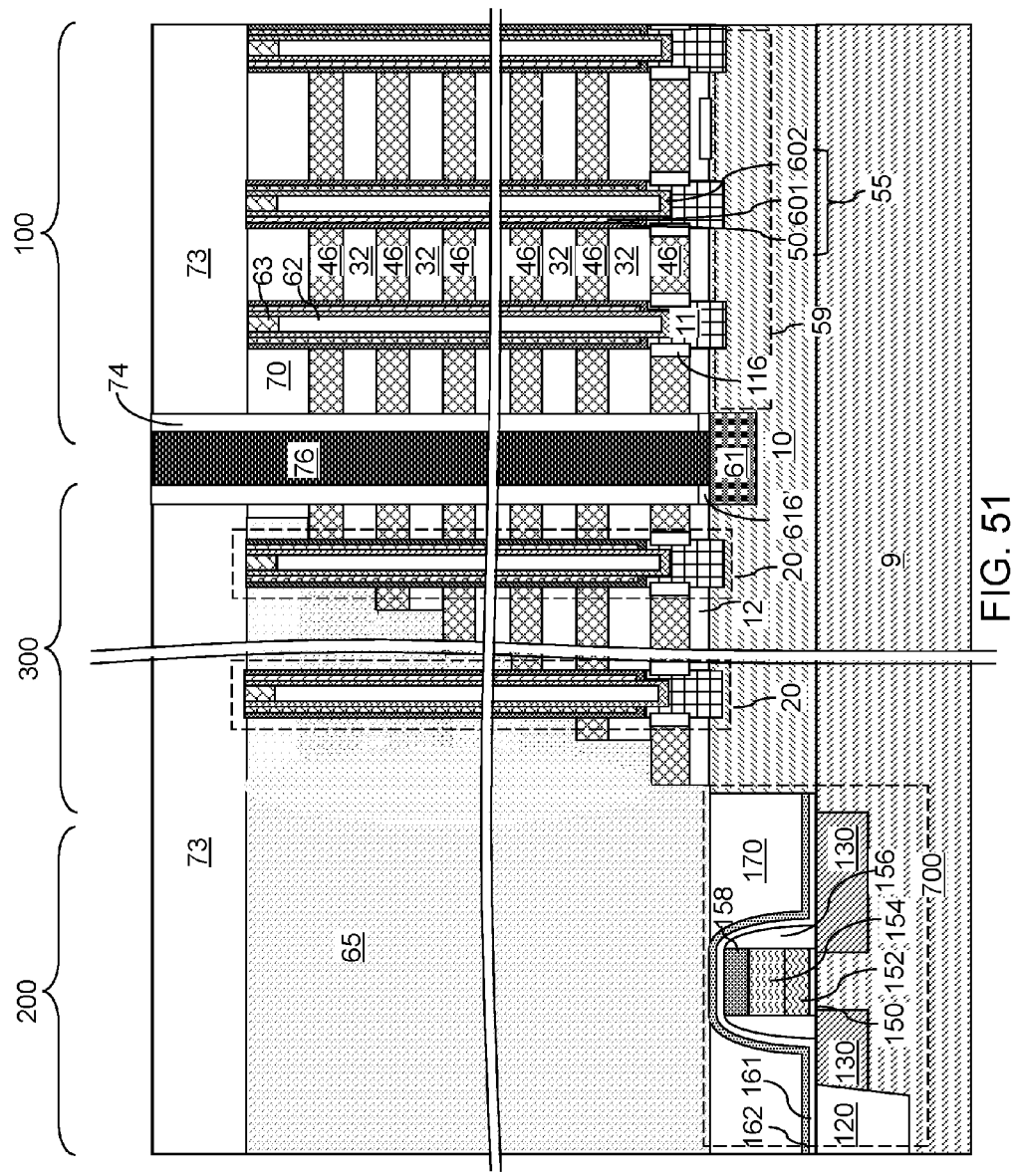
FIG. 51 is a schematic vertical cross-sectional view of the fourth exemplary structure after formation of source regions and backside contact via structures according to the fourth embodiment of the present disclosure.

Referring to FIG. 51, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

A subset of the electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. In one embodiment, a subset of the electrically conductive layers 46 that includes at least two topmost electrically conductive layers can function as drain select gate electrodes.

A dielectric material layer can be deposited at peripheral portions of the backside trenches 79 and over the contact level dielectric layer 73, and can be anisotropically etched to form an insulating spacer 74 within each backside trench 79. A backside cavity 79' is present within a volume surrounded by each insulating spacer 74. The anisotropic etch can be extended to physically expose a top surface of the substrate (9, 10) underneath each backside trench 79. An opening is formed though the planar dielectric portion 616 underneath each backside cavity (i.e., each unfilled volume of the backside trenches 79), thereby vertically extending the backside cavity. A top surface of the semiconductor material layer 10 can be physically exposed at the bottom of each backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each backside cavity. Each contact via structure 76 can fill a respective backside cavity. The contact via structures 76 can be formed by depositing at least one conductive material in the remaining unfilled volumes (i.e., the backside cavities) of the backside trenches 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. Each backside contact via structure 76 extends through the alternating stack (32, 46), and contacts a top surface of a respective source region 61.

Figure 52A:
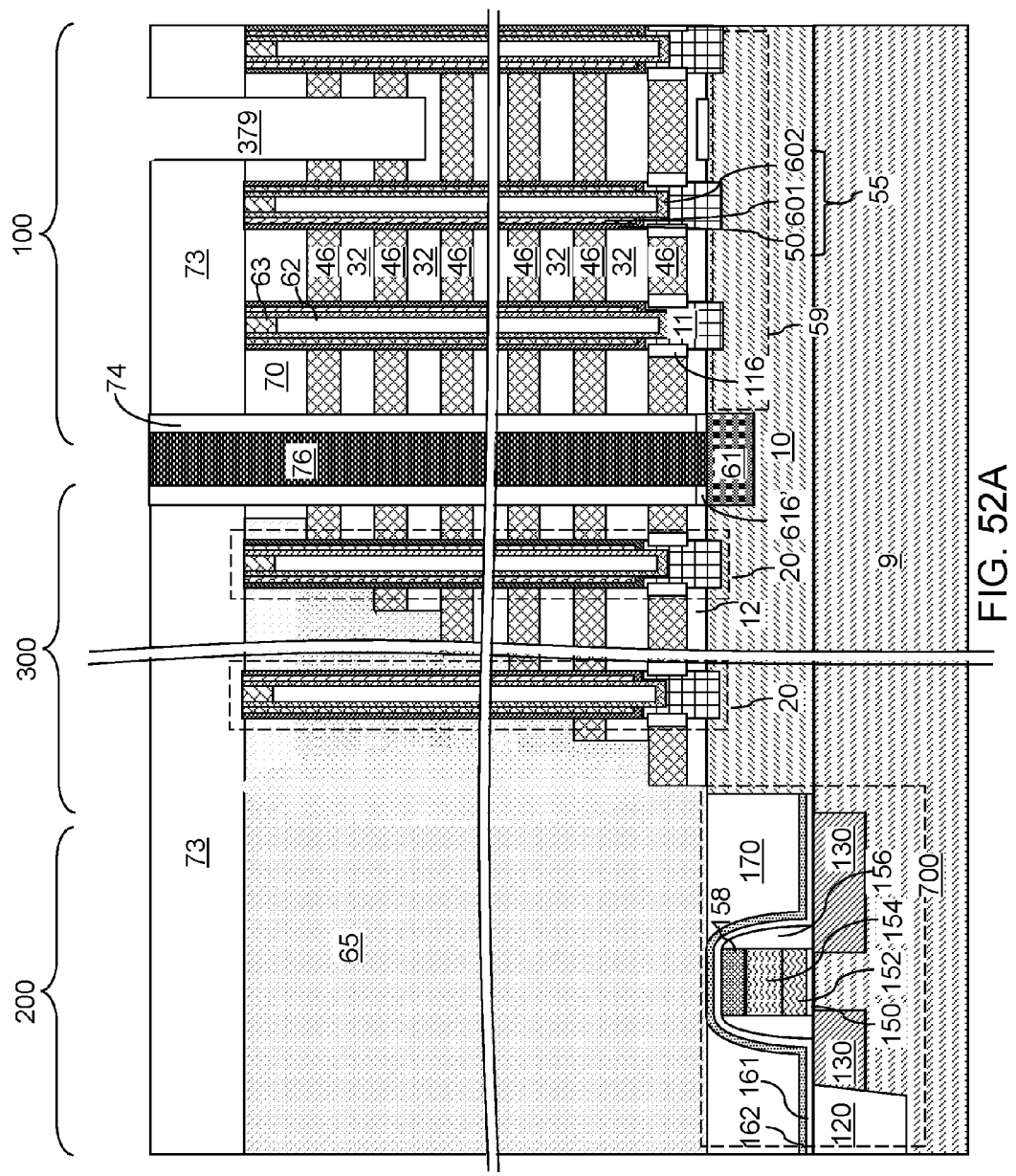
FIG. 52A is a schematic vertical cross-sectional view of the fourth exemplary structure after formation of isolation trenches according to the fourth embodiment of the present disclosure.
Figure 52B:
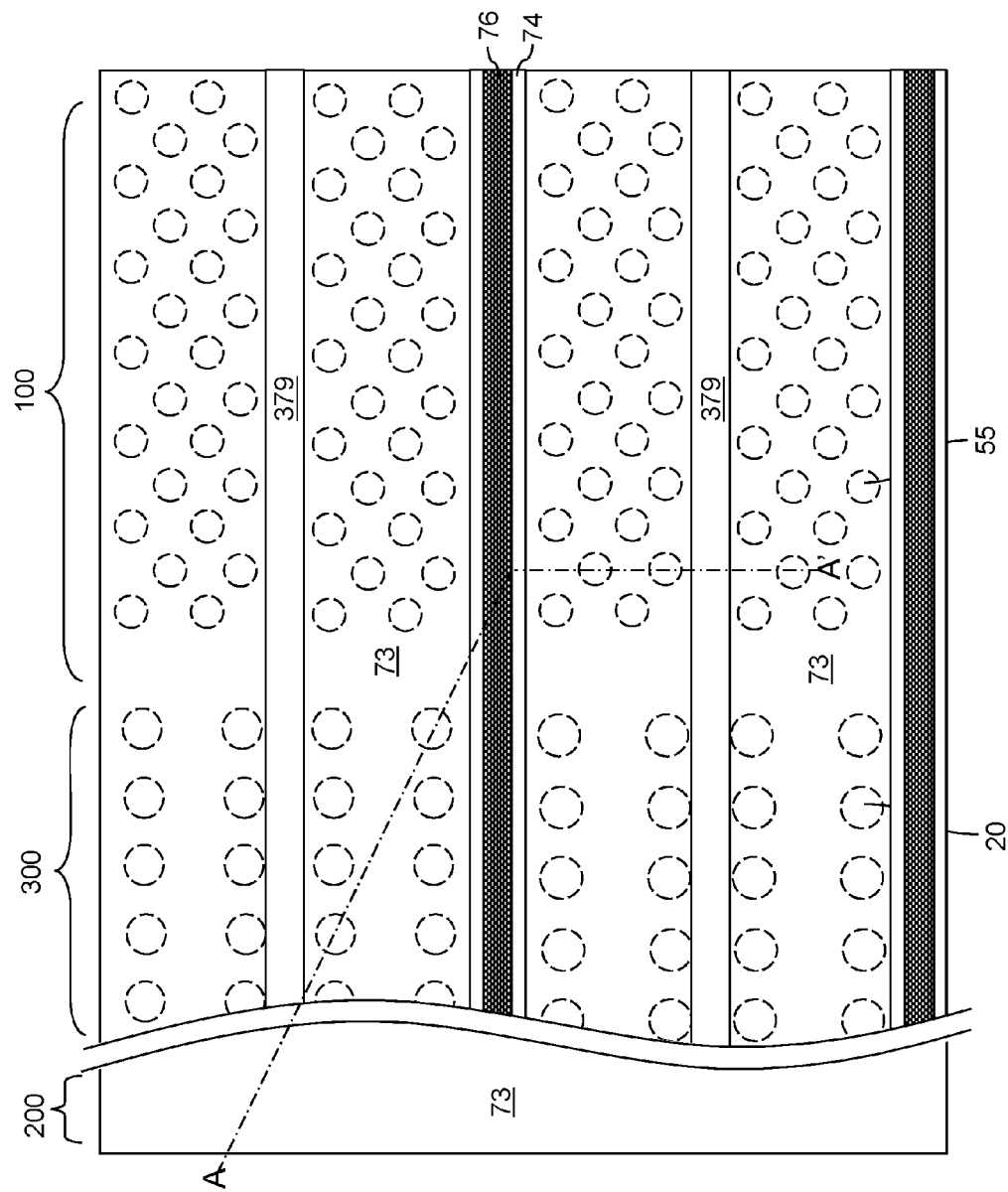
FIG. 52B is a top-down view of the fourth exemplary structure of FIG. 52A. The vertical plane A-A' is the plane of the schematic vertical cross-sectional view of FIG. 52A.

Referring to FIGS. 52A and 52B, shallow isolation trenches 379 are then formed after forming the electrically conductive layers 46 (e.g., the select gate electrodes and word lines) and after forming the contact via structure 76 (e.g., the source electrode or local interconnect). The isolation trenches 379 can be formed through the contact level dielectric layer 73, the insulating cap layer 70, and a subset of layers of the alternating stack (32, 46) that are located at levels of drain select electrodes and each level of the insulating layers 32 located above the level of the bottommost drain select electrode. The isolation trenches 379 can be formed, for example, by applying and patterning a photoresist layer (not shown) over the contact level dielectric layer 73 to form elongated openings having a uniform width throughout, and by transferring the pattern of the openings in the photoresist layer through the contact level dielectric layer 73, the insulating cap layer 70, and the subset of layers within the alternating stack (32, 46) located above, or at, the level of the bottommost drain select electrode. Thus, the depth of the isolation trenches 379 is selected such that the bottom surface of each isolation trench 379 is located at the level of an insulating layer 32 that is between the topmost control gate electrode level and the bottommost drain select gate level. The isolation trenches 379 can be parallel among one another.

While the present disclosure is described employing an embodiment in which two topmost electrically conductive layers 46 are located at the levels of drain select gate electrodes that can be employed to select or deselect a vertical semiconductor channel from the drain side, embodiments are expressly employed herein in which three or more topmost electrically conductive layers 46 are employed at drain select gate levels.

Each isolation trench 379 laterally extending along a horizontal direction at least through a set of layers including at least two topmost spacer material layers, which are at least two topmost electrically conductive layers 46, within the alternating stack (32, 46). The isolation trenches 379 collectively divide each layer within the set of layers into multiple segments. In one embodiment, the bottommost surface of each isolation trench 379 can be formed within one of the insulating layers 32 within the alternating stack (32, 42).

Figure 53:
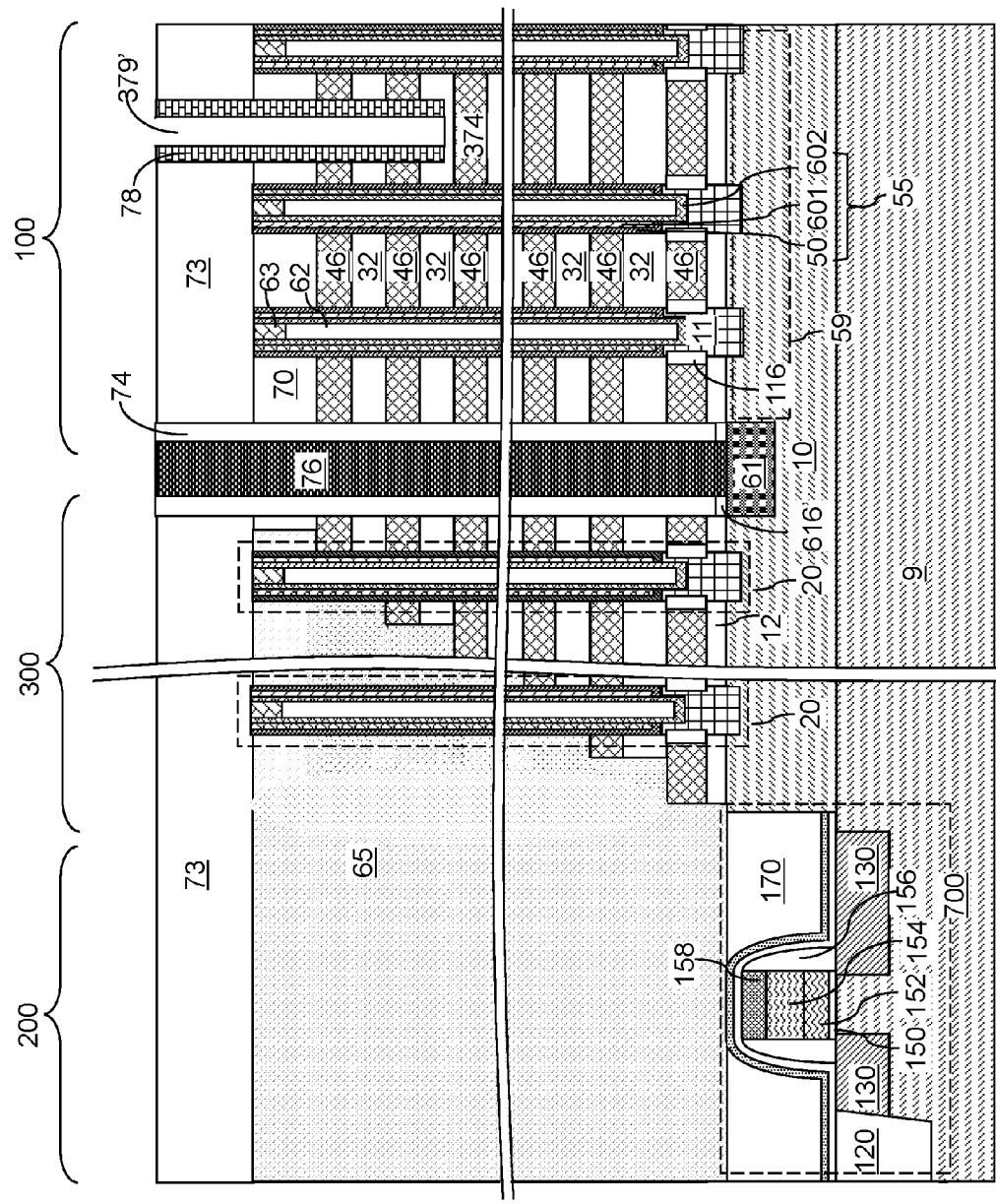
FIG. 53 is a vertical cross-sectional view of the fourth exemplary structure after formation of conductive rail structures in the isolation trenches according to the fourth embodiment of the present disclosure.

Referring to FIG. 53, a conductive material layer can be deposited at the periphery of each isolation trench 379 and over the top surface of the contact level dielectric layer 73. In one embodiment, the processing steps of FIG. 13 can be employed to form the conductive material layer. The isolation trenches 379 laterally divide the alternating stack (32, 46) of the insulating layers 32 and the electrically conductive layers 46 into multiple physically disjoined layer stacks. Specifically, each isolation trench 379 laterally divides the alternating stack (32, 46) into two physically disjoined layer stacks. Sidewalls of segments of at least two topmost electrically conductive layers 46 are physically exposed within each of the isolation trenches 379. The conductive material layer can be formed directly on the sidewalls of the segments of the at least two topmost electrically conductive layers 46 of the two physically disjoined layer stacks within each isolation trench 379.

Subsequently, the processing steps of FIGS. 14A and 14B can be performed. An anisotropic etch is performed to remove horizontal portions of the conductive material layer. Each remaining portion of the conductive material layer in an isolation trench 379 constitutes a generally ring-shaped conductive structure with a contiguous set of outer sidewalls that contact lengthwise sidewalls and widthwise sidewalls of the respective isolation trench 379. Each remaining horizontal portions of the conductive material layer after the anisotropic etch includes two conductive rail structures that extend along the lengthwise direction of the respective isolation trench 379 and two widthwise portions that are located on the widthwise sidewalls of the isolation trench 379.

A photoresist layer (not shown) can be applied over the remaining portions of the conductive material layer and over the contact level dielectric layer 73, and can be lithographically patterned to form openings overlying end portions of each generally ring-shaped conductive structure. Each section of the generally ring-shaped conductive structure within the area of the openings in the photoresist layer can be removed, for example, by an isotropic etch. Two widthwise portions of each generally ring-shaped conductive structure (which are located within the two end portions of a respective isolation trench 379), are removed by the isotropic etch. Each generally ring-shaped conductive structure is divided into two conductive rail structures 78 that are physically disjoined from each other. Two conductive rail structures 78 are formed within each isolation trench 379. In one embodiment, the two conductive rail structures 78 can be formed directly on sidewalls of the at least two topmost electrically conductive layers 46 that are vertically coincident with a sidewall of each intervening insulating layer 32.

Two conductive rail structures 78 are formed on lengthwise sidewalls of each isolation trench 379. Each of the two conductive rail structures 78 is electrically shorted to segments of at least two topmost electrically conductive layers 46 provided within a respective one of two physically disjoined layer stacks that are separated by the isolation trench 379. In one embodiment, the two conductive rail structures 78 can be formed directly on sidewalls of the at least two topmost electrically conductive layers 46 that are vertically coincident with a sidewall of one of the insulating layers 32 (i.e., an intervening insulating layer 32) that is physically exposed to the isolation trench 379. The photoresist layer can be subsequently removed, for example, by ashing. In one embodiment, each conductive rail structure 78 can have a uniform thickness throughout, which can be the thickness of the conductive material layer 78L as deposited. An isolation cavity 379' is present within each isolation trench 379.

Figure 54A:
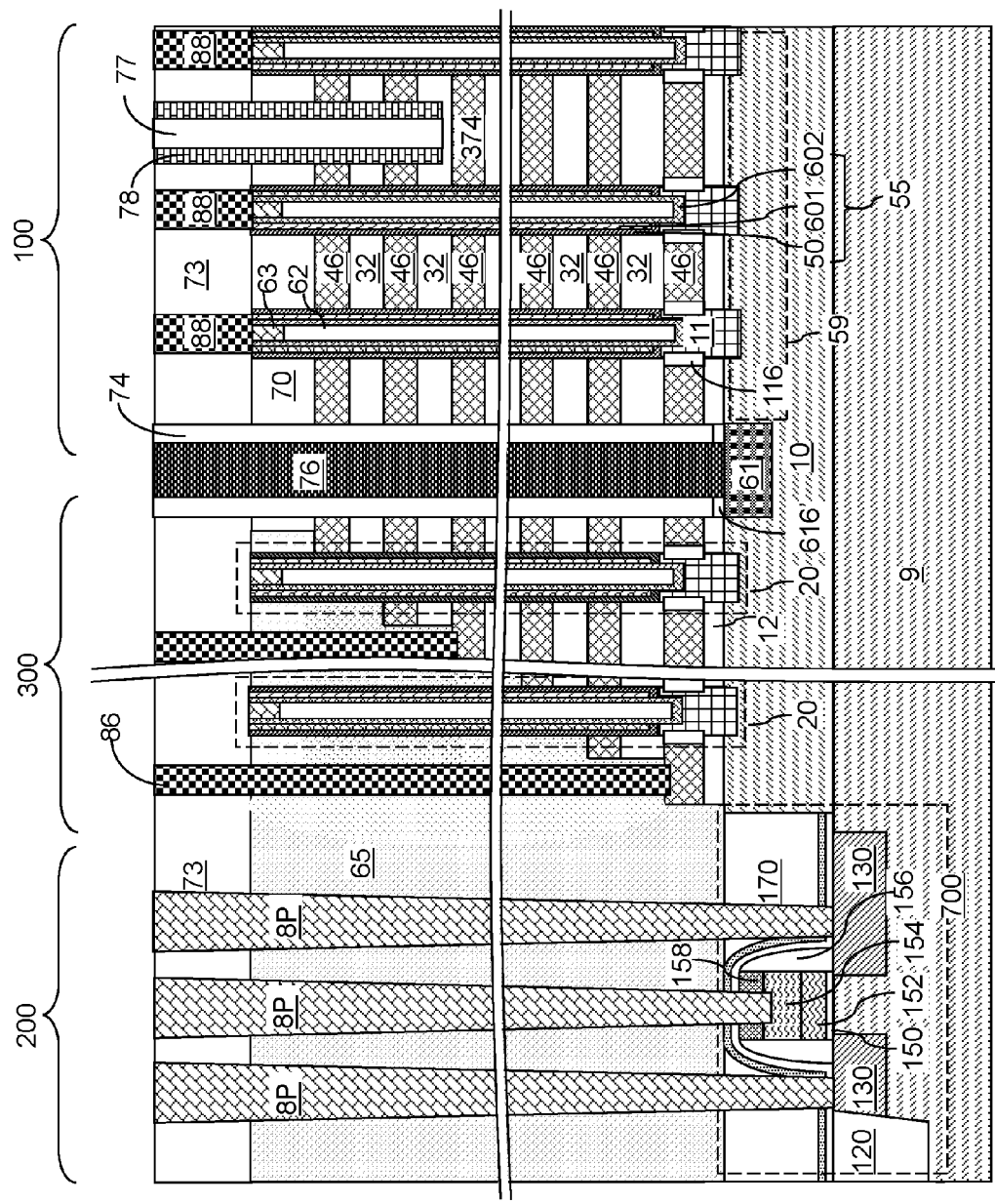
FIG. 54A is a vertical cross-sectional view of the fourth exemplary structure after formation of additional contact via structures according to the fourth embodiment of the present disclosure.
Figure 54B:
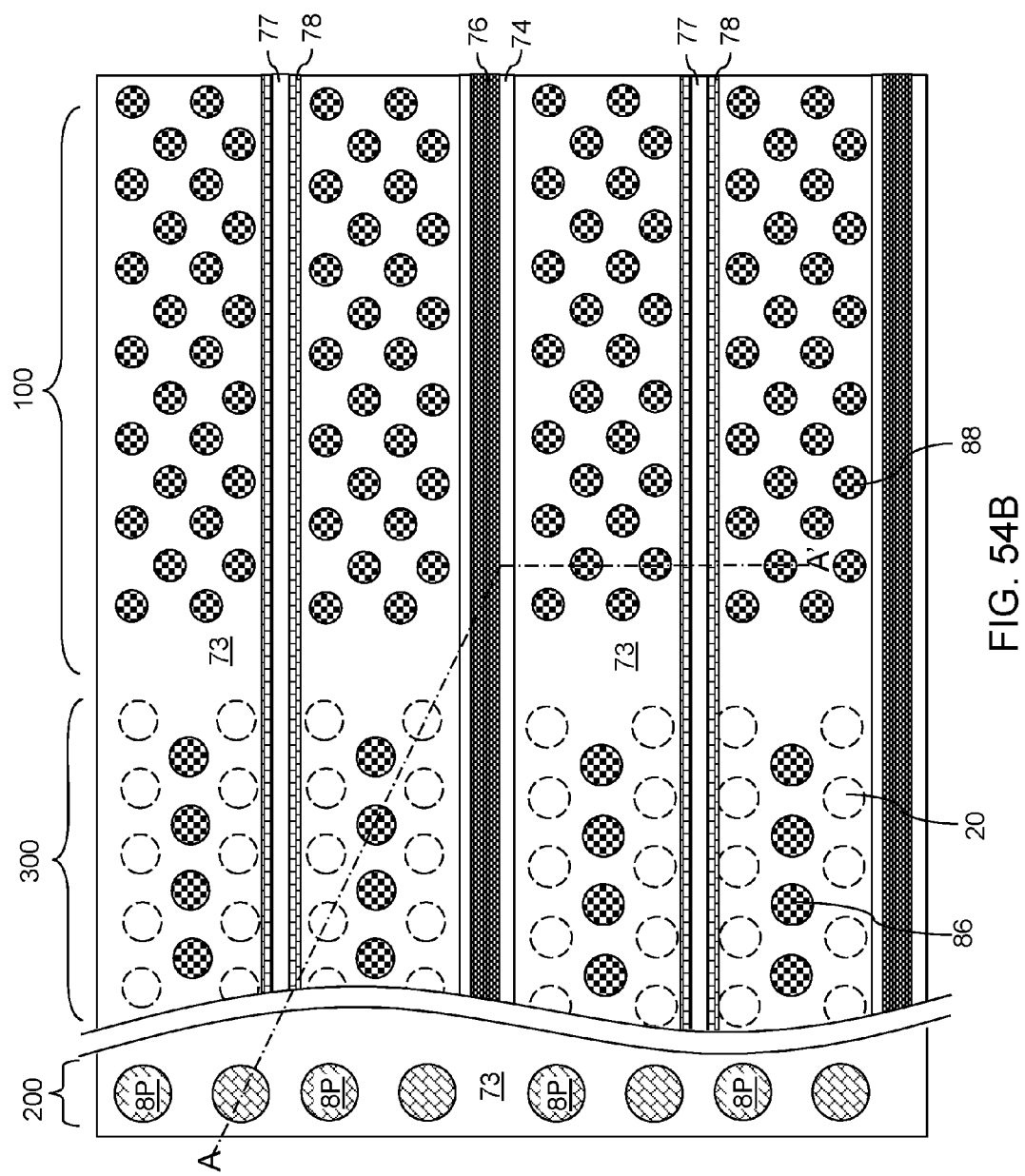
FIG. 54B is a top-down view of the fourth exemplary structure of FIG. 54A. The vertical plane A-A' is the plane of the schematic vertical cross-sectional view of FIG. 54A.

Referring to FIGS. 54A and 54B, a dielectric material can be deposited within remaining unfilled volumes (i.e., in the isolation cavities 379') of the isolation trenches 379. Excess portions of the dielectric material may be removed from above the top surface of the contact level dielectric layer 73. A dielectric fill material portion 77 can be formed within each recess region between a pair of conductive rail structures 78. The dielectric fill material portion 77 can be formed on widthwise sidewalls of the isolation trench 379 and inner sidewalls of the two conductive rail structures 78.

Additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63 except the dummy drain regions in the support pillar structures 20. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 55:
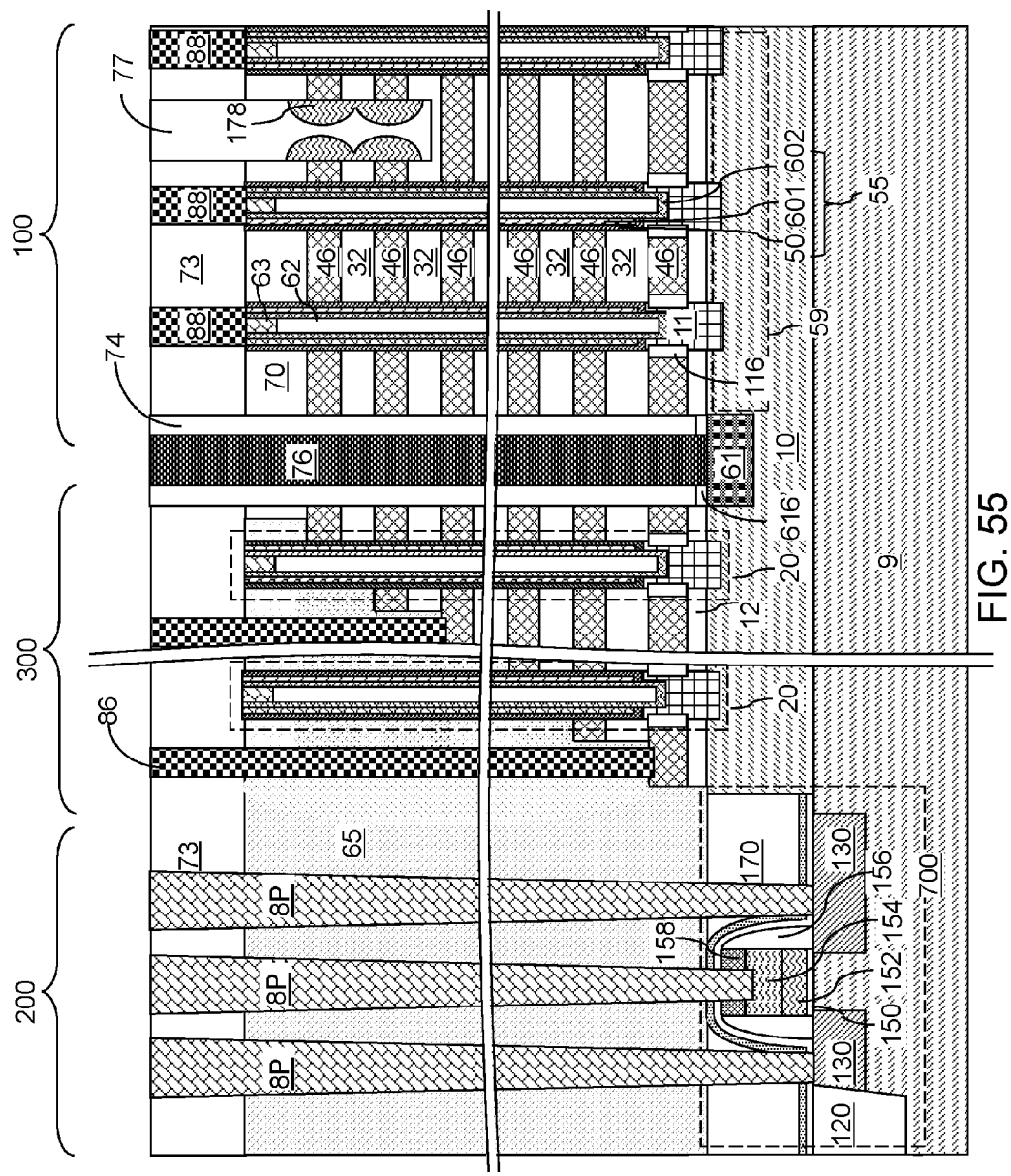
FIG. 55 is a vertical cross-sectional view of an alternative embodiment of the fourth exemplary structure after formation of contact via structures according to the fourth embodiment of the present disclosure.

Referring to FIG. 55, an alternative embodiment of the fourth exemplary structure can be derived from the fourth exemplary structure of FIGS. 52A and 52B by performing the processing steps of FIG. 17 to form conductive rail structures 178 instead of performing the processing steps of FIG. 53 (which can be the same as the processing steps of FIGS. 13 and 14A-14B). In other words, the conductive rail structures 178 can be formed by selectively depositing a conductive material on physically exposed sidewalls of the segments of the at least two topmost electrically conductive layers 46 of the physically disjoined layer stacks around each isolation trench 379, while preventing growth of the conductive material from physically exposed surfaces of the insulating layers 32.

Subsequently, the processing steps of FIGS. 54A and 54B can be performed.

The various exemplary structures and alternative embodiments of the present disclosure can include a three-dimensional memory device. The three-dimensional memory device includes an alternating stack of insulating layers 32 and electrically conductive layers 46 located over a substrate (9, 10), memory stack structures 55 extending through the alternating stack (32, 46), wherein each of the memory stack structures 55 comprises a memory film 50 and a vertical semiconductor channel 60 contacting an inner sidewall of the memory film 50; an isolation trench (179, 579, 379) laterally extending along a horizontal direction and dividing a set of layers including at least two topmost electrically conductive layers 46 within the alternating stack (32, 46) into two physically disjoined layer stacks including respective segments of the at least two topmost electrically conductive layers 46; and two conductive rail structures (78, 178, 46V) located on lengthwise sidewalls of the isolation trench (179, 579, 379) and laterally extending along the horizontal direction, wherein each of the two conductive rail structures (78, 178, 46V) is electrically shorted to segments of the at least two topmost electrically conductive layers 46 located within a respective physically disjoined layer stack.

In one embodiment, a dielectric fill material portion (77, 72V) can be located within the isolation trench (179, 579, 379). The dielectric fill material portion (77, 72V) can contact widthwise sidewalls of the isolation trench (179, 579, 379) and inner sidewalls of the two conductive rail structures (78, 178, 46V). In one embodiment, each of the two conductive rail structures (78, 178, 46V) has a substantially uniform vertical cross-sectional shape that is invariant with lateral translation along the horizontal direction perpendicular to the trench sidewall lengthwise (i.e., elongation) direction. The vertical planes of the vertical cross-sectional shapes can be perpendicular to the lengthwise direction of the isolation trench (179, 579, 379).

In one embodiment, physical interfaces between the two conductive rail structures (78, 178) and the at least two topmost electrically conductive layers 46 coincide with the lengthwise sidewalls of the isolation trench (179, 379). In some embodiment, physical interfaces between the two conductive rail structures (78, 178) and the at least two topmost electrically conductive layers 46 are laterally offset from the lengthwise sidewalls of the isolation trench (179, 379) along a direction perpendicular to the lengthwise direction due to lateral recessing of the topmost electrically conductive layers 46. In some embodiments, a continuously extending conductive material layer (which can be a metallic barrier layer 46A or a metallic fill material layer 46B) without any interface therein constitutes a portion of one of the two conductive rail structures 46V and portions of segments of the at least two topmost electrically conductive layers 46 located within one of the two physically disjoined layer stacks.

In some embodiments, each of the two conductive rail structures 178 has a variable thickness that has local maxima at levels of the at least two topmost electrically conductive layers 46 and has at least one local minimum at each level of an insulating layer 32 within the set of layers including the at least two topmost electrically conductive layers 46. In some embodiment, the two conductive rail structures 178 comprise a different conductive material than the electrically conductive layers 46.

In some embodiments, a bottommost surface of the isolation trench (579, 379) is located within one of the insulating layers 32 within the alternating stack (32, 46).

In some embodiments, a bottommost surface of the isolation trench 179 is located within the substrate (9, 10). A dielectric rail structure 75 is located at a lower portion of the isolation trench 179, and contacts the substrate (9, 10) and bottom surfaces of the two conductive rail structures (78, 178).

In some embodiments, an annular source region 111 is located at a bottom end of each vertical semiconductor channel 60. The source region 111 is electrically shorted to at least one bottommost electrically conductive layer 46 (i.e., source electrode) within the alternating stack (32, 46).

In some embodiments, the three-dimensional memory device can further include a backside contact via structure 76 vertically extending through the alternating stack (32, 46); an insulating spacer 74 laterally surrounding the backside contact via structure 76 and extending through the alternating stack (32, 46); and a source region 61 located in the substrate (9, 10) and contacting a bottom surface of the backside contact via structure 76.

In one embodiment, the alternating stack (32, 46) comprises a terrace region in which each electrically conductive layer 46 other than a topmost electrically conductive layer 46 within the alternating stack laterally extends farther than any overlying electrically conductive layer 46 within the alternating stack (32, 46). The terrace region can include stepped surfaces of the alternating stack (32, 46) that continuously extend from a bottommost layer within the alternating stack (32, 46) to a topmost layer within the alternating stack (32, 46). Support pillar structures 20 extend through the stepped surfaces and through a retro-stepped dielectric material portion 65 that overlies the stepped surfaces.

Each of the exemplary structures and alternative embodiments can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Each segments of electrically conductive layers 46 that are electrically shorted to one another through a respective conductive rail structure (78, 178, 46V) can be employed as a single drain select gate electrode that has portions located at multiple levels. The resistance of this multilayer drain select gate electrode is lower than the resistance of a single electrically conductive layer segment within the drain select gate electrode approximately by a factor of 1/N, in which N is the total number of levels of the segments of the electrically conductive layers 46 within the drain select gate electrode shorted by the conductive rail structure. Device performance degradation due to high resistance of drain select gate electrodes can be reduced by providing a low resistance drain select gate electrode that includes conductive rail structures (78, 178, 46V) of the present disclosure. Thus, the conductive rail structures (78, 178, 46V) of the present disclosure can be advantageously employed to enhance the functionality, increase the yield, and improve the reliability, of three-dimensional memory devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device comprising:
an alternating stack of insulating layers and electrically conductive layers located over a substrate;
memory stack structures extending through the alternating stack, wherein each of the memory stack structures comprises a memory film and a vertical semiconductor channel contacting an inner sidewall of the memory film;
an isolation trench laterally extending along a horizontal direction and dividing a set of layers including at least two topmost electrically conductive layers within the alternating stack into two physically disjoined layer stacks including respective segments of the at least two topmost electrically conductive layers; and two conductive rail structures located on lengthwise sidewalls of the isolation trench and laterally extending along the horizontal direction, wherein each of the two conductive rail structures is electrically shorted to segments of the at least two topmost electrically conductive layers located within a respective physically disjoined layer stack.

2. The three-dimensional memory device of claim 1, further comprising a dielectric fill material portion located within the isolation trench and contacting widthwise sidewalls of the isolation trench and inner sidewalls of the two conductive rail structures.

3. The three-dimensional memory device of claim 1, wherein each of the two conductive rail structures has a substantially uniform vertical cross-sectional shape that is invariant with lateral translation along the horizontal direction which is perpendicular to the lengthwise sidewalls of the isolation trench.

4. The three-dimensional memory device of claim 3, wherein physical interfaces between the two conductive rail structures and the at least two topmost electrically conductive layers coincide with the lengthwise sidewalls of the isolation trench.

5. The three-dimensional memory device of claim 1, wherein physical interfaces between the two conductive rail structures and the at least two topmost electrically conductive layers are laterally offset from the lengthwise sidewalls of the isolation trench along a direction perpendicular to the lengthwise direction.

6. The three-dimensional memory device of claim 1, wherein each of the two conductive rail structures has a variable thickness that has local maxima at levels of the at least two topmost electrically conductive layers and has at least one local minimum at each level of an insulating layer within the set of layers including the at least two topmost electrically conductive layers.

7. The three-dimensional memory device of claim 6, wherein the two conductive rail structures comprise a different conductive material than the electrically conductive layers.

8. The three-dimensional memory device of claim 1, wherein a bottommost surface of the isolation trench is located within one of the insulating layers within the alternating stack.

9. The three-dimensional memory device of claim 1, wherein:
a bottommost surface of the isolation trench is located within the substrate; and
a dielectric rail structure is located at a lower portion of the isolation trench, and contacts the substrate and bottom surfaces of the two conductive rail structures.

10. The three-dimensional memory device of claim 9, wherein the dielectric rail structure comprises at least two different dielectric materials.

11. The three-dimensional memory device of claim 1, wherein a semiconductor source region located at a bottom end of each vertical semiconductor channel is electrically shorted to a source electrode which comprises at least one bottommost electrically conductive layer within the alternating stack.

12. The three-dimensional memory device of claim 1, further comprising:
a backside contact via structure vertically extending through the alternating stack;
an insulating spacer laterally surrounding the backside contact via structure and extending through the alternating stack; and
a source region located in the substrate and contacting a bottom surface of the backside contact via structure.

13. The three-dimensional memory device of claim 1, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack; and
support pillar structures extend through the stepped surfaces and through a retro-stepped dielectric material portion that overlies the stepped surfaces.

14. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

15. A method of forming a three-dimensional memory device, comprising:
forming an alternating stack of insulating layers and spacer material layers over a substrate, wherein the spacer material layers are formed as, or are replaced with, electrically conductive layers;
forming memory stack structures through the alternating stack, wherein each of the memory stack structures comprises a memory film and a vertical semiconductor channel contacting an inner sidewall of the memory film;
forming an isolation trench laterally extending along a horizontal direction at least through a set of layers including at least two topmost spacer material layers within the alternating stack, wherein the isolation trench divides each layer within the set of layers into multiple segments; and forming two conductive rail structures on lengthwise sidewalls of the isolation trench, wherein each of the two conductive rail structures is electrically shorted to segments of at least two topmost electrically conductive layers provided within a respective one of two physically disjoined layer stacks that are separated by the isolation trench.

16. The method of claim 15, further comprising forming a dielectric fill material portion within the isolation trench and on widthwise sidewalls of the isolation trench and inner sidewalls of the two conductive rail structures.

17. The method of claim 15, wherein the two conductive rail structures are formed by:
depositing a conductive material layer in the isolation trench and directly on sidewalls of the segments of the at least two topmost electrically conductive layers of the two physically disjoined layer stacks; and
removing horizontal portions of the conductive material layer by an anisotropic etch, wherein remaining vertical portions of the conductive material layer comprise the two conductive rail structures.

18. The method of claim 15, wherein the two conductive rail structures are formed by selectively depositing a conductive material on physically exposed sidewalls of the segments of the at least two topmost electrically conductive layers of the two physically disjoined layer stacks while preventing growth of the conductive material from physically exposed surfaces of the insulating layers.

19. The method of claim 15, wherein the spacer material layers are formed as sacrificial material layers within the alternating stack, and the method further comprises:
forming two sacrificial spacer structures on the lengthwise sidewalls of the isolation trench;
removing the two sacrificial spacer structures and the sacrificial material layers selective to the insulating layers; and
depositing at least one conductive material in volumes from which the two sacrificial spacer structures and the sacrificial material layers are removed to form a pair of continuous conductive structures, wherein each of the pair of continuous conductive structures includes respective segments of the at least two topmost electrically conductive layers and a respective one of the two conductive rail structures.

20. The method of claim 15, wherein the two conductive rail structures are formed directly on sidewalls of the at least two topmost electrically conductive layers that are vertically coincident with a sidewall of one of the insulating layers that is physically exposed to the isolation trench.

21. The method of claim 15, wherein the isolation trench extends to a top surface of the substrate, and the method further comprises forming a dielectric rail structure laterally extending along the horizontal direction at a lower portion of the isolation trench directly on the substrate, wherein the two conductive rail structures contacts a top surface of the dielectric rail structure.

22. The method of claim 21, wherein:
the dielectric rail structure is formed by filling at least one dielectric material in the isolation trench up to a top periphery of the isolation trench and vertically recessing a top portion of the at least one dielectric material and laterally recessing the segments of the at least two topmost electrically conductive layers; and the two conductive rail structures are formed directly on laterally recessed sidewalls of the at least two topmost electrically conductive layers.

23. The method of claim 22, wherein the dielectric rail structure is formed by:
depositing a first dielectric material layer in the isolation trench;
depositing second dielectric material layer over the first dielectric material layer to fill the isolation trench; and
recessing the first and the second dielectric materials in the isolation trench.

24. The method of claim 15, further comprising:
forming memory openings through the alternating stack; and
forming a source region at a bottom of each of the memory openings,
wherein:
each vertical semiconductor channel is formed on a respective source region; and
at least one bottommost electrically conductive layer among the electrically conductive layer is electrically shorted to the source region.

25. The method of claim 15, wherein:
a bottommost surface of the isolation trench is formed within one of the insulating layers within the alternating stack; and
the two conductive rail structures are formed directly on a top surface of the one of the insulating layers within the alternating stack.

26. The method of claim 15, further comprising:
forming a backside trench through an entirety of the alternating stack;
removing the spacer material layers through the backside trench to form backside recesses;
forming the electrically conductive layers in the backside recesses;
forming a source region underneath the backside trench in the substrate;
forming an insulating spacer at a periphery of the backside trench; and
forming a backside contact via structure on the source region and inside the insulating spacer.

27. The method of claim 26, wherein:
the backside trench is wider than the isolation trench;
the backside trench and the isolation trench are formed in a same etching step;
the insulating spacer is formed by partially filling the backside trench and completely fills the isolation trench with a dielectric material layer and removing a horizontal portion of the dielectric material layer in the backside trench;
a dielectric rail structure is formed in the isolation trench by vertically recessing a top portion of the dielectric material layer; and
the two conductive rail structures are formed on the dielectric rail structure.

28. The method of claim 25, wherein removing the spacer material layers occurs prior to forming the isolation trench.

29. The method of claim 25, wherein removing the spacer material layers occurs after forming the isolation trench.

30. The method of claim 15, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

* * * * *